United States Patent
Fasoli et al.

(10) Patent No.: US 7,359,279 B2
(45) Date of Patent: Apr. 15, 2008

(54) INTEGRATED CIRCUIT MEMORY ARRAY CONFIGURATION INCLUDING DECODING COMPATIBILITY WITH PARTIAL IMPLEMENTATION OF MULTIPLE MEMORY LAYERS

(75) Inventors: Luca G. Fasoli, San Jose, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 11/095,415

(22) Filed: Mar. 31, 2005

(65) Prior Publication Data
US 2006/0221752 A1 Oct. 5, 2006

(51) Int. Cl.
*G11C 8/00* (2006.01)
(52) U.S. Cl. ............... 365/230.06; 365/51; 365/63; 365/230.03
(58) Field of Classification Search ........... 365/51 X, 365/63 X, 230.03 X, 230.06 O, 51, 63, 230.03, 365/230.06
See application file for complete search history.

(56) References Cited

U.S. PATENT DOCUMENTS

| | | | |
|---|---|---|---|
| 4,602,354 | A | 7/1986 | Craycraft et al. |
| 4,646,266 | A | 2/1987 | Ovshinsky et al. |
| 4,868,616 | A | 9/1989 | Johnson et al. |
| 5,301,144 | A | 4/1994 | Kohno |
| 5,429,968 | A | 7/1995 | Koyama |
| 5,568,421 | A | 10/1996 | Aritome |
| 5,621,683 | A | 4/1997 | Young |
| 5,715,189 | A | 2/1998 | Asakura |
| 5,751,012 | A | 5/1998 | Wolstenholme et al. |
| 5,835,396 | A | 11/1998 | Zhang |
| 5,926,415 | A | 7/1999 | Shin |
| 5,991,193 | A | 11/1999 | Gallagher et al. |
| 6,004,825 | A | 12/1999 | Seyyedy |

(Continued)

FOREIGN PATENT DOCUMENTS

EP     0 073 486 A2    3/1983

(Continued)

OTHER PUBLICATIONS

Compardo, Giovanni et al., "40-mm² 3-V-Only 50-MHz 64-Mb 2-b/cell CHE NOR Flash Memory," IEEE Journal of Solid-State Circuits, vol. 35, No. 11, Nov. 2000, pp. 1655-1667.

(Continued)

*Primary Examiner*—VanThu Nguyen
(74) *Attorney, Agent, or Firm*—Zagorin O'Brien Graham LLP

(57) ABSTRACT

An integrated circuit having a three-dimensional memory array provides for a given number of memory planes, but may be fabricated instead to include a lesser number of memory planes by omitting the masks and processing steps associated with the omitted memory planes, without changing any of the other fabrication masks for the other memory planes or for the remainder of the device, and without requiring routing or other configuration changes to the read or read/write path for the array. Control circuitry for selectively enabling certain layer selector circuits is configurable, and the layer selector circuits are suitably arranged, to couple a respective array line on an implemented memory layer to each respective I/O bus line irrespective of the number of implemented memory planes.

35 Claims, 35 Drawing Sheets

U.S. PATENT DOCUMENTS

| | | | |
|---|---|---|---|
| 6,005,270 | A | 12/1999 | Noguchi |
| 6,034,882 | A | 3/2000 | Johnson et al. |
| 6,055,180 | A | 4/2000 | Gudesen et al. |
| 6,128,214 | A | 10/2000 | Kuekes et al. |
| 6,130,835 | A | 10/2000 | Scheuerlein |
| 6,163,048 | A | 12/2000 | Hirose et al. |
| 6,185,121 | B1 | 2/2001 | O'Neill |
| 6,185,122 | B1 | 2/2001 | Johnson et al. |
| 6,324,093 | B1 | 11/2001 | Perner et al. |
| 6,335,890 | B1 | 1/2002 | Reohr et al. |
| 6,356,477 | B1 | 3/2002 | Tran |
| 6,363,000 | B2 | 3/2002 | Perner et al. |
| 6,377,502 | B1 * | 4/2002 | Honda et al. .......... 365/230.03 |
| 6,385,074 | B1 | 5/2002 | Johnson et al. |
| 6,420,215 | B1 | 7/2002 | Knall et al. |
| 6,445,613 | B1 | 9/2002 | Nagai |
| 6,462,979 | B2 | 10/2002 | Schlösser et al. |
| 6,473,328 | B1 | 10/2002 | Mercaldi |
| 6,477,077 | B1 | 11/2002 | Okazawa |
| 6,490,194 | B2 | 12/2002 | Hoenigschmid |
| 6,498,747 | B1 | 12/2002 | Gogl et al. |
| 6,504,246 | B2 | 1/2003 | Roth et al. |
| 6,504,742 | B1 | 1/2003 | Tran et al. |
| 6,515,888 | B2 | 2/2003 | Johnson et al. |
| 6,522,594 | B1 | 2/2003 | Scheuerlein |
| 6,525,953 | B1 | 2/2003 | Johnson |
| 6,545,898 | B1 | 4/2003 | Scheuerlein |
| 6,567,287 | B2 | 5/2003 | Scheuerlein |
| 6,584,006 | B2 | 6/2003 | Viehmann |
| 6,611,453 | B2 | 8/2003 | Ning |
| 6,614,685 | B2 | 9/2003 | Wong |
| 6,618,295 | B2 | 9/2003 | Scheuerlein |
| 6,631,085 | B2 | 10/2003 | Kleveland et al. |
| 6,646,912 | B2 | 11/2003 | Hurst et al. |
| 6,661,730 | B1 | 12/2003 | Scheuerlein et al. |
| 6,687,147 | B2 | 2/2004 | Fricke et al. |
| 6,735,104 | B2 | 5/2004 | Scheuerlein |
| 6,822,903 | B2 | 11/2004 | Scheuerlein et al. |
| 6,849,905 | B2 | 2/2005 | Ilkbahar et al. |
| 6,856,572 | B2 | 2/2005 | Scheuerlein et al. |
| 6,859,410 | B2 | 2/2005 | Scheuerlein et al. |
| 6,879,505 | B2 | 4/2005 | Scheuerlein |
| 6,881,994 | B2 | 4/2005 | Lee et al. |
| 2003/0021148 | A1 | 1/2003 | Scheuerlein |
| 2003/0202404 | A1 | 10/2003 | Scheuerlein |
| 2004/0002184 | A1 | 1/2004 | Cleeves |
| 2004/0124415 | A1 | 7/2004 | Walker et al. |
| 2004/0124466 | A1 | 7/2004 | Walker et al. |
| 2004/0125629 | A1 | 7/2004 | Scheuerlein et al. |
| 2004/0145024 | A1 | 7/2004 | Chen et al. |
| 2004/0188714 | A1 | 9/2004 | Scheuerlein et al. |
| 2005/0121790 | A1 | 6/2005 | Cleeves et al. |
| 2005/0122779 | A1 | 6/2005 | Fasoli et al. |
| 2005/0122780 | A1 | 6/2005 | Chen et al. |
| 2005/0128807 | A1 | 6/2005 | Chen et al. |

FOREIGN PATENT DOCUMENTS

| | | |
|---|---|---|
| EP | 0 395 886 A2 | 11/1990 |
| EP | 0 924 709 A2 | 6/1999 |
| JP | 1998-10149688 | 6/1998 |
| JP | 2001-028427 | 1/2001 |
| JP | 2002-280467 | 9/2002 |
| WO | WO-02-43067 | 5/2002 |

OTHER PUBLICATIONS

Crowley, Matthew et al., "512Mb PROM with 8 Layers of Antifuse/Diode Cells", 2003 IEEE ISSCC Conference, Session 16, Non-Volatile Memory, Paper 16.4, pp. 1-3, and corresponding presentation slides (23 pages).

Durlam, M. et al., "Nonvolatile RAM Based on Magnetic Tunnel Junction Elements," 2000 IEEE International Solid State Circuits Conference, ISSCC2000/Session 7/TD: Emerging Memory & Device Technologies, Feb. 2000, pp. 130-131.

Evans, Robert J. et al., "Energy Consumption Modeling and Optimization for SRAM's," IEEE Journal of Solid-State Circuits, vol. 30, No. 5, May 1995, pp. 571-579.

Greene, Jonathan et al., "Antifuse Field Programmable Gate Arrays," Proceedings of the IEEE, vol. 81, No. 7, New York, Jul. 1993, pp. 1042-1056.

Motta, Ilaria et al., "High-Voltage Management in Single-Supply CHE NOR-Type Flash Memories," Proceedings of the IEEE, vol. 91, No. 4, Apr. 2003, pp. 554-568.

Naji, Peter K. et al., "A 256kb 3.0V 1T1MTJ Nonvolatile Magnetoresistive RAM," 2001 IEEE ISSCC, Feb. 6, 2001, Paper 7.6, and corresponding presentation slides (35 pages).

Nishihara, Toshiyuki et al., "A Quasi-Matrix Ferroelectric Memory for Future Silicon Storage," IEEE Journal of Solid-State Circuits, vol. 37, No. 11, Nov. 2002, pp. 1479-1484.

Okuda, Takashi et al., "A Four-Level Storage 4-Gb DRAM," IEEE Journal of Solid-State Circuits, vol. 32, No. 11, Nov. 1997, pp. 1743-1747.

Sugibayashi, Tadahiko et al., "A 30-ns 256-Mb DRAM with a Multidivided Array Structure," IEEE Journal of Solid-State Circuits, vol. 28, No. 11, Nov. 1993, pp. 1092-1098.

Takeuchi, Ken et al., "A Negative Vth Cell Architecture for Highly Scalable, Excellently Noise-Immune, and Highly Reliable NAND Flash Memories," IEEE Journal of Solid-State Circuits, vol. 34, No. 5, May 1999, pp. 675-684.

* cited by examiner

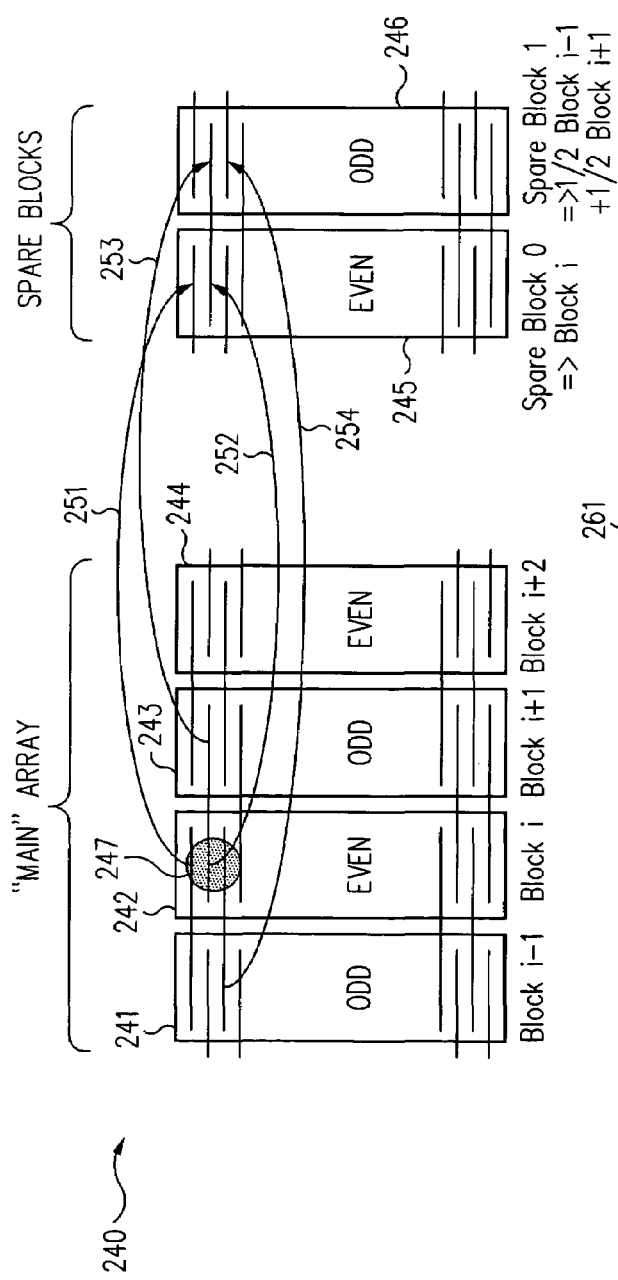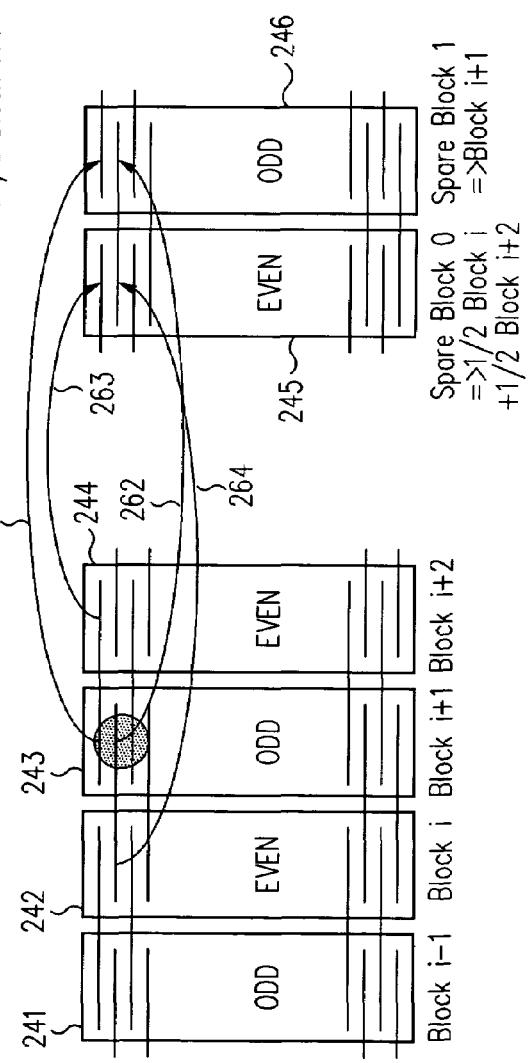
FIG. 4
FIG. 5

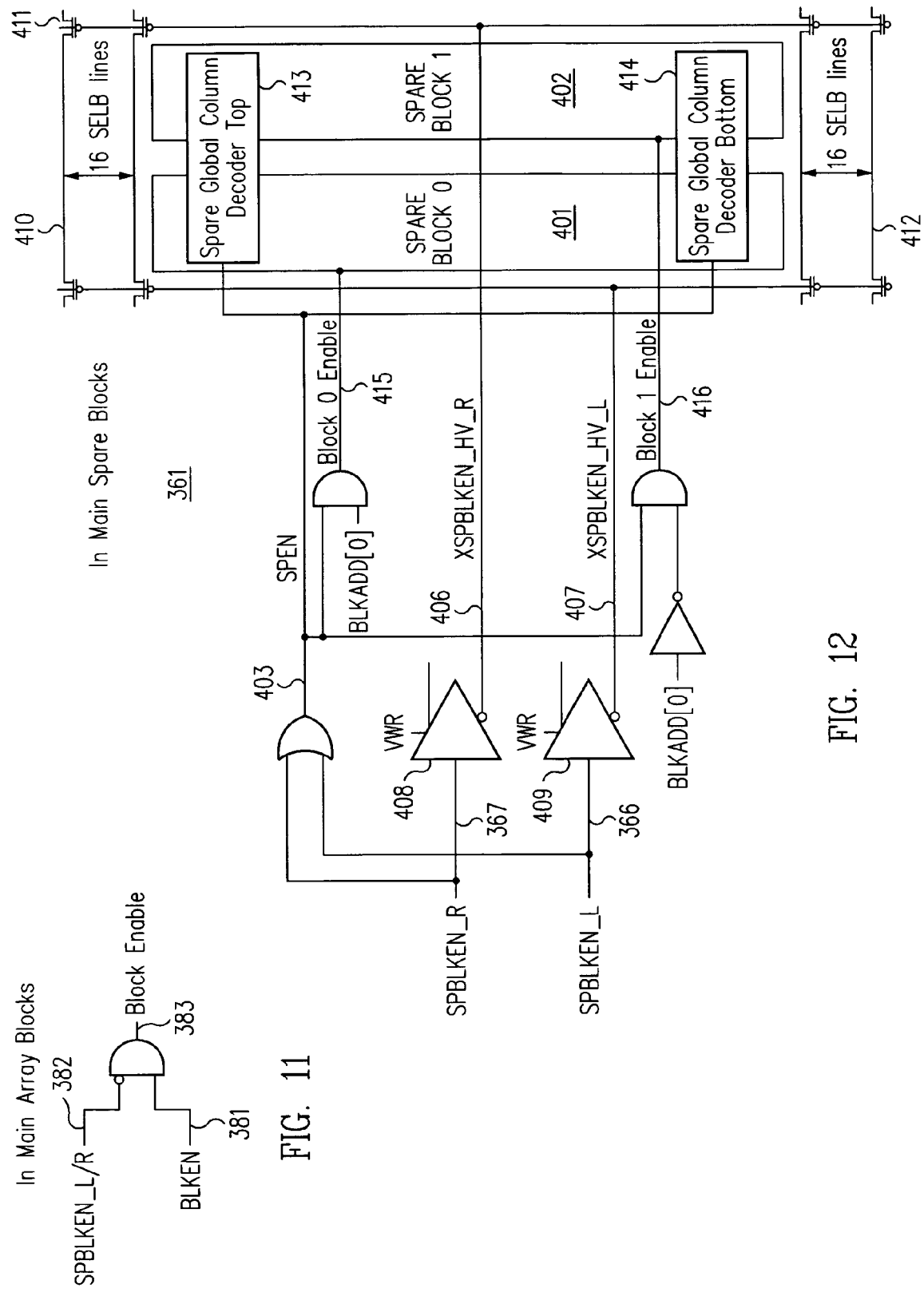

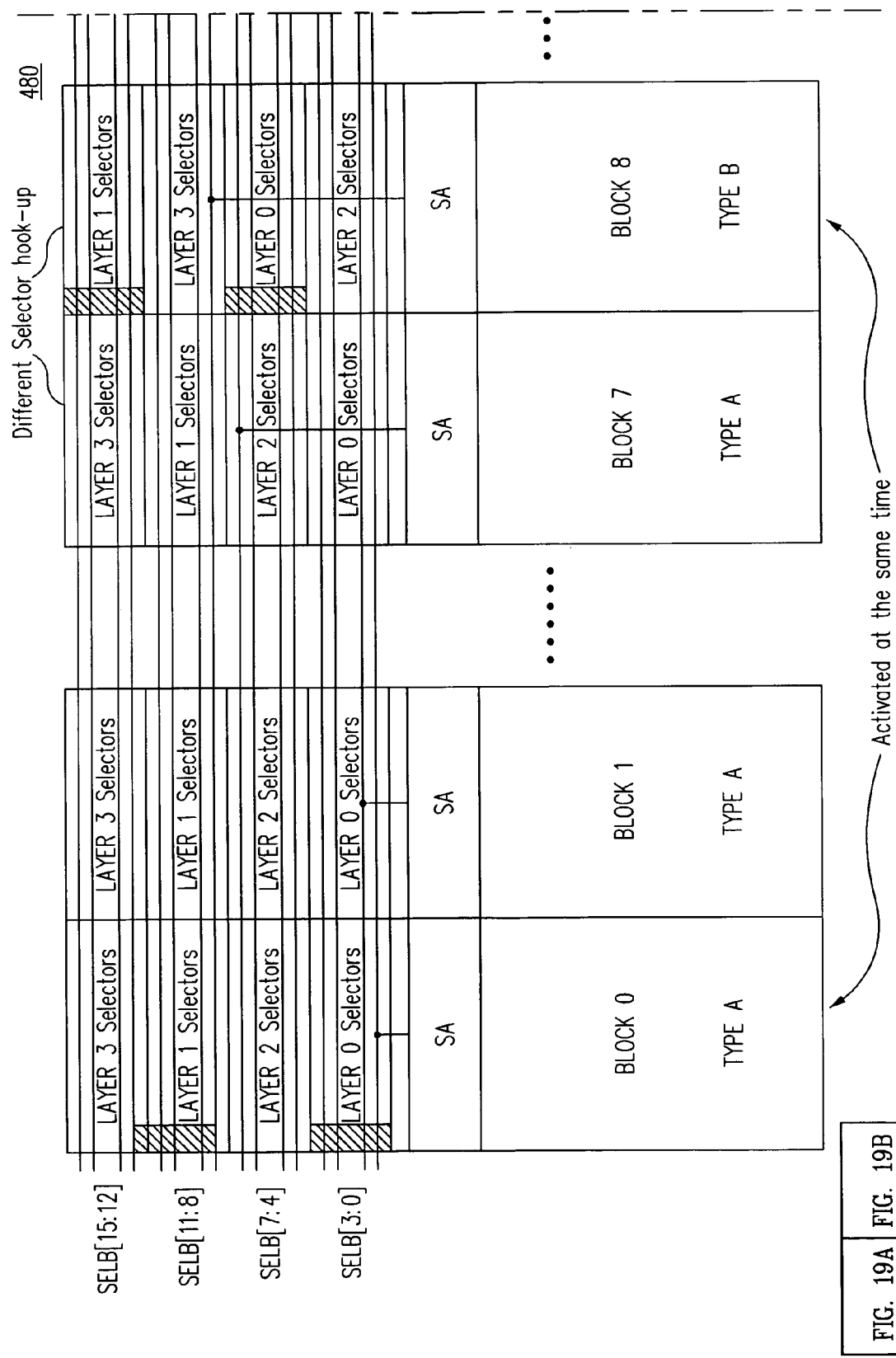

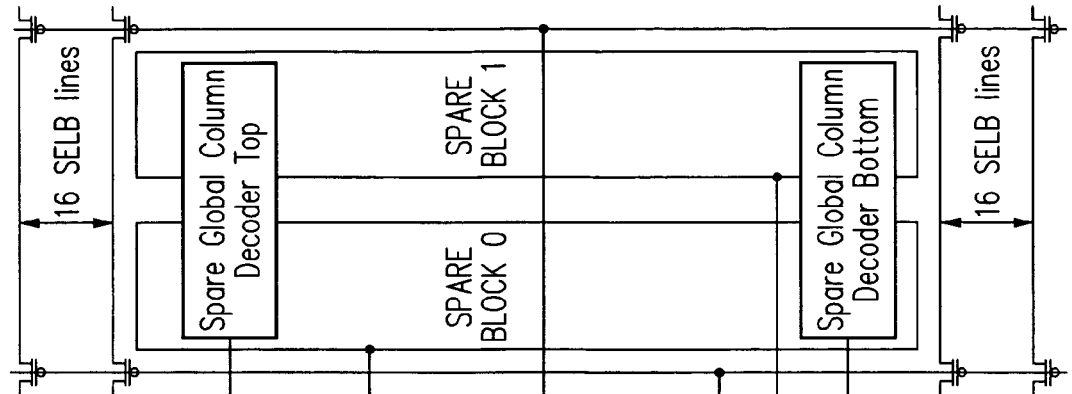
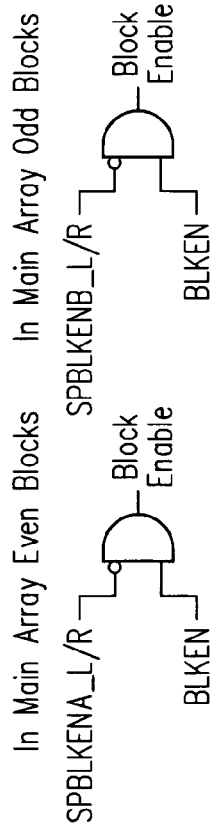
FIG. 29
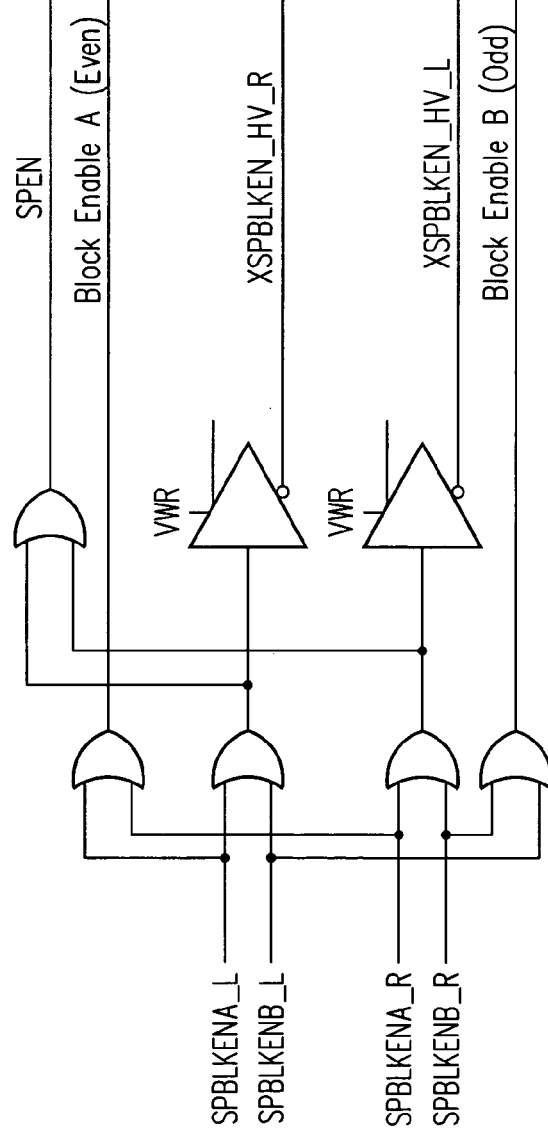
FIG. 30

MATCH LOGIC INPUTS

| Signal Name | In/Out | Functional Description | Timing Critical? |
|---|---|---|---|
| TF_BLKRED_ENTRY1_TB[6:0] | I | Failing block address core 0 bay 1/0 (see table 1 for bit definition) | No |
| TF_BLKRED_ENTRY2_TB[6:0] | I | Failing block address core 0 bay 3/2 (see table 1 for bit definition) | No |
| TF_BLKRED_ENTRY3_TB[6:0] | I | Failing block address core 0 bay 5/4 (see table 1 for bit definition) | No |
| TF_BLKRED_ENTRY4_TB[6:0] | I | Failing block address core 0 bay 7/6 (see table 1 for bit definition) | No |
| TF_BLKRED_ENTRY5_TB[6:0]* | I | Failing block address core 1 bay 1/0 (see table 1 for bit definition) | No |
| TF_BLKRED_ENTRY6_TB[6:0]* | I | Failing block address core 1 bay 3/2 (see table 1 for bit definition) | No |
| TF_BLKRED_ENTRY7_TB[6:0]* | I | Failing block address core 1 bay 5/4 (see table 1 for bit definition) | No |
| TF_BLKRED_ENTRY8_TB[6:0]* | I | Failing block address core 1 bay 7/6 (see table 1 for bit definition) | No |
| SMI_BAYE[7:0] | I | Bay enable signals (one for every bay) | Yes |
| SMI_BLKAD[3:0] | I | Block address | Yes |
| SMI_RAD[0] | I | LSB of the WL address | Yes |
| SMI_TWOLAYER | I | Two layer part – Need to change the replacement procedure for a two layer part | No |
| SMI_ALLSPBLKON_TMCR* | I | Test Mode to activate all spare blocks at the same time | No |

FIG. 31

| Failing Block | TF_BLKRED_ENTRY1[6:0] | TF_BLKRED_ENTRY2[6:0] | Remap Bay 0/1 Spare Block 0 | Bay 0/1 Spare Block 1 | Bay 2/3 Spare Block 0 | Bay 2/3 Spare Block 1 |
|---|---|---|---|---|---|---|
| None in Bay 0/1/2/3 | 0000000 | 0000000 | UNUSED | UNUSED | UNUSED | UNUSED |
| Bay 0, Block 0 | 1000000 | Can be used for a bad block in Bay 2, Block 1-15 and Bay 3, Block 0-15 | Bay 0, Block 0 | Bay 0, Block 1 | See second half of table | See second half of table |
| Bay 0, Block 1 | 1000001 | Can be used for a bad block in Bay 2, Block 1-15 and Bay 3, Block 0-15 | 1/2 Bay 0, Block 0 1/2 Bay 0, Block 2 | 1/2 Bay 0, Block 1 1/2 UNUSED | See second half of table | See second half of table |
| Bay 0, Block 2 | 1000010 | Can be used for a bad block in Bay 2, Block 1-15 and Bay 3, Block 0-15 | Bay 0, Block 2 | 1/2 Bay 0, Block 1 1/2 Bay 0, Block 3 | See second half of table | See second half of table |
| Bay 0, Block 3 | 1000011 | Can be used for a bad block in Bay 2, Block 1-15 and Bay 3, Block 0-15 | 1/2 Bay 0, Block 2 1/2 Bay 0, Block 4 | Bay 0, Block 3 | See second half of table | See second half of table |
| Bay 0, Block 4 | 1000100 | Can be used for a bad block in Bay 2, Block 1-15 and Bay 3, Block 0-15 | Bay 0, Block 4 | 1/2 Bay 0, Block 3 1/2 Bay 0, Block 5 | See second half of table | See second half of table |
| Bay 0, Block 5 | 1000101 | Can be used for a bad block in Bay 2, Block 1-15 and Bay 3, Block 0-15 | 1/2 Bay 0, Block 4 1/2 Bay 0, Block 6 | Bay 0, Block 5 | See second half of table | See second half of table |
| Bay 0, Block 6 | 1000110 | Can be used for a bad block in Bay 2, Block 1-15 and Bay 3, Block 0-15 | Bay 0, Block 6 | 1/2 Bay 0, Block 5 1/2 Bay 0, Block 7 | See second half of table | See second half of table |
| ... | | | | | | |
| Bay 0, Block 14 | 1001110 | Can be used for a bad block in Bay 2, Block 1-15 and Bay 3, Block 0-15 | Bay 0, Block 14 | 1/2 Bay 0, Block 13 1/2 Bay 0, Block 15 | See second half of table | See second half of table |
| Bay 0, Block 15 | 1001111 | Can be used for a bad block in Bay 2, Block 1-15 and Bay 3, Block 0-15 | 1/2 Bay 0, Block 14 1/2 UNUSED | Bay 0, Block 15 | See second half of table | See second half of table |
| Bay 0/1, Spare Block 0 | 1010000 | Can be used for a bad block in Bay 2, Block 1-15 and Bay 3, Block 0-15 | UNUSED | UNUSED | See second half of table | See second half of table |
| Bay 0/1, Spare Block 1 | 1111111 | Can be used for a bad block in Bay 2, Block 1-15 and Bay 3, Block 0-15 | 1/2 Bay 1, Block 0 1/2 UNUSED | UNUSED | See second half of table | See second half of table |
| Bay 1, Block 0 | 1100000 | Can be used for a bad block in Bay 2, Block 1-15 and Bay 3, Block 0-15 | Bay 1, Block 0 | 1/2 Bay 1, Block 1 1/2 UNUSED | See second half of table | See second half of table |

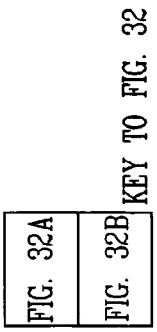

FIG. 32A

| | | Bay 1, Block 1 | 1/2 Bay 1, Block 0<br>1/2 Bay 1, Block 2 | 1/2 Bay 1, Block 1<br>1/2 Bay 1, Block 2 | See second<br>half of table | See second<br>half of table |
|---|---|---|---|---|---|---|
| Bay 1, Block 1 | 1100001 | Can be used for a bad block in Bay 2,<br>Block 1-15 and Bay 3, Block 0-15 | Bay 1, Block 14 | 1/2 Bay 1, Block 13<br>1/2 Bay 1, Block 15 | See second<br>half of table | See second<br>half of table |
| ...... | | | | | | |
| Bay 1, Block 14 | 1101110 | Can be used for a bad block in Bay 2,<br>Block 1-15 and Bay 3, Block 0-15 | Bay 1, Block 14 | 1/2 Bay 1, Block 13<br>1/2 Bay 1, Block 15 | Bay 2, Block 0 | 1/2 Bay 2, Block 1<br>1/2 UNUSED |
| Bay 1, Block 15 | 1101111 | 1000000 | 1/2 Bay 1, Block 14<br>1/2 UNUSED | Bay 1, Block 15 | Bay 2, Block 0 | 1/2 Bay 2, Block 1<br>1/2 UNUSED |
| Bay 2, Block 0 | 1101111 | 1000000 | 1/2 Bay 1, Block 14<br>1/2 UNUSED | See first<br>half of table | Bay 2, Block 1 |
| Bay 2, Block 1 | Can be used for bad block in Bay 0,<br>Block 0-15 and Bay 1, Block 0-14 | 1000001 | See first<br>half of table | See first<br>half of table | 1/2 Bay 2, Block 0<br>1/2 Bay 2, Block 2 | 1/2 Bay 2, Block 1<br>1/2 Bay 2, Block 3 |
| Bay 2, Block 2 | Can be used for bad block in Bay 0,<br>Block 0-15 and Bay 1, Block 0-14 | 1000010 | See first<br>half of table | See first<br>half of table | Bay 2, Block 2 | |
| ...... | | | | | | |
| Bay 2, Block 14 | Can be used for bad block in Bay 0,<br>Block 0-15 and Bay 1, Block 0-14 | 1001110 | See first<br>half of table | See first<br>half of table | Bay 2, Block 14 | 1/2 Bay 2, Block 13<br>1/2 Bay 2, Block 15 |
| Bay 2, Block 15 | Can be used for bad block in Bay 0,<br>Block 0-15 and Bay 1, Block 0-14 | 1001111 | See first<br>half of table | See first<br>half of table | 1/2 Bay 2, Block 14<br>1/2 UNUSED | Bay 2, Block 15 |
| Bay 2/3, Spare Block 0 | | 1010000 | See first<br>half of table | See first<br>half of table | UNUSED | 1/2 Bay 2, Block 15<br>1/2 UNUSED |
| Bay 2/3, Spare Block 1 | | 1111111 | See first<br>half of table | See first<br>half of table | 1/2 Bay 3, Block 0<br>1/2 UNUSED | UNUSED |
| Bay 3, Block 0 | Can be used for bad block in Bay 0,<br>Block 0-15 and Bay 1, Block 0-14 | 1100000 | See first<br>half of table | See first<br>half of table | Bay 3, Block 0 | 1/2 Bay 3, Block 1<br>1/2 UNUSED |
| Bay 3, Block 1 | Can be used for bad block in Bay 0,<br>Block 0-15 and Bay 1, Block 0-14 | 1100001 | See first<br>half of table | See first<br>half of table | 1/2 Bay 3, Block 0<br>1/2 Bay 3, Block 2 | Bay 3, Block 1 |
| ...... | | | | | | |
| Bay 3, Block 14 | Can be used for bad block in Bay 0,<br>Block 0-15 and Bay 1, Block 0-14 | 1101110 | See first<br>half of table | See first<br>half of table | Bay 3, Block 14 | 1/2 Bay 3, Block 13<br>1/2 Bay 3, Block 15 |
| Bay 3, Block 15 | Can be used for bad block in Bay 0,<br>Block 0-15 and Bay 1, Block 0-14 | 1101111 | See first<br>half of table | See first<br>half of table | 1/2 Bay 3, Block 14<br>1/2 UNUSED | Bay 3, Block 15 |

Table 2. Failing block, trim bit setting and remapping for core 0, bays 0-3. For core 0, bays 4-7, core 1 bays 0-3 and core 1, bays 4-7 the implementation is exactly the same

FIG. 32B

INTEGRATED CIRCUIT MEMORY ARRAY CONFIGURATION INCLUDING DECODING COMPATIBILITY WITH PARTIAL IMPLEMENTATION OF MULTIPLE MEMORY LAYERS

CROSS-REFERENCE TO RELATED APPLICATION(S)

This application is related to co-pending U.S. application Ser. No. 11/095,907, filed on even date herewith, entitled "Method and Apparatus for Incorporating Block Redundancy in a Memory Array" by Luca G. Fasoli and Roy E. Scheuerlein, which application is hereby incorporated by reference in its entirety.

BACKGROUND

1. Field of the Invention

The present invention relates to semiconductor integrated circuits containing memory arrays, and particularly to integrated circuits incorporating a three-dimensional memory array.

2. Description of the Related Art

Ongoing developments in semiconductor processing technologies and memory cell technologies have continued to increase the density achieved in integrated circuit memory arrays. For example, certain passive element memory cell arrays, such as those including an antifuse cell, may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane or level of memory cells have been fabricated implementing such $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication," and in U.S. Pat. No. 5,835,396 to Zhang, entitled "Three-Dimensional Read-Only Memory Array."

SUMMARY

In a monolithic semiconductor integrated circuit incorporating a three-dimensional memory array, two or more memory planes are vertically stacked on top of each other, and all such memory planes may be disposed above a substrate. It may be desirable to optionally fabricate an integrated circuit device having less than the full number of memory planes provided for by such design. Clearly, such a device could be manufactured by changing the entire design, including changing many or all of the semiconductor processing masks, and fabricating a totally different design having fewer memory planes, but this is a costly proposition requiring a completely new design and mask set.

The present invention provides, in some embodiments, an integrated circuit that provides for a given number of memory planes, but which may be fabricated instead to include a lesser number of memory planes. This may be accomplished by omitting the masks and processing steps associated with the omitted memory planes, without changing any of the other fabrication masks for the other memory planes or for the remainder of the device. In a device which includes a plurality of I/O bus lines for the array, this may also be accomplished without requiring routing or other configuration changes to the read or read/write path for the array.

In some aspects, the invention provides an integrated circuit including a memory array having a respective plurality of array lines of a first type for a first memory layer and, if implemented, for a second memory layer. The integrated circuit also includes a plurality of I/O bus lines, and a plurality of layer selector circuits for both the first and second memory layers, each responsive to an associated enable signal, for coupling respective array lines on an associated memory layer to respective ones of an associated group of the I/O bus lines. The integrated circuit also includes control circuitry for selectively enabling certain layer selector circuits. The control circuitry is configurable, and the layer selector circuits are suitably arranged, to couple a respective array line on an implemented memory layer to each respective I/O bus line irrespective of whether the second memory layer is implemented.

In some embodiments, a given I/O bus line is coupled at times to an array line on the first memory layer, and coupled at other times to an array line on the second memory layer, if such second memory layer is implemented, or otherwise coupled at such other times to an array line on the first memory layer.

In some embodiments, the control circuits are configured by programming a configuration memory. In some embodiments, the control circuits are configured by the presence or absence of a feature on a layer associated with the second memory layer.

In some embodiments, the array lines of the first type may be bit lines, and the memory array may include a plurality of word lines in which each word line includes a word line segment on each of one or more word line layers. Preferably, a word line decoder for the integrated circuit has a configuration that is independent of whether the second memory layer is implemented. Preferably, the memory array includes passive element memory cells, and may include antifuse memory cells.

The memory array may be arranged in memory blocks, and each block may include layer selector circuits for one or more memory layers. In some embodiments, a single decoder output may be selected when all available memory layers are implemented, and more than one decoder output may be selected if fewer memory layers are actually implemented. For example, two such decoder outputs may be simultaneously selected, and these may be located, for different embodiments, in the same block, in adjacent blocks, or in non-adjacent blocks.

In another aspect, the invention provides an integrated circuit including a memory array having at least one memory layer, each memory layer including a respective plurality of array lines of a first type. The integrated circuit also includes means for configuring the memory array depending upon whether a second memory layer is implemented, and means for coupling every respective one of a plurality of I/O bus lines for the memory array to a respective array line on an implemented memory layer irrespective of whether the second memory layer is implemented.

In yet another aspect, the invention provides a method for use in an integrated circuit memory array having at least one memory layer, each memory layer including a respective plurality of array lines of a first type. The method includes configuring the memory array depending upon whether a second memory layer is implemented, and coupling every respective one of a plurality of I/O bus lines for the memory array to a respective array line on an implemented memory layer irrespective of whether the second memory layer is implemented.

In some embodiments the method includes, when a first select signal is enabled, respectively coupling array lines from the first memory layer to respective I/O bus lines of a first group, and respectively coupling array lines from a second memory layer, if implemented, to respective I/O bus lines of a second group. The method further includes, when a second select signal is enabled, respectively coupling array lines from the second memory layer, if implemented, to respective I/O bus lines of the first group, and respectively coupling array lines from the first memory layer to respective I/O bus lines of the second group.

The method may include individually enabling the first and second column select signals in a memory array in which both groups of memory layers are implemented, and simultaneously enabling the first and second column select signals in a memory array in which only the first group of memory layers is implemented.

The simultaneously enabled first and second column select signals may be associated with a single memory block, associated with adjacent memory blocks, or associated with two non-adjacent memory blocks.

The invention in several aspects is suitable for integrated circuits having a memory array, for methods for operating such integrated circuits and memory arrays, and for computer readable media encodings of such integrated circuits or memory arrays, all as described herein in greater detail and as set forth in the appended claims. Moreover, the inventive concepts described herein may be used alone or in combination.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 4 is a block diagram of a memory array showing the mapping of a defective memory block and portions of the neighboring blocks into a pair of spare memory blocks.

FIG. 5 is a block diagram of a memory array showing the mapping of a defective memory block and portions of the neighboring blocks into a pair of spare memory blocks.

FIG. 11 is a block diagram of exemplary main array control circuitry.

FIG. 12 is a block diagram of exemplary spare block control circuitry.

FIG. 19, comprising FIG. 19A and FIG. 19B, is a block diagram of an exemplary array showing a particular layer selection configuration.

FIG. 20, comprising

FIG. 27, comprising

FIG. 29 is a block diagram of exemplary main array control circuitry.

FIG. 30 is a block diagram of exemplary spare block control circuitry.

FIG. 31 is a table of input signals to an exemplary control circuit.

FIG. 32, comprising FIG. 32A and FIG. 32B, is a table of trim bit values for various defective memory blocks.

The use of the same reference symbols in different drawings indicates similar or identical items.

DESCRIPTION OF THE PREFERRED EMBODIMENT(S)

Figure 1:
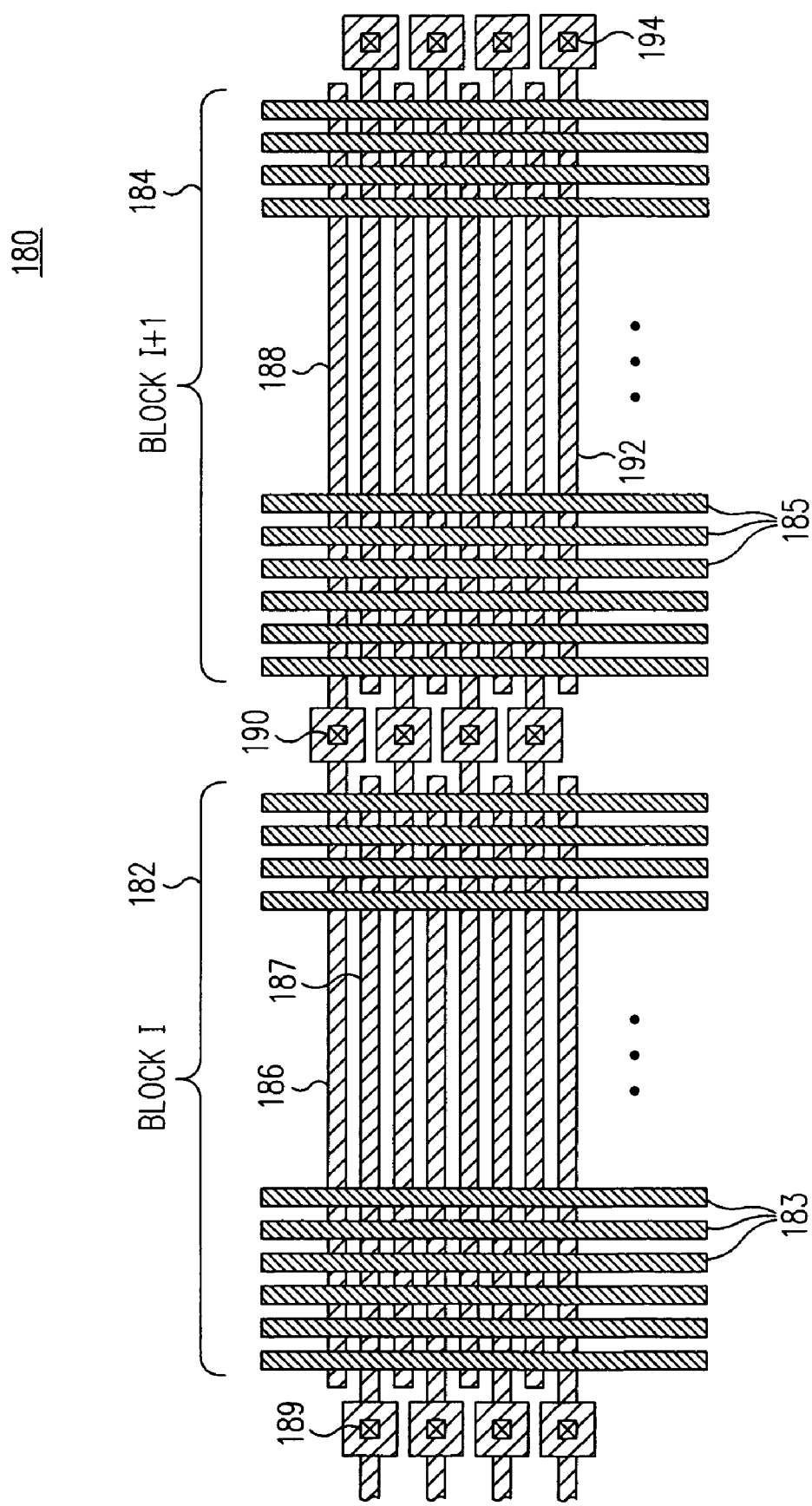
FIG. 1 is a top view representing a word line layer and a bit line layer of a memory array, which shows 2:1 interleaved word lines shared by adjacent memory blocks.

FIG. 1 is a top view representing a word line layer and a bit line layer of a three-dimensional memory array in accordance with certain embodiments of the present invention. Memory blocks 182, 184 are shown respectively including a plurality of bit lines 183, 185, and having 2:1 interleaved word line segments. Vertical connections to half of the word line segments for a block are on the left side of the block (e.g., word line segment 187 and vertical connection 189), and vertical connections to the other half of the word line segments for the block are on the right side of the block (e.g., word line segment 186 and vertical connection 190). In addition, each vertical connection serves a word line segment in each of two adjacent blocks. For example, vertical connection 190 connects to word line segment 186 in array block 182 and connects to word line segment 188 in array block 184. In other words, each vertical connection (such as vertical connection 190) is shared by a word line segment in each of two adjacent blocks. As would be expected, however, the respective "outside" vertical connections for the first and last array blocks may serve only word line segments in the first and last array blocks. For example, if block 184 is the last block of a plurality of blocks forming a memory array, its outside vertical connections (e.g., vertical connection 194) may serve only the word line segment 192 within block 184, and are thus not shared by two word line segments as throughout the remainder of the array.

By interleaving the word line segments as shown, the pitch of the vertical connections is twice the pitch of the individual word line segments themselves. This is particularly advantageous since the word line pitch which is achievable for many passive element memory cell arrays is significantly smaller than achievable for many via structures which might be employed to form the vertical connections. Moreover, as described in greater detail below, this also may reduce the complexity of the word line driver circuitry to be implemented in the semiconductor substrate below the memory array.

Other word line layers and bit line layers maybe implemented identically with those shown and thus would share the same vertical connections. Additional description of exemplary memory structures may be found in "Word Line Arrangement Having Multi-Layer Word Line Segments for Three-Dimensional Memory Array" by Scheuerlein, U.S. Published Patent Application No. US2004-0190360, the disclosure of which is hereby incorporated by reference in its entirety. However, while many exemplary embodiments may be described in the context of a three-dimensional memory array (i.e., a monolithic semiconductor integrated circuit incorporating more than one memory plane formed above and below each other), other embodiments of the present invention having only a single memory plane are also specifically contemplated.

The memory array 180 is preferably a passive element memory array (PEMA), incorporating passive element memory cells. As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an anti-fuse technology. A passive element memory array is not necessarily a one-time programmable (i.e., write once) memory array.

Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

Figure 2:
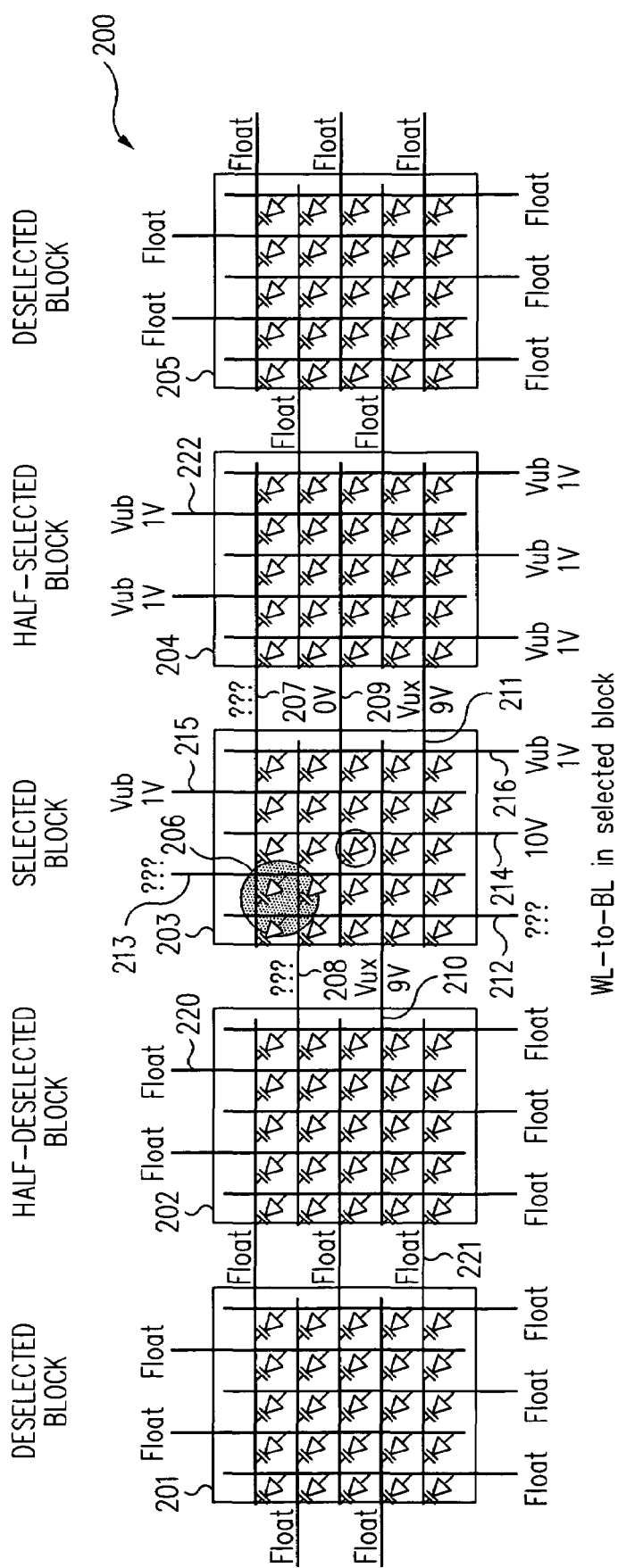
FIG. 2 is a representation of a passive element memory array having shared word lines between adjacent memory blocks, and which illustrates exemplary bias conditions for a memory operation in the presence of an array defect.

Referring now to FIG. 2, a portion of a memory array 200 is shown. Five memory blocks 201, 202, 203, 204, and 205 are depicted, each including five bit lines and five word lines, although in practice many more of such bit lines and word lines may be implemented. Nonetheless, five such bit lines and word lines are sufficient to illustrate the biasing of such an array, and the effect of a bit line-to-word line short (i.e., a "BL-WL short").

Memory block 203 includes word lines 207, 208, 209, 210, and 211 and bit lines 212, 213, 214, 215, and 216. Word line 209 is depicted as the selected word line (SWL) and is biased at 0 volts, while the bit line 214 is depicted as the selected bit line (SBL) and is biased at 10 volts, for programming a selected memory cell at the intersection of the SWL and SBL. The unselected word lines 207, 208, 210, and 211 within the selected block 203 are normally biased at an unselected word line bias voltage (also known as an unselected X-line bias voltage, $V_{UX}$) of 9 volts. The unselected bit lines 212, 213, 215, and 216 within the selected block 203 are normally biased at an unselected bit line bias voltage $V_{UB}$ (also known as an unselected Y-line bias voltage) of 1 volts. Such bias voltages for programming a selected memory cell are exemplary, and other values may be used. Additional description of suitable bias levels for arrays of this type may be found in U.S. Pat. No. 6,618,295 to Roy E. Scheuerlein, the disclosure of which is hereby incorporated by reference, in U.S. Pat. No. 6,631,085 to Bendik Kleveland, et al., the disclosure of which is hereby incorporated by reference, and in "Word Line Arrangement Having Multi-Layer Word Line Segments for Three-Dimensional Memory Array" by Roy E. Scheuerlein, U.S. application Ser. No. 10/403,844 filed Mar. 31, 2003, now published as U.S. Patent Application Publication No. 2004-0190360 A1, which application is hereby incorporated by reference in its entirety.

The memory block 204 may be referred to as a "half-selected" block because the selected word line 209 is shared with block 203 and block 204, as are the unselected word lines 207, 211 (being half of the unselected word lines of block 203). Because the biasing of these word lines is identical to the selected block 203, all the bit lines of block 204 (e.g., bit line 222) are also biased at the unselected bit line level $V_{UB}$, here shown as 1 volt, to prevent unintentional programming of any memory cells (since the selected word line 209 is shared with block 204) and to limit leakage current through the unselected memory cells of block 204.

The memory block 202 may be referred to as a "half-deselected" block because it shares unselected word lines (e.g., word lines 208 and 210) with the selected block 203, but not the selected word line 209. Since approximately half of the unselected word lines (i.e., the word lines shared with the selected block 203) are biased at the unselected level $V_{UX}$, and since no word line is bias at a selected (i.e., programming) bias level, all the bit lines of block 202 (e.g., bit line 220) may be left floating. The remaining word lines (e.g., word line 221) that are not shared with the selected block also may be left floating.

Memory blocks 201 and 205 may be referred to as "deselected" blocks because no array lines are shared with the selected memory block 203. All bit lines and word lines of such deselected blocks may be left floating.

Of note, in the exemplary PEMA as shown, in the selected block 203 the unselected bit lines are biased at a different voltage than the unselected word lines. Moreover, neither the unselected bit lines nor the unselected word lines are bias at ground. Consequently, a short between a bit line and a word line may cause the bias levels of such affected bit line and word line to become indeterminate, even if the affected bit line and word line are never selected (e.g., such as if replaced by a redundant bit line and/or replaced by a redundant word line). The indeterminate bias levels on such lines may cause other memory cells to mis-program, or to leak excessively, or to be non-readable. A short between one or more bit lines and one or more word lines is even more likely to cause unintended bias levels that result in failure of the block containing the short.

However, since two adjacent blocks share word lines, a BL-WL short not only affects the block containing the short, but also affects half of the adjacent block as well. Whenever the word lines and bit lines affected by the short need to be biased at their respective unselected bias levels, the short may prevent such affected array lines from reaching their intended bias levels, which would prevent correct programming and reading of the array. A BL-WL short 206 is depicted in the selected block 203 shown in FIG. 2. Consequently, the unselected bias levels for the affected bit lines 212 and 213 and for the affected word lines 207 and 208 are indeterminate and indicted as "???" in the figure. As can be seen, the word line 207 is shared with and affects the adjacent memory block 204 to one side of the selected block 203, while word line 208 is shared with and affects adjacent memory block 202 to the other side of selected block 203.

Figure 3:
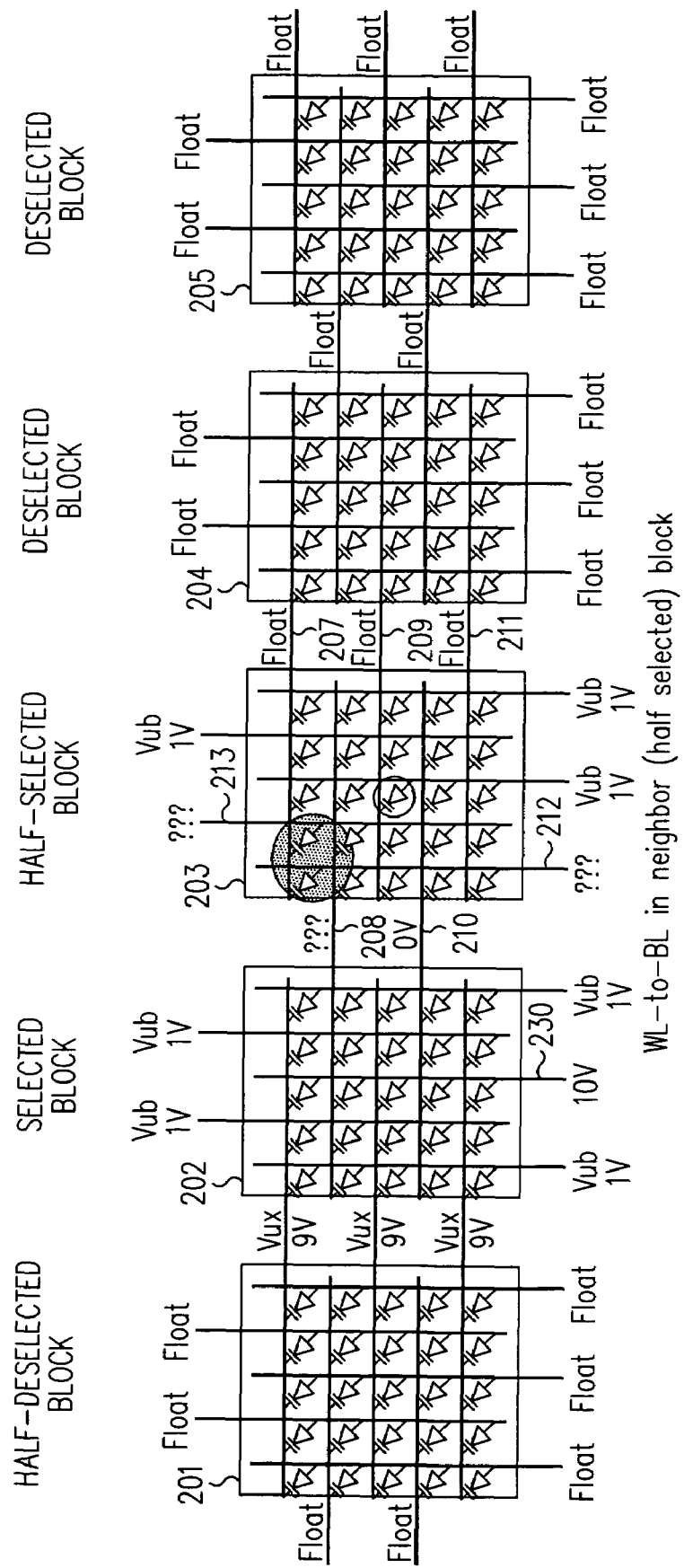
FIG. 3 is a representation of a passive element memory array having shared word lines between adjacent memory blocks, and which illustrates exemplary bias conditions for a memory operation in the presence of an array defect.

Referring now to FIG. 3, the array 200 is shown in which the selected block is adjacent to the defective block containing the BL-WL short. Memory block 202 is now the selected block. Memory block 202 is now the selected block, memory block 201 is now a half-deselected block, memory block 203 (containing the short) is now a half-selected block, and memory blocks 204 and 205 are both deselected memory blocks. The word line 210, which is shared between blocks 202 and 203, is now the selected word line, and is biased at 0 volts. Bit line 230 in block 202 is now the selected bit line, and is biased at 10 volts. As before the unselected bias levels of bit lines 212 and 213, and the unselected bias level of word line 208, are indeterminate.

As a consequence of this shared array line (e.g., here shown as a shared word line) architecture, proper operation of the memory array may be achieved if the block containing the BL-WL short is replaced, and if half of each neighboring block which shares word lines with the block containing the BL-WL short are also replaced. This arises because a block with a BL-WL short cannot be selected or half-selected.

At first glance, such a replacement may be seen to suggest that three spare blocks are required to replace a failing block. However, since the memory blocks in the array alternate between odd and even blocks (i.e., the difference here being whether the upper-most word line is shared with the adjacent block to the right or to the left), a total of four spare blocks might otherwise be required to replace an odd or an even memory block. In other words, to provide for an even spare block including both adjacent odd blocks, and to provide for an odd spare block including both adjacent even blocks, a group of four spare blocks (e.g., odd-even-odd-even blocks) might otherwise be required.

Memory Block Mapping

In one aspect of the present invention, a single memory block may be replaced in this memory array by using just two spare memory blocks. Referring now to FIG. 4, a memory array 240 is depicted which includes a main array including memory blocks 241, 242, 243, and 244, and further includes spare blocks 245 and 246. A BL-WL short 247 is shown within memory block 242, which may be thought of as an "even" memory block. All of the word lines within the defective even memory block 242 are mapped to corresponding word lines within an even spare block 245. For example, the word lines within defective block 242 which are driven into the block 242 from the left side of the block (i.e., which word lines are also shared with adjacent block 241 to the left of block 242) are mapped to a corresponding word line within even spare block 245 (which word lines also are driven into the spare block 245 from the left side of the block). An example of such mapping is depicted as mapping 251. Similarly the word lines within defective block 242 which are driven into the block 242 from the right side of the block (i.e., which are also shared with adjacent block 243 to the right of block 242) are mapped to a corresponding word line within spare block 245 which also are driven into the spare block from the right side of such spare block. An example of such mapping is depicted as mapping 252. The word lines within adjacent odd block 243 (to the right side of defective memory block 242) which are shared with memory block 242 are mapped to odd spare block 246 which is adjacent to and to the right side of even spare block 245. An example of such mapping is depicted as mapping 253. However the word lines within the adjacent odd memory block 241 (to the left side of the defective memory block 242) which are shared with memory block 242 are folded and mapped into the same odd spare memory block 246. An example of such mapping is depicted as mapping 254.

In this manner, all of the word lines within the defective even memory block are mapped into an even spare memory block, and half the word lines within an adjacent odd memory block to one side of the defective memory block, and half the word lines within an adjacent odd memory block to the other side of the defective memory block, are mapped into an odd spare memory block, thereby mapping at least portions of three memory blocks into just two spare memory blocks.

Referring now to FIG. 5, the memory array 240 is again depicted, this time having a BL-WL short 247 within odd memory block 243. All of the word lines within the defective odd memory block 243 are mapped to corresponding word lines within the odd spare block 246. For example, the word lines within defective block 243 which are driven into the block 243 from the left side of the block (i.e., which word lines are also shared with adjacent block 242 to the left of block 243) are mapped to a corresponding word line within spare block 246 (which word lines also are driven into the spare block 246 from the left side of the block). An example of such mapping is depicted as mapping 262. Similarly the word lines within defective block 243 which are driven into the block 243 from the right side of the block (i.e., which are also shared with adjacent block 244 to the right of block 243) are mapped to a corresponding word line within spare block 246 which also is driven into the block from the right side of such spare block. An example of such mapping is depicted as mapping 261. The word lines within adjacent even block 242 (to the left side of defective memory block 243) which are shared with memory block 243 are mapped to even spare block 245 which is adjacent to and to the left side of odd spare block 246. An example of such mapping is depicted as mapping 264. However the word lines within the adjacent even memory block 244 (to the right side of the defective memory block 243) which are shared with memory block 243 are folded and mapped into the same even spare memory block 245. An example of such mapping is depicted as mapping 263.

In this manner, all of the word lines within the defective odd memory block are mapped into an odd spare memory block, and half the word lines within an adjacent even memory block to one side of the defective memory block, and half the word lines within an adjacent odd memory block to the other side of the defective memory block, are mapped into a single odd spare memory block, thereby mapping at least portions of three memory blocks into just two spare memory blocks.

Generalizing somewhat, all of the array lines of a first type (e.g., word lines) within a defective memory block of a first type (e.g., odd or even) are mapped into a spare memory block of the first type, and half the array lines within a first adjacent memory block of a second type (to one side of the defective memory block) which are shared with the defective memory block, and half the array lines within a second adjacent memory block of the second type (to the other side of the defective memory block) which are shared with the defective memory block, are mapped into a spare memory block of the second type. Thus, to replace a single bad block which shares array lines with both adjacent blocks, two spare blocks are needed: one to replace the bad block itself, and the other to replace the respective halves of the two adjacent blocks.

Bay Organization

Figure 6:
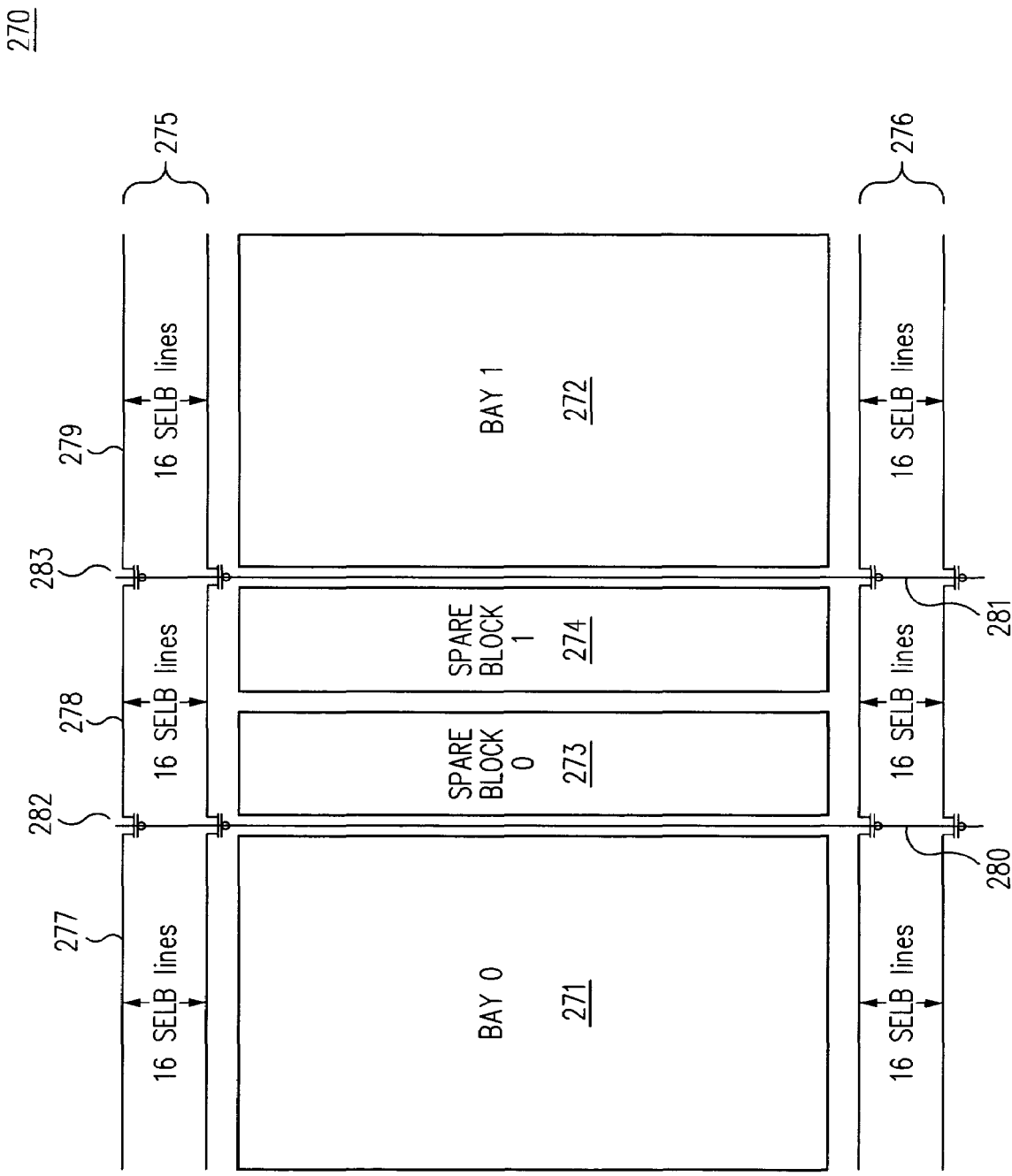
FIG. 6 is a block diagram of a memory array including a pair of spare memory blocks disposed between two memory bays.

Referring now to FIG. 6, the memory array may be organized in bays. Memory array 270 includes a first bay 271, also labeled as BAY 0, and a second bay 272, also labeled BAY 1, and spare memory blocks 273 and 274. Each bay includes a number of memory blocks (preferably 16 memory blocks), and preferably includes its own sense amplifiers (not shown) and page sub-register (not shown) (which, for some three-dimensional memory array embodiments, may be disposed beneath the memory array, and for some embodiments, may be disposed outside the memory array). In the embodiment shown, each sense amplifier within a bay is connected to a corresponding SELB line which traverses across the whole bay. For example, BAY 0 includes a group of SELB lines 277 (e.g., here shown as 16 such SELB lines). During a given memory operation, a group of selected bit lines within BAY 0 (e.g., from one or more memory planes in a three-dimensional array) is respectively coupled to the group of SELB lines 277 by column select circuitry (not shown). In a read operation, a sense amplifier for each SELB line then senses the state of the corresponding bit line, while during a programming operation (for embodiments that support such operation), programming and/or inhibit voltages may be driven onto the various SELB lines according to the desired data pattern to be written, and such bias voltages coupled to the corresponding bit lines by the column select circuitry.

Different bays have different and independent SELB lines. BAY 1 includes a group of SELB lines 279 (e.g., here shown as 16 such SELB lines). As with BAY 0, during a given memory operation, a group of selected bit lines within BAY 1 may be respectively coupled to the group of SELB lines 279 by column select circuitry (not shown).

One possible choice for the spare blocks would be to add them in every bay, sharing the bay's SELB lines. This would add 2 extra blocks for every 16 blocks, causing a memory array area increase of around 12.5% (i.e., 2/16), and would allow replacing one block (e.g., having a BL-WL short) in every bay. Alternatively, to reduce the die size impact, it is possible to share the two spare blocks between two different bays, as is shown in FIG. 6. Coupling circuits 282, 283 on both ends of the SELB lines 278 associated with the spare blocks 273 and 274 allow connecting the spare block's SELB lines 278 to either bay. Depending upon the bias levels of such SELB lines, the coupling circuits may be as simple as a PMOS transistor switch, as shown in the figure. If control signal 280 is active (i.e., in this example, low) then the spare block's SELB lines 278 are respectively coupled to the SELB lines 277 for BAY 0. Control signal 281 would remain inactive in such a case to isolate the spare block's SELB lines 278 from the SELB lines 279. Alternatively, if control signal 281 is active, then the spare block's SELB lines 278 are respectively coupled to the SELB lines 279 for BAY 1. Control signal 280 would remain inactive in such a case to isolate the spare block's SELB lines 278 from the SELB lines 277.

Once the spare block SELB lines 278 are connected (e.g., via PMOS switches) to the SELB lines of the appropriate bay, and thus to the sense amplifiers for the bay, the block redundancy operation becomes completely transparent to the sense amplifier and page sub-register without further multiplexing and, if programmable, transparent to the programming operations as well. No duplication of read/write circuitry is required. This scheme provides for replacing one memory block every 2 bays (i.e. one BL-WL short is allowed for every 2 bays). Although the spare block read path contains an extra PMOS switch device (or other coupling circuit), careful read and program path simulation may be performed to ensure similar behavior between main array and spare block read/write operations. With this configuration, the memory array area increase is around 6.7% (i.e., 2/32, plus a small additional area for the PMOS switch, around 5 um).

Similar gating or coupling considerations may also apply to other column select and/or column decoder lines, in which such column selection lines for the spare blocks may be coupled to either the analogous lines in BAY 0 or BAY 1 when a memory block is replaced by a spare block. For example, a group of global column select (CSG) lines may be respectively coupled at left and right ends thereof to either the CSG lines for BAY 0 or the CSG lines for BAY 1. Because such CSG lines are full-rail signals, such a coupling circuit preferably includes a full transmission gate (i.e., both an NMOS and PMOS transistor). In certain embodiments, each bay includes 10 such CSG lines, although other numbers and types of column selection signal lines are contemplated as well. Alternatively, the spare blocks may include a separate global column select decoder which is enabled whenever a spare block is enabled, as described in greater detail herebelow, such as is shown in FIG. 12. A lower set of SELB lines is also provided, as the array preferably includes interleaved bit lines, with half exiting the array to the top, and the other half exiting to the bottom.

Additional details of useful column circuitry, including such aforementioned CSG lines and related decoder circuits, SELB lines, and layer selection circuits, may be found in "Apparatus and Method for Hierarchical Decoding of Dense Memory Arrays Using Multiple Levels of Multiple-Headed Decoders" by Luca G. Fasoli, et al., U.S. application Ser. No. 11/026,470, filed Dec. 30, 2004, the disclosure of which is hereby incorporated by reference. FIGS. 2-5 are particularly appropriate, and the group of sixteen lines labeled I/O[15]-I/O[0] depicted in FIG. 3 correspond to the SELB lines described herein.

Figure 7:
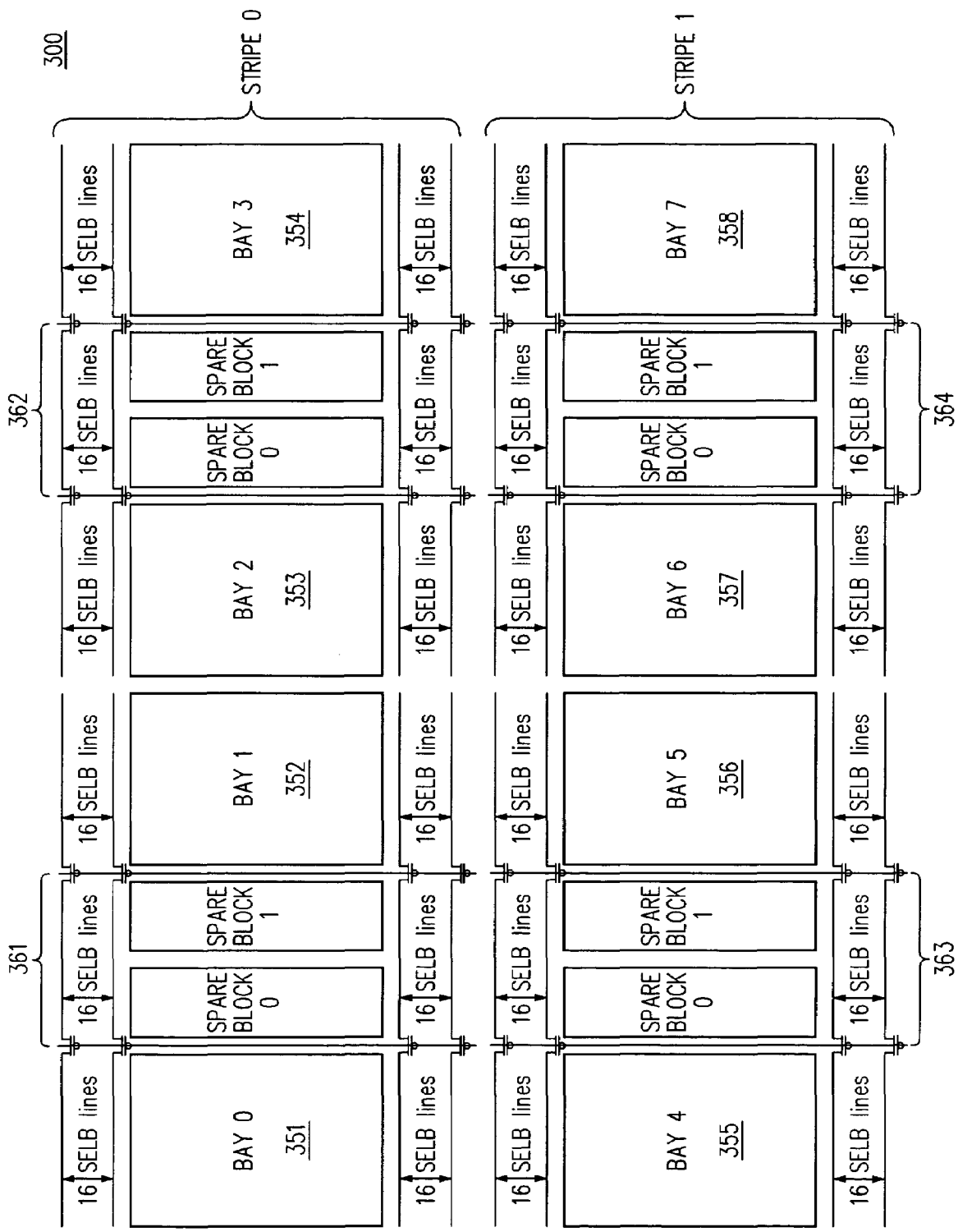
FIG. 7 is a block diagram of a memory array including a four pairs of spare memory blocks, each disposed between a respective pair of memory bays.

FIG. 7 shows another embodiment of a memory array 300 that includes four pairs of bays, each with a pair of spare blocks and a group of SELB lines connectable by PMOS switches to the SELB lines of either adjacent bay, all as shown in FIG. 6, and here grouped in a 2×2 grid.

Figure 8:
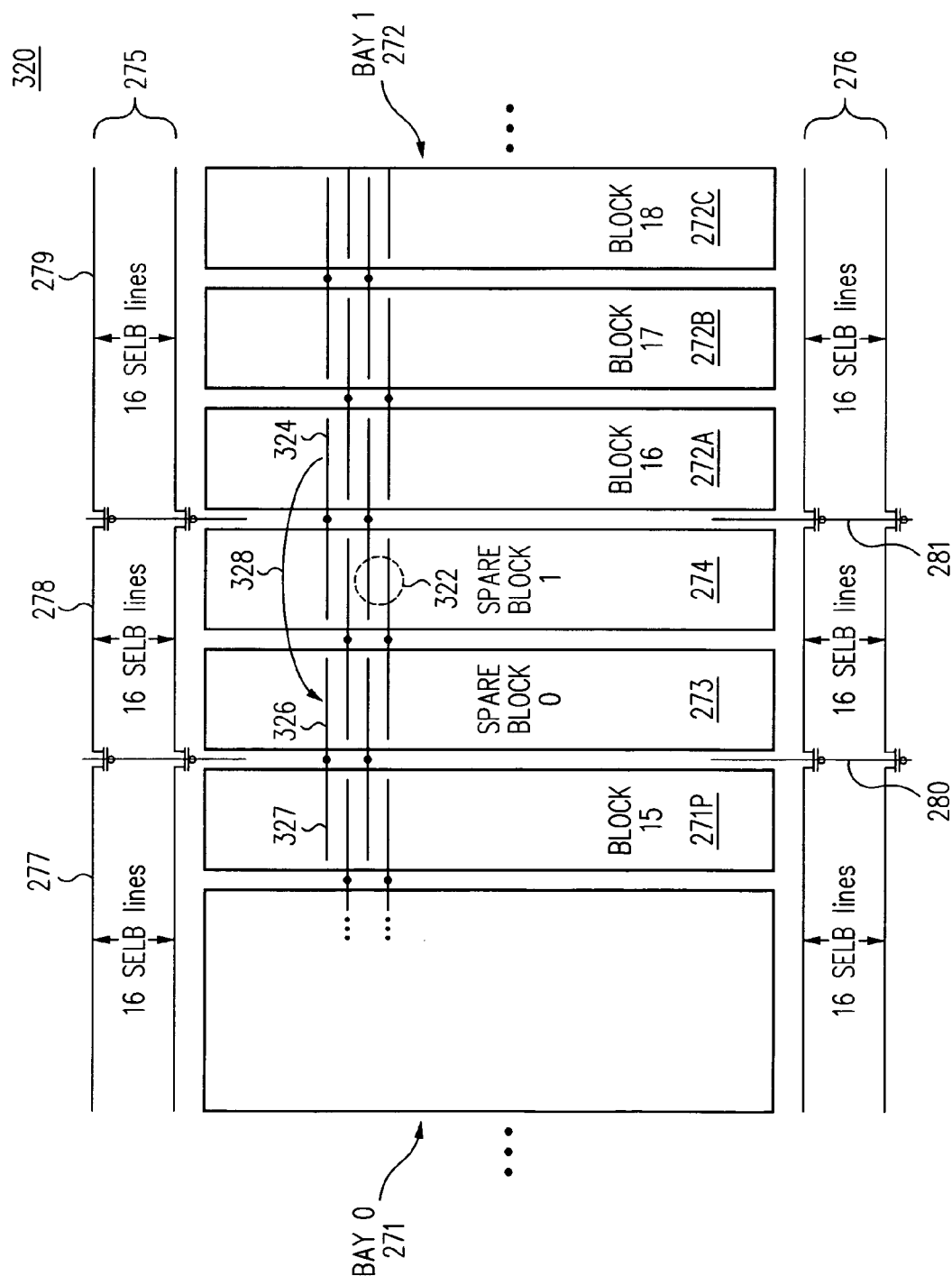
FIG. 8 is a block diagram of a memory array showing useful mapping when the defective memory block is a spare block.

Referring now to FIG. 8, an embodiment is shown of a memory array 320 in which the word lines are shared across the boundaries between the main array blocks (e.g., BAY 0, BAY 1) and the spare blocks. For example, the word line 326 in spare block 273 is shared with the last block within BAY 0 (e.g., the last of sixteen blocks), which is shown as block 271P and also shown as Block 15 (being numbered from Block 0 for the left-most block through Block 15 for the right-most block of BAY 0). More specifically, the word line 326 in block 273 is shared with word line 327 in block 271P. In other words, half of the word lines are shared between memory block 271P and memory block 273.

If a BL-WL short occurs within the spare block 274, from the above description this spare block 274 cannot be used, but half of each neighboring block also cannot be used. The word lines in the two adjacent memory blocks that are shared with word lines of the defective block are also tainted and cannot be used. For example, word line 324 in block 272A is shared with the defective spare block 274. This word line may be folded and mapped into word line 326 in the other spare block 273 (as indicated by mapping 328). Because word line 326 is not shared with the defective spare memory block 274, the word line 326 may take the place of word line 324. Similarly, all the word lines within block 272A, which are shared with spare block 274, are mapped into a corresponding word line within spare block 273, each of which word lines is shared with memory block 271P. As described below, an additional bit of redundancy information may be provided to allow a defect within the spare block itself to be mapped out of the array, as shown in this figure.

However, other embodiments are specifically contemplated in which word lines are not shared between the main array blocks and the spare blocks. In such cases, the extra bit to store the defective address may not be required.

Trim Bits and Control Logic for Block Redundancy

Figure 9:
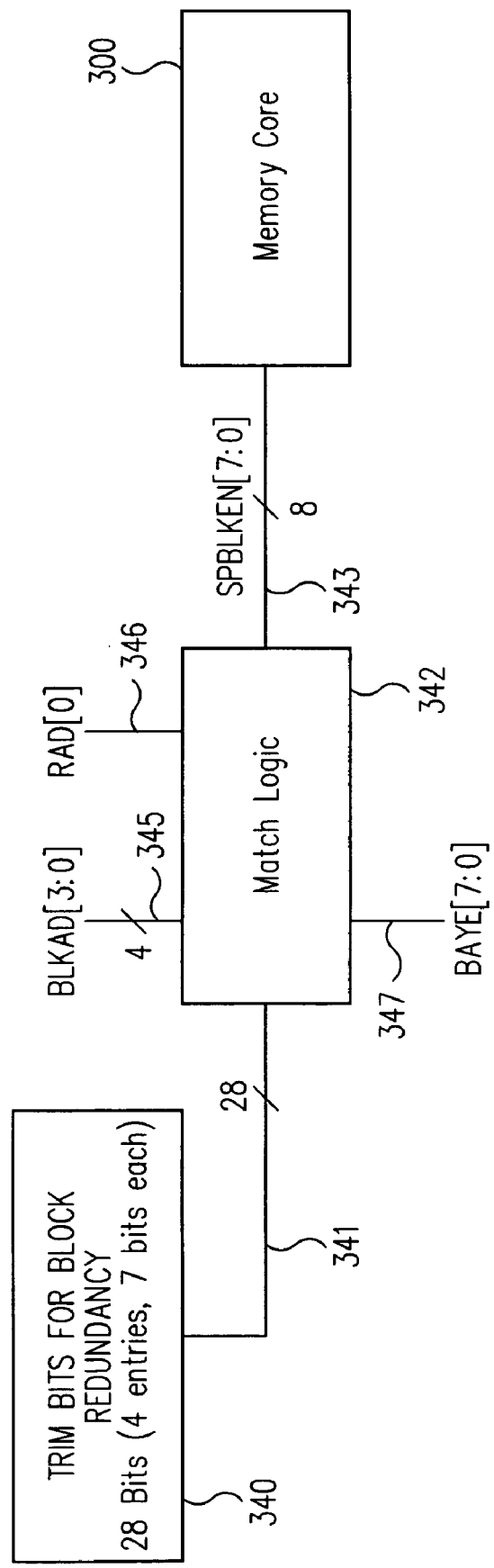
FIG. 9 is a block diagram of exemplary control circuitry for implementing block redundancy.

Using the memory array 300 shown in FIG. 7 as an exemplary embodiment, there are four possible block replacements, since each pair of spare blocks can replace a bad block in either of the adjacent bays, but not both. Referring now to FIG. 9, a block diagram is shown representing the control of such memory block replacements. A TRIM BITS 340 block is programmed to contain the addresses of the failing blocks. Since there are four possible block replacements, there are 4 entries of 7 bits each. Table 1 describes the purposes of each bit in the entry. Note that the failing address has one bit more that the actual block address (BLKADD[3:0]). This is required to ensure that a die with a BL-WL short in a spare block can be recovered, which would otherwise compromise half of Block 15/BAY 0 (if the short is in spare block 0) or Block 0/BAY 1 (if the short is in spare block 1).

TABLE 1

| Bit # | Name | Purpose |
|---|---|---|
| [6] | ENABLE | Enable bit, if 0 the entry is disabled (not used) |
| [5] | RXL_BAY | Failure in left or right bay (0 = left, 1 = right) |
| [4:0] | FAIL_BLKADD [4:0] | Address of block with BL-WL short FAIL_BLKADD[4:0] = 11111 (−1) => Short in Spare block 1 FAIL_BLKADD[4:0] = 0XYXW => Short in block with BLKADD[3:0] = XYZW FAIL_BLKADD[4:0] = 10000 (16) => Short in Spare block 0 |

Such trim bits may be implemented in any suitable programmable technology. For example, electrically programmable fuses, laser programmable fuses, non-volatile programmable memory cells such as FLASH EEPROM, passive element memory cells such as anti-fuse cells, or any other technology may be employed. The terminology here of "trim bit" is convenient to distinguish such bits of programmable memory from the memory cells in the array (both spare blocks and main array blocks), and because other such trim bits may be also used to provide calibration or other analog "trimming" functionality to an otherwise digital memory device.

Match Logic

The 28 total bits containing the four 7-bit entries are conveyed on bus 341 to the MATCH LOGIC block 342. This block also receives a 4-bit block address BLKAD[3:0] conveyed on bus 345, the least-significant word line address RAD[0] conveyed on bus 346, and an 8-bit group of individual bay enable signals BAYE[7:0] conveyed on bus 347, all of which may be generated from a control logic block (not shown) for controlling memory array operations. The MATCH LOGIC block 342 compares these signals with the trim bit entries to decide whether to deactivate the main array block that would otherwise have been enabled, and instead enable the spare blocks.

The 8 output signals (spare block enable, SPBLKEN[7:0]) indicate in which of the 8 bays normal block should be replaced with the spare one. If SPBLKEN[7:0] are all zero, no replacement is needed. The RAD[0] signal is needed to be able to activate the correct SPBLKEN signals when replacing half blocks, neighbors of the one affected by the short. In other words, as described above, if the current block address corresponds to a main array block which happens to be adjacent to a defective block, the main array block is disabled if the current row address corresponds to a word line shared with the defective block, but the main array block is not disabled (and the access allowed to proceed in the main array block) if the row address corresponds to a word line which is not shared with the defective block.

The logic to generate the SPBLKEN[7:0] signals is a little bit convoluted due to the necessity to activate the SPBLKEN for neighbor blocks as well. In the exemplary code below, the least significant bit of the block address may be compared to the least significant bit of the row address to deduce whether the word line is shared with an adjacent defective block. Referring to the seven trim bits of each of the four entries as variables ENABLE_i, RXL_BAY_i, and FAIL_BLKADD_i[4:0] (i=0,1,2,3), exemplary logic to generate the 8 bit signal SPBLKEN[7:0] may be described as:

```
For i=0,1,2,3
REPL_i=0
If FAIL_BLKADD_i=BLKADD then
    REPL_i=1
Else if 0≦FAIL_BLKADD_i+1≦15 and BLKADD[0]=RAD[0]
and FAIL_BLKADD_i+1=BLKADD then
    REPL_i=1
Else if 0≦FAIL_BLKADD_i-1≦15 and BLKADD[0]=not(RAD[0])
and FAIL_BLKADD_i-1=BLKADD then
    REPL_i=1
SPBLKEN[2i]=ENABLE_i and not(RXL_BAY) and REPL_i
SPBLKEN[2i+1]=ENABLE_i and RXL_BAY and REPL_i
```

In this code, the variable BLKADD refers to the block address for the current memory operation, and references to such multi-bit variables such as FAIL_BLKADD_i and BLKADD should be viewed as referring to all 5 bits of such variables. However, a reference such as BLKADD[0] refers to just bit zero of the current block address. Other equivalent logic functionality may be substituted to generate such spare block enable signals.

The SPENBLK[7:0] signals are conveyed on bus 343 to the memory core 300. Each respective SPENBLK[i] signal is conveyed to a respective BAY[i] of the memory array, and when such spare block enable signal is active (e.g., high), it should disable all the main array blocks in the BAY[i]. Such logic can be implemented in the row decode and/or predecode logic within every block.

Figure 10:
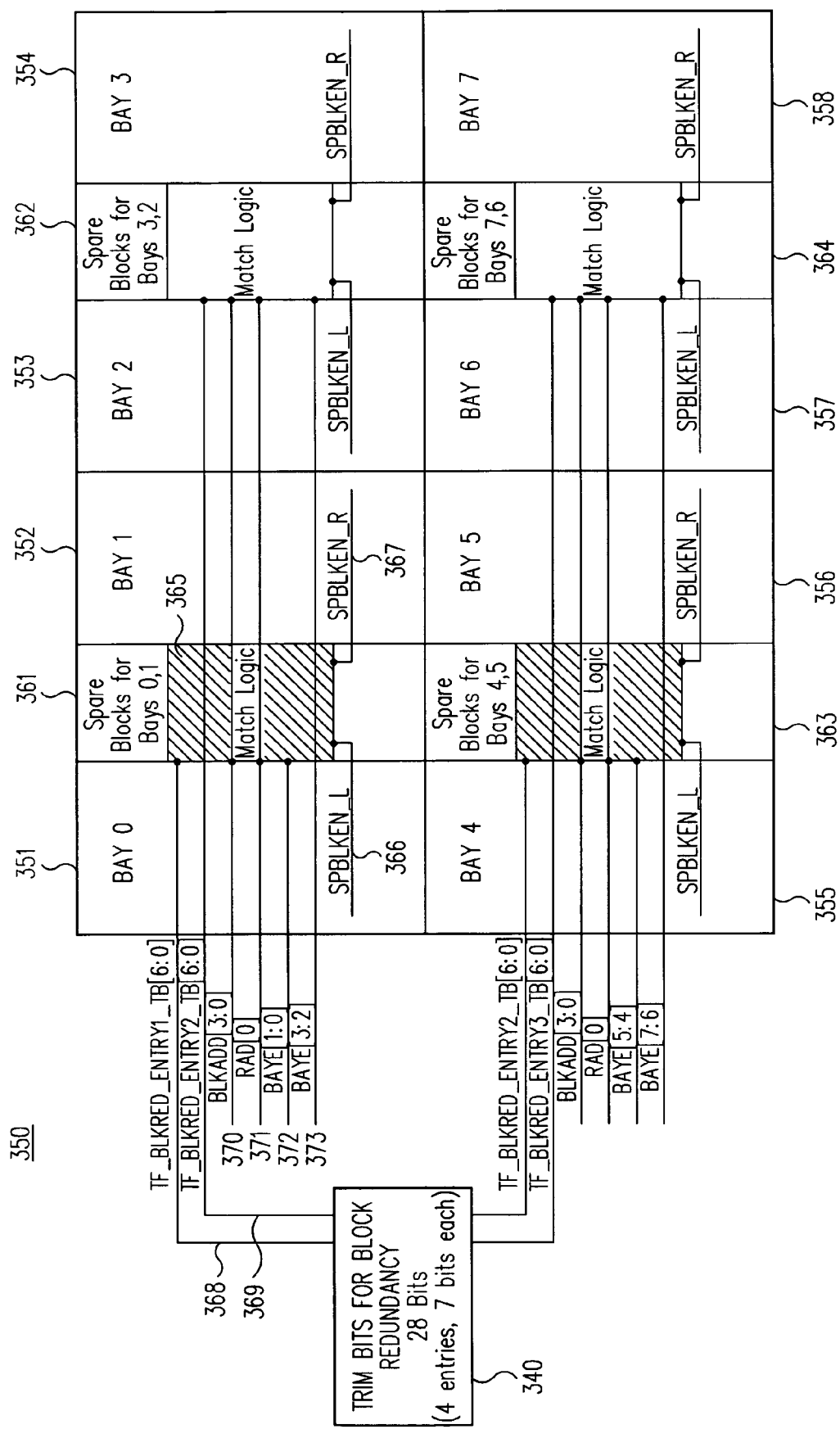
FIG. 10 is a block diagram of exemplary control circuitry for implementing block redundancy, overlaid on a memory array block diagram.

Referring now to FIG. 10, an exemplary memory array configuration 350 is shown in which the respective match logic for each respective pair of bays is located beneath the respective spare blocks for the respective pair of bays. The memory array includes eight bays, labeled 351, 352, ... 358, and four spare block areas 361, 362, 363, 364. The TRIM BIT block 340 generates four sets of 7-bit entries, one for each block replacement. Here, the 7 bit entry for SPARE BLOCK 361 (i.e., to replace a block in BAY 351 or 352) is labeled TF_BLKRED_ENTRY1 TB[6:0] and is conveyed on bus 368 to MATCH LOGIC 365. The other three entries TF_BLKRED_ENTRY2_TB[6:0], TF_BLKRED_ENTRY2_TB[6:0], and TF_BLKLRED_ENTRY3_TB[6:0], are conveyed to respective MATCH LOGIC blocks for BAY 2/BAY 3, BAY 4/BAY 5, and BAY 6/BAY 7, as shown.

The MATCH LOGIC block 365 for BAY 0/BAY 1 also receives a pair of bay enable signals BAYE[1:0]. Similarly, other pairs of bay enable signals BAYE[3:2], BAYE[5:4], and BAYE[7:6], are conveyed to respective MATCH LOGIC blocks for BAY 2/BAY3, BAY 4/BAY 5, and BAY 6/BAY 7, as shown. All four MATCH LOGIC blocks receive the 4-bit block address signal BLKADD[3:0] and the least significant row address bit RAD[0]. Each MATCH LOGIC block generates a respective left and right spare block enable signal, SPBLKEN_L and SPBLKEN_R. (As described herein, these four sets of SPBLKEN_L and SPBLKEN_R signals, one set respectively for BAY0/BAY 1, BAY 2/BAY 3, BAY 4/BAY 5, and BAY 6/BAY 7, are also described herein as the SPENBLK[7:0] signals). For example, MATCH LOGIC block 365 for BAY 0/BAY 1 generates a SPBLKEN_L signal on node 366 and a SPBLKLEN_R signal on node 367. When the SPBLKEN_L signal on node 366 is active, all main array blocks in BAY 0 are disabled. Likewise, when the SPBLKEN_R signal on node 367 is active, all main array blocks in BAY 1 are disabled. Such logic can be implemented in the row decode and/or predecode logic within every block. An exemplary circuit for accomplishing such functionality is depicted in FIG. 11, in which a BLKEN signal 381 which would otherwise enable a block is over-ridden by the appropriate left or fight spare block enable signal, shown here as SPBLKEN_L/R 382, to generate the actual block enable signal 383.

Spare Blocks

Referring now to FIG. 12, a representative spare block section is shown, such as spare block area 361 (from FIG. 10) which includes two spare blocks 401 and 402. A group of SELB lines 410 at the top of the spare block 401, 402 is coupled to either the SELB lines in the BAY 0 to the left or in the BAY 1 to the right by way of coupling circuits, such as PMOS switches 411. Likewise, a group of SELB lines 412 at the bottom of the spare block 401, 402 is similarly coupled to the SELB lines in BAY 0 or BAY 1. The SPBLKEN_L and SPBLKEN_R signals are received on respective nodes 366 and 367. When either signal is active, the spare block area 361 is enabled, and the SPEN signal on node 403 is active to enable the spare global column decoder 413 at the top of the spare blocks and the spare global column decoder 414 at the bottom of the spare blocks.

Depending upon the least significant row address BLDADD[0], either the spare block 401 is enabled (by way of a BLOCK 0 ENABLE signal on node 415), or the spare block 402 is enabled (by way of a BLOCK 1 ENABLE signal on node 416). A pair of high voltage level shifters 408, 409 generate a pair of high voltage enable signals XSPBLKEN_HV_R and XSPBLKEN_HV_L on nodes 406 and 407 to control the PMOS switches 411 which couple the SELB lines 410, 412 to the left or right bay. As mentioned above, the spare global column decoders 413, 414 may include high voltage transfer gates (not shown) to couple the global column decoder (CSG) lines to the ones coming from the left bay or the right bay, and may also be controlled by the left and right spare block enable level shifters 408, 409. Alternatively, the spare global column decoders 413, 414 may be independent decoders for generating the CSG lines within the particular spare block area, and which spare block CSG lines need not be coupled to the CSG lines in either the left bay or the right bay.

As described below, the spare blocks in certain three-dimensional embodiments do not include a corresponding sense amplifier or, for some embodiments, a page sub-register, the spare block control circuits shown here may be implemented using the layout area otherwise allocated for the sense amplifier and page sub-register.

Figure 13:
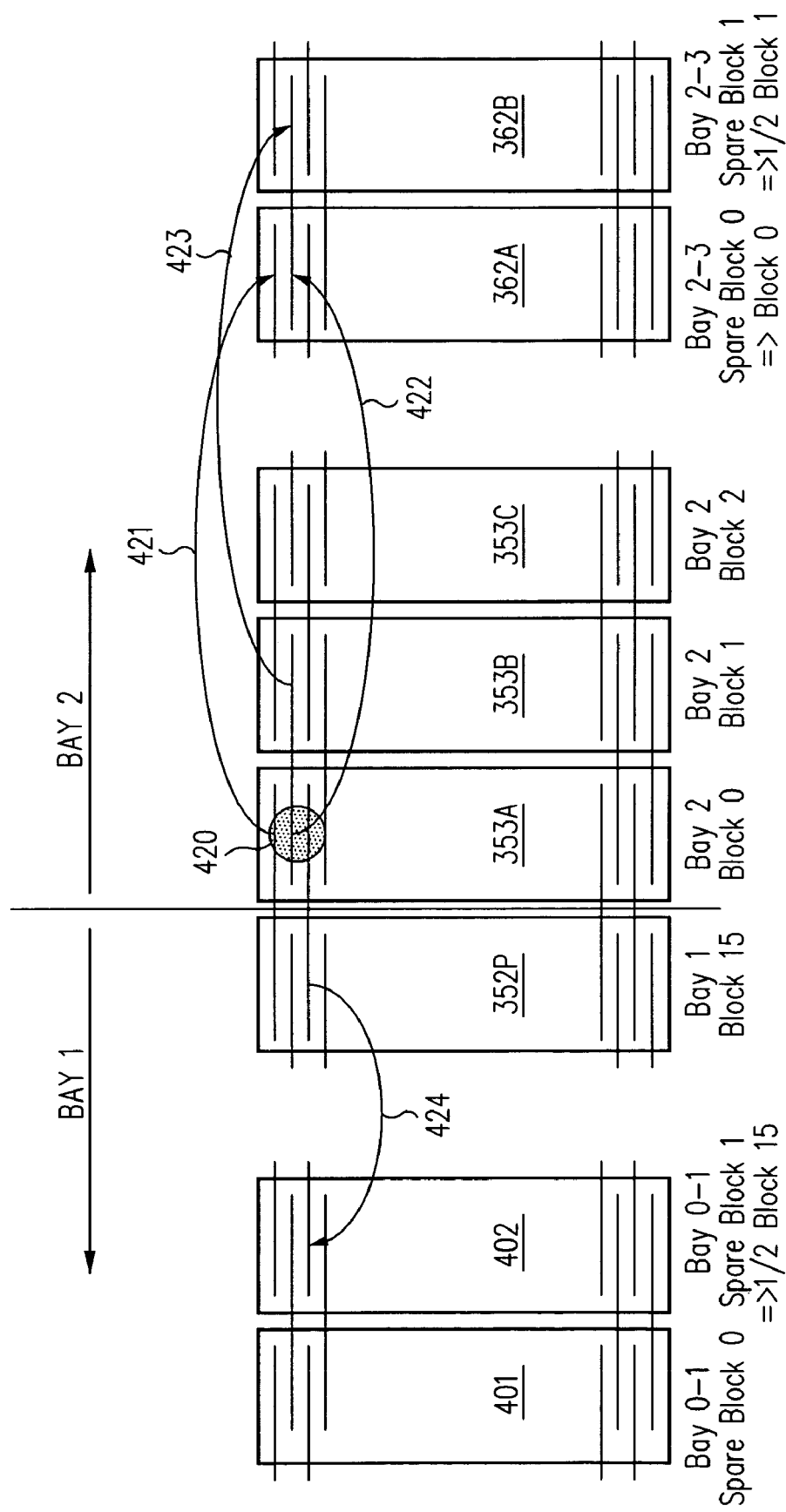
FIG. 13 is a block diagram of an exemplary memory array showing useful mapping when the defective memory block is adjacent to a boundary of a memory bay.

Referring now to FIG. 13, an embodiment of a memory array is depicted in which word lines are shared across the boundary between two bays. In other words, half of the word lines in the last memory block of one bay are shared with the first memory block in the adjacent bay. Block 15/Bay 1 (also labeled block 352P) is the last of sixteen memory blocks in BAY 1 (also described herein as bay 352). The next memory block to the right is Block 0/Bay 2 (also labeled block 353A) is the first of sixteen memory blocks in BAY 2 (also described herein as bay 353). The two spare blocks 401, 402 for BAY 0 are shown, as are the two spare blocks 362A and 362B for BAY 2.

If a BL-WL short 420 occurs in one of the memory blocks at the boundary between bays, the block may still be replaced, but two entries in the used in the TRIM BIT block because portions of both pairs of spare memory blocks (i.e., portions of all four spare blocks) must be used. All the word lines in the defective block 353A are mapped to the corresponding (e.g., odd or even) spare block 362A for BAY 2/BAY 3, depicted here as mappings 421 and 422. The word lines in the adjacent block 353B which are shared with the defective block 353A are mapped to the other spare block 362B. However, the word lines in the other adjacent memory block 352P which are shared with word lines in the defective block 353A cannot be mapped into the spare block 362B because these blocks 352P and 362B do not share the same SELB lines and the same sense amplifiers. Instead, half of the word lines in adjacent block 352P are mapped to spare block 402 for BAY 0/BAY 1, as shown by mapping 424. While this block replacement mapping affords the ability to replace a defective block that occurs on a boundary between bays, it consumes all spare block resources for four different bays (e.g., BAY 0, BAY 1, BAY 2, and BAY 3; or BAY 4, BAY 5, BAY 6, and BAY 7), and so only one defective block can be replaced in all four bays if the defective block is one of the four blocks adjacent to a bay boundary (e.g., BAY 1/BLOCK 15; BAY 2/BLOCK 0; BAY 5/BLOCK 15; or BAY 6/BLOCK 0). Alternatively, in other embodiments, the word lines are not shared across the boundary between bays, and the block replacement constraints within each pair of bays are independent of other pairs of bays. Thus, a defect in BAY 1/BLOCK 15 would not consume all the spare block resources of the entire stripe.

Figure 14:
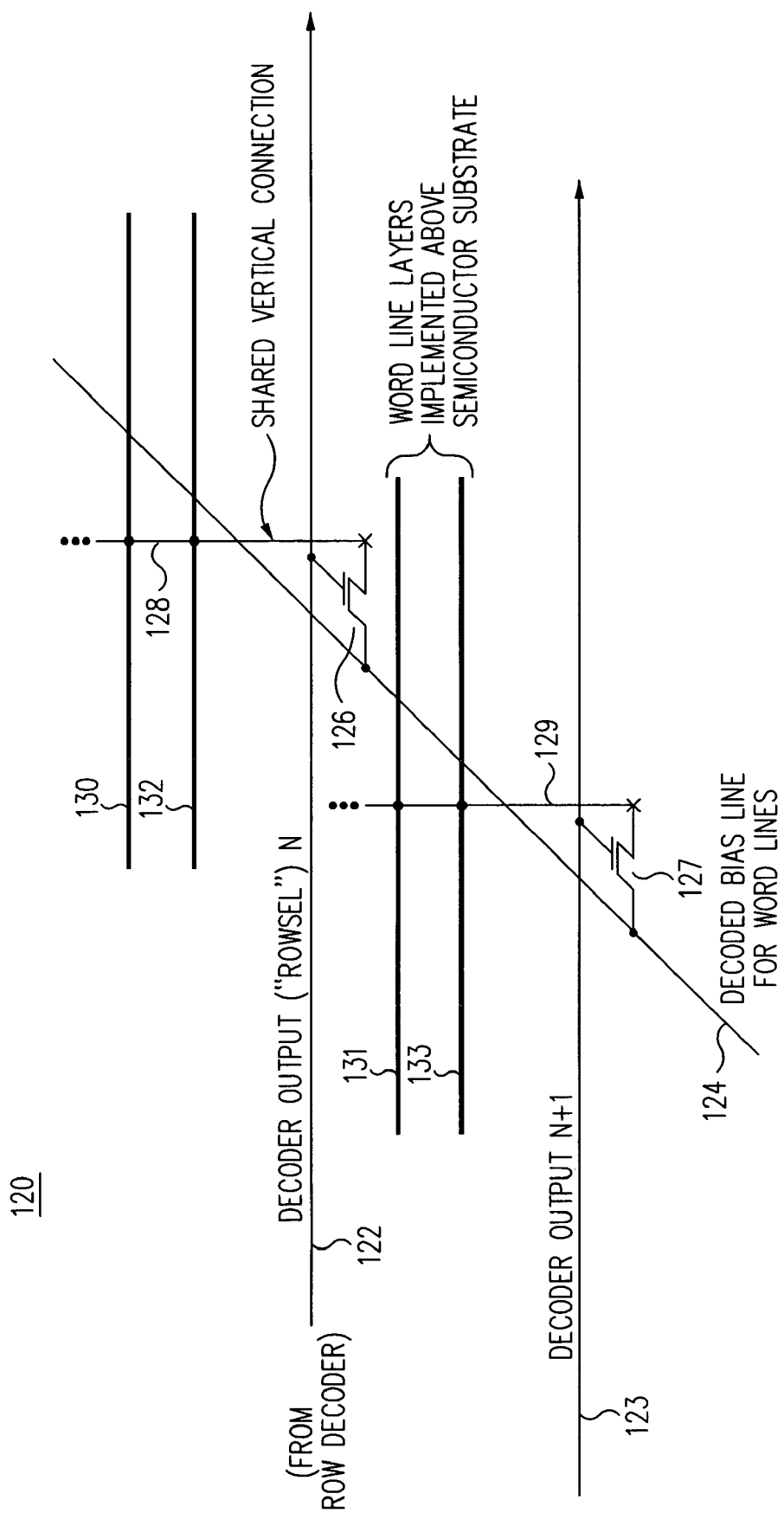
FIG. 14 is a three-dimensional representation of a useful memory array configuration.

Referring now to FIG. 14, a schematic diagram is shown representing a three-dimensional memory array having a segmented word line arrangement in accordance with certain embodiments of the present invention. Each word line is formed by one or more word line segments on at least one, and advantageously more than one, word line layer of the memory array. For example, a first word line is formed by word line segment 130 disposed on one word line layer of the memory array and by word line segment 132 disposed on another word line layer. The word line segments 130, 132 are connected by a vertical connection 128 to form the first word line. The vertical connection 128 also provides a connection path to a driver device 126 (or alternatively a driver circuit) disposed in another layer (e.g., within the semiconductor substrate). A decoded output 122 from a row decoder (not shown) traverses substantially parallel to the word line segments 130, 132 and when selected, couples the word line segments 130, 132 through device 126 to a decoded bias line 124 which traverses substantially perpendicular to the word line segments.

Also shown are word line segments 131, 133 which are connected by a vertical connection 129 to form a second word line and to provide a connection path to driver device 127. Another decoded output 123 from the row decoder couples, when selected, these word line segments 131, 133 through device 127 to the decoded bias line 124. Other details of similar segmented word line structures are described in "Word Line Arrangement Having Multi-Layer Word Line Segments for Three-Dimensional Memory Array" by Roy E. Scheuerlein, U.S. application Ser. No. 10/403,844 filed Mar. 31, 2003, now published as U.S. Patent Application Publication No. 2004-0190360 A1, which application is hereby incorporated by reference in its entirety.

Figure 15:
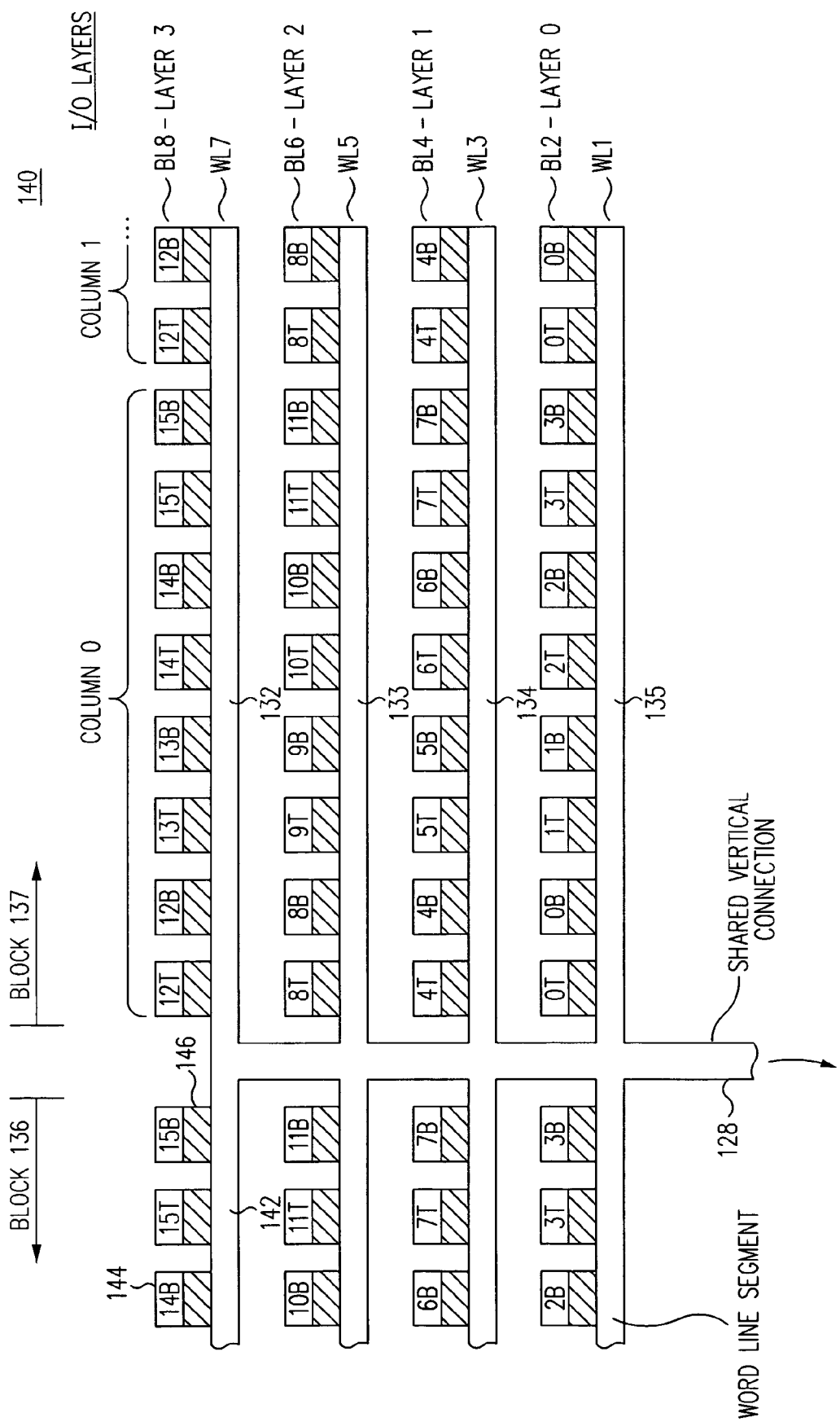
FIG. 15 is a cross-sectional diagram of an embodiment of the array depicted in FIG. 14.

FIG. 15 is a cross-section view of a three-dimensional memory array having word line layers each corresponding to a respective bit line layer. Four word line layers are depicted, labeled WL1, WL3, WL5, and WL7. The word line segments on layer WL1 correspond to bit lines on bit line layer BL2. Similarly, the word line segments on layers WL3, WL5, and WL7 correspond respectively to bit lines on bit line layers BL4, BL6, and BL8.

Word line segments 132, 133, 134, and 135 within a BLOCK 137 are connected by vertical connection 128 to form a logical word line. A plurality of bit lines 144 is shown on bit line layer BL8. A plurality of memory cells 146 is formed between each bit line 144 and the word line segment 142. Such memory cells are preferably passive element memory cells incorporating an antifuse structure, although other memory cell technologies may also be used.

The word line segment 132 falls within a memory block 137, while word line segment 142 falls within an adjacent block 136. These two words lines segments are vertically connected to other word line segments to both form the word line in each block, and to share the word lines between these blocks 136 and 137.

The four bit line layers BL2, BL4, BL6, and BL8 are also labeled as LAYER 0, LAYER 1, LAYER 2, and LAYER 3, respectively, since the word line layers are connected together and fed from below. There are a variety of ways that column decoding may be accomplished in such a memory array structure. For example, each column address might correspond to a single bit line on a single bit line layer. However, it is exceedingly difficult to layout such a column decoder with the necessary pitch to decode such individual bit lines. As a result, it is useful to select a group of bit lines for each column address, and couple each selected bit line to a respective sense line (e.g., SELB line) which is coupled to a respective sense amplifier.

In some embodiments of the present invention, when a logical column is selected in a selected memory block, a group of 16 bit lines are selected (e.g., four bit lines from each of four layers) and respectively coupled to a corresponding SELB line. One such layer selection is depicted in FIG. 15. Since the bit lines for this exemplary embodiment are interleaved, half of the bit lines (e.g., even-numbered bit lines) exit to the top of the memory block, and the other half of the bit lines (e.g., odd-numbered bit lines) exit to the bottom of the memory block. Such bit lines could also be interleaved in pairs rather than individually. In other embodiments, the bit lines need not be interleaved at all. In such a case, all the bit lines would typically exit the memory block to the top or bottom, but not both.

When column 0 is selected in block 137, the first four bit lines on LAYER 0 which exit to the top of the memory block (labeled 0T, 1T, 2T, 3T) are coupled to SELB[3:0], the first four bit lines on LAYER 1 which exit to the top of the memory block are coupled to SELB[7:4], the first four bit lines on LAYER 2 which exit to the top of the memory block are coupled to SELB[11:8], and the first four bit lines on LAYER 3 which exit to the top of the memory block are coupled to SELB [15:12]. (In the figure, each bit line 144 is labeled to indicate this exemplary decoding and layer selection using, for example, "0T" to represent a bit line coupled to SELB[0] on the top of the memory block, "2B" to represent a bit line coupled to SELB[2] on the bottom of the memory block, etc.) Similarly, when column 1 is selected in block 137, the next four bit lines on LAYER 0 which exit to the top of the memory block are coupled to SELB[3:0], the next four bit lines on LAYER 1 which exit to the top of the memory block are coupled to SELB[7:4], the next four bit lines on LAYER 2 which exit to the top of the memory block are coupled to SELB[11:8], and the next four bit lines on LAYER 3 which exit to the top of the memory block are coupled to SELB[15:12]. This may be accomplished by using a 16-headed column decoder as described in detail in "Apparatus and Method for Hierarchical Decoding of Dense Memory Arrays Using Multiple Levels of Multiple-Headed Decoders" by Luca G. Fasoli, et al., U.S. application Ser. No. 11/026,470, filed Dec. 30, 2004, the disclosure of which is hereby incorporated by reference. Such a circuit may be viewed as a single decoder node driving four layer selector circuits. Each respective layer selector circuit couples four adjacent bit lines (i.e., of those bit lines exiting the memory block to the top or bottom of the block) on a respective bit line layer to a group of SELB lines associated with the respective layer selector circuit.

Additional useful circuit and layout arrangements for driving each word line (e.g., by way of a respective vertical connection, such as vertical connection 128) are described in "Transistor Layout Configuration for Tight-Pitched Memory Array Lines" by Christopher J. Petti, et al., U.S. application Ser. No. 11/095,905, filed on even date herewith, the disclosure of which is hereby incorporated by reference.

Figure 16:
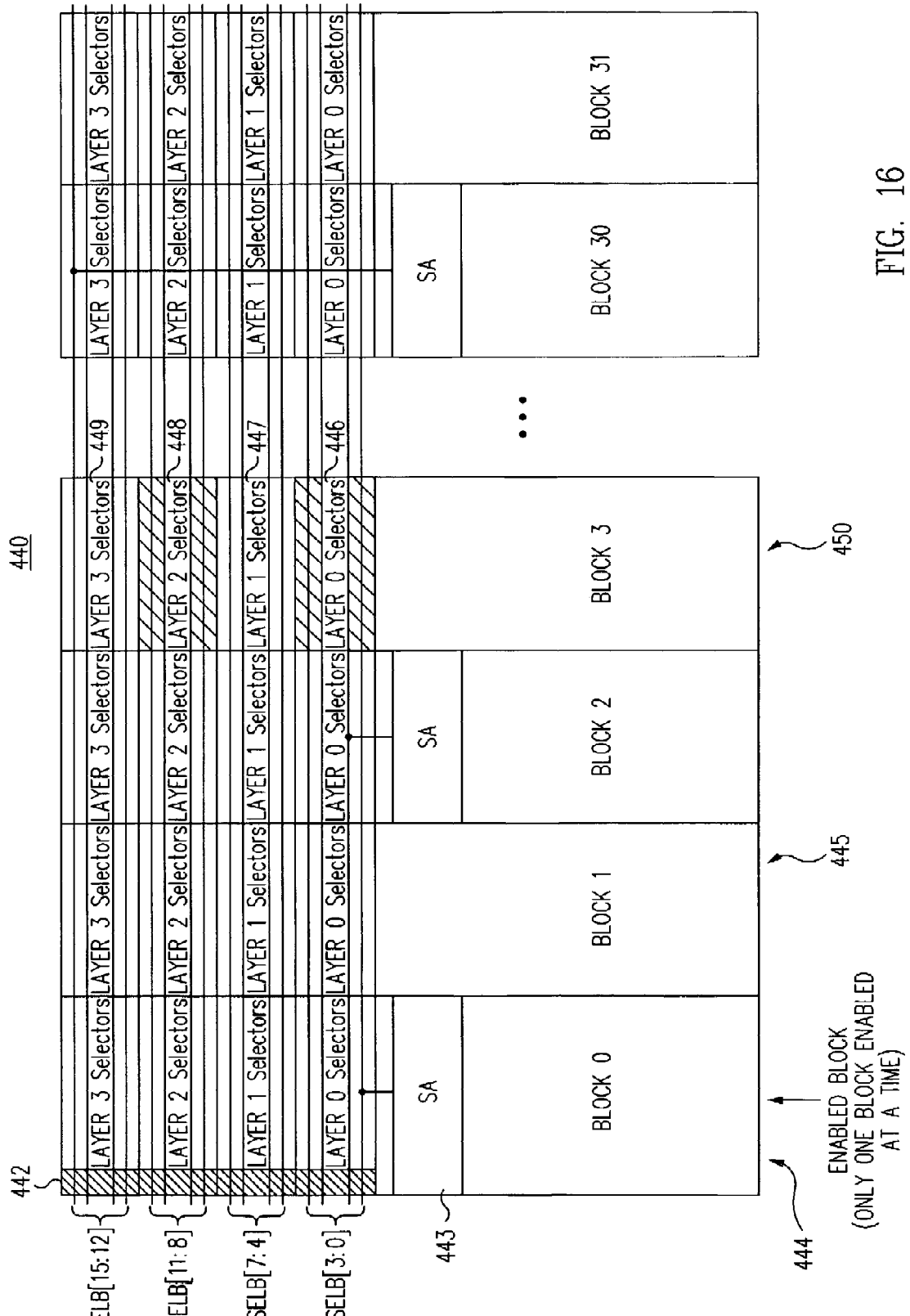
FIG. 16 is a block diagram of an exemplary array showing a particular layer selection configuration.

Referring now to FIG. 16, a block diagram is depicted showing a memory array 440 including 32 memory blocks and 16 SELB lines in 4 groups of four such SELB lines. No spare blocks are provided, and hence no block redundancy is supported. 16 of the memory blocks include a sense amplifier, each respectively connected to one of the SELB lines. For example memory block 444 includes a sense amplifier 443 which is coupled to SELB[0], while memory block 445 includes no sense amplifier. Each memory block also includes four layer selector circuits, such as Layer 0 selector 446, Layer 1 selector 447, Layer 2 selector 448, and Layer 3 selector 449, all associated with memory block 450. The four layer selectors associated with each memory block are identical across all the depicted memory blocks.

Referring now to block 444, if the left most column decoder line is selected, a group of four layer selectors 442 are simultaneously enabled, and four bit lines from each of four memory layers are respectively coupled to a respective group of four of the 16 SELB lines. Thus, a respective bit line is coupled to each of the 16 SELB lines, and each is sensed by a corresponding sense amplifier such as sense amplifier 443.

In a memory architecture as shown in figures 14 and 15, it may be desirable to implement only a portion of the memory layers. For example, although four such memory layers have been described thus far, and column selection circuitry described to couple a bit line to each of 16 SELB lines during a memory operation, it may be desirable to implement a partial memory array which includes only layer 0 and layer 1. This could be accomplished by omitting the masks and processing steps associated with layer 2 and layer 3, and proceeding directly to processing for layers (e.g., metal layers) above the memory layers, as the word line and bit line masks within the memory block itself for each of the four memory planes are identical, and the memory array may be fabricated with fewer memory planes actually implemented. However, referring again to figure 16, if there are no bit lines implemented on Layer 2 or on Layer 3, no bit lines will ever be coupled to half of the SIELB lines, namely SELB[15:8] which are coupled to the Layer 2 and Layer 4 Selector Circuits. While it is conceptually possible to alter the decoding so as to ignore half of these SELB lines (and the sense amplifier circuits connected thereto), in practice this may be much more difficult than other decode options.

Figure 17:
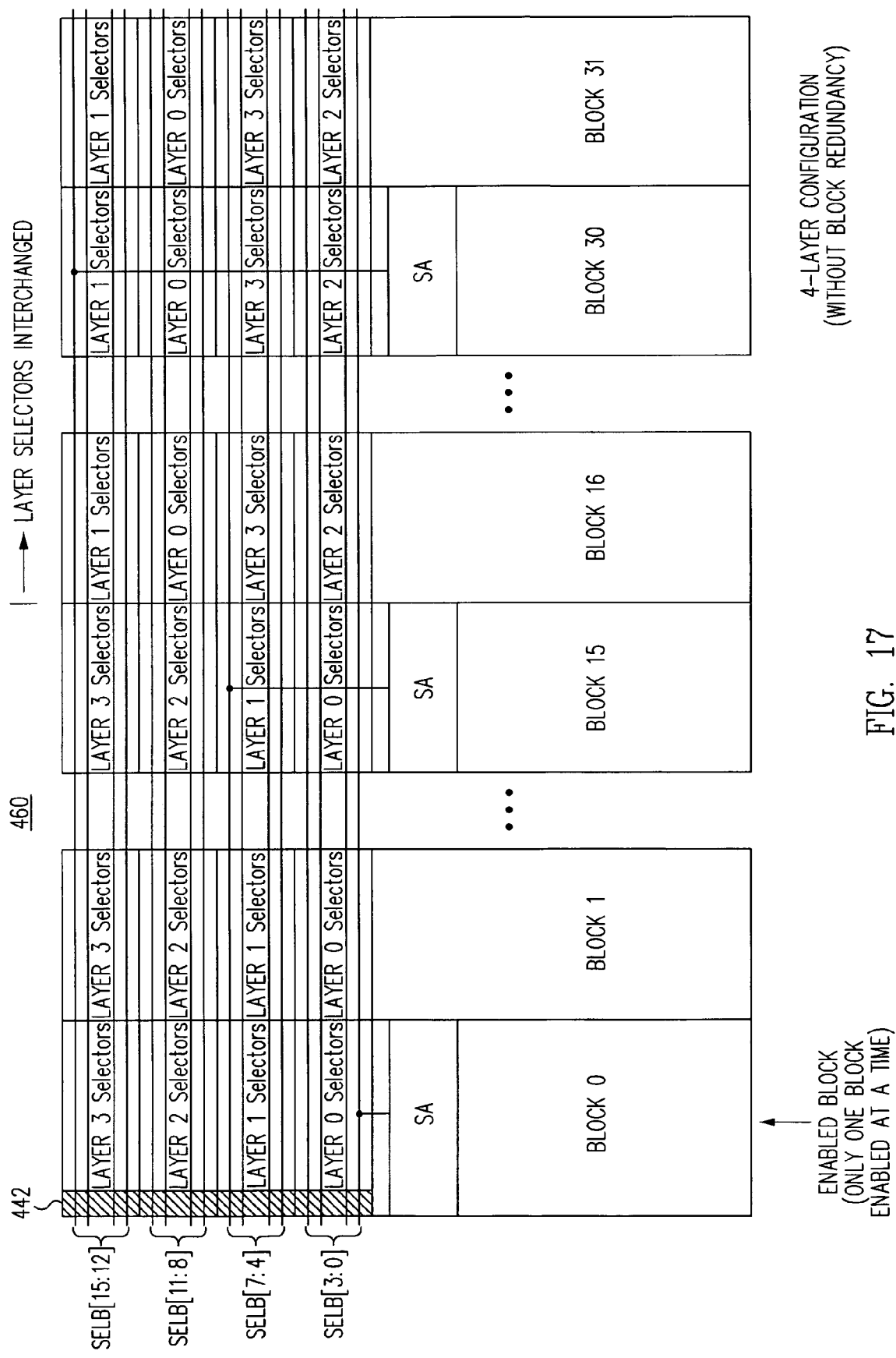
FIG. 17 is a block diagram of an exemplary array showing a particular layer selection configuration.
Figure 18:
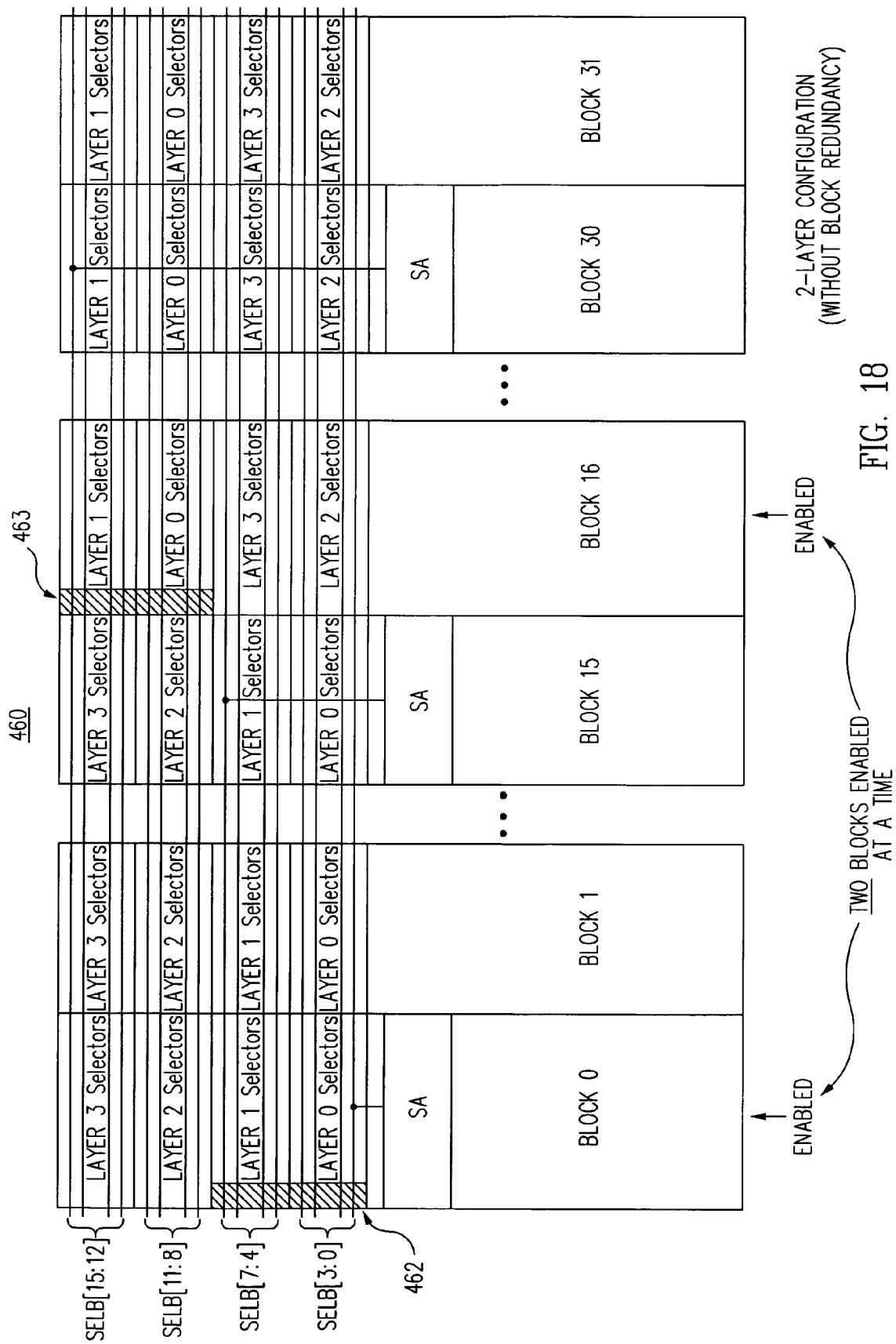
FIG. 18 is a block diagram of an exemplary array showing a particular layer selection configuration.

One possible technique is shown in FIG. 17, in which they the layer selector circuits for half of the memory blocks are interchanged. Block 0 through Block 15 include a layer selector circuits as before, while Block 16 through Block 31 include Layer 0 and Layer 1 selector circuits interchanged for Layer 2 and Layer 3 selector circuits. Such layer selector interchanging may be accomplished, for some embodiments, by merely swapping vertical connections (i.e., "zias") from the respective bit lines to the transistor source/drain regions within the 16-headed colunm decoders. If all four memory layers are implemented, only one memory block is enabled at a given time and all 16 SELB lines are provided data irrespective of the block and column address, although the decode mapping varies depending upon which block is enabled. For example, the SELB[0] line corresponds to a bit line on Layer 0 for Block 0 through Block 15, while the SELB[0] line corresponds to a bit line on Layer 2 for Block 16 through Block 31. Referring now to FIG. 18, the same memory array configuration 460 is shown, this time corresponding to an embodiment in which only the first two memory layers are actually implemented. During a memory operation a respective bit line is coupled to each of the 16 SELB lines by enabling two different memory blocks, one chosen from Block 0 through Block 15, and of the other chosen from Block 16 through Block 31. (Another trim bit can be used to indicate whether the device should decode in accordance with the 4-layer or 2-layer assumptions.) In memory block 0, a group of two layer selectors 462 are simultaneously enabled, and four bit lines from each of Layer 0 and Layer 1 are respectively coupled to SELB[3:0] and SIELB[7:4]. In memory block 16, for the same column address, another group of two layer selectors 463 are also simultaneously enabled, and a different group of four bit lines from each of Layer 0 and Layer 1 are respectively coupled to SELB[11:8] and SELB[15:12]. Thus, a 2-layer or 4-layer compatibility may be achieved without requiring any changes to the read/write path. Instead, the block enable decoding is altered to simultaneously enable two separate blocks (associated with the same SELB lines) for the 2-layer option, while only enabling one block for the 4-layer option. Of course, in a larger memory array, additional memory blocks may also be enabled if additional independent sets of SELB lines and sense amplifiers are provided.

Figure 19B:
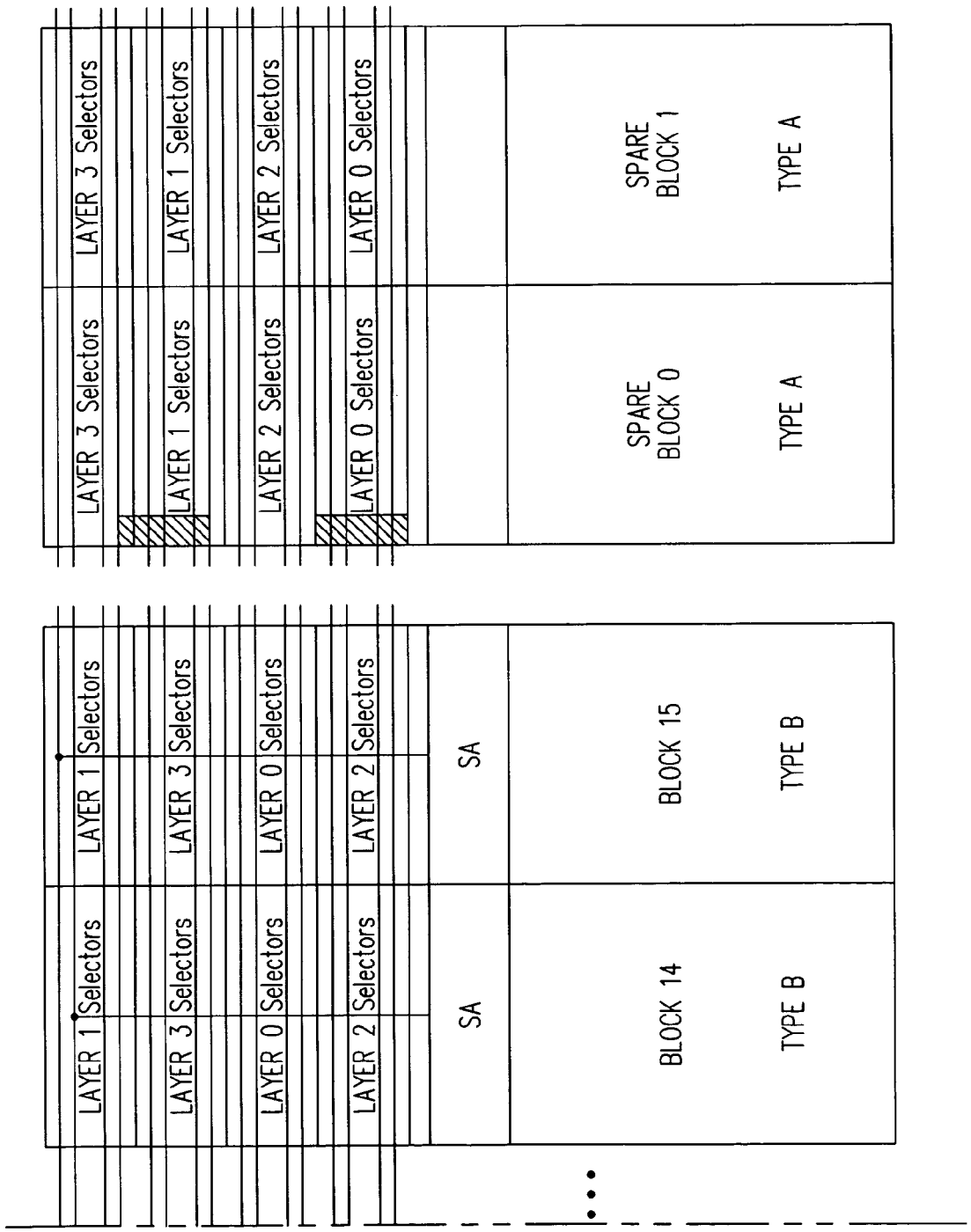

If block redundancy is also desired, spare memory blocks may be provided as described above. Referring now to FIG. 19, a memory array 480 is depicted which includes 16 memory blocks, each with a sense amplifier, and two spare blocks with no sense amplifier. The layer selector circuits are interchanged for blocks 8-15 compared to blocks 0-7. Relative to increasing SELB line numbers, the layer selector circuits are arranged in an order of Layer 0/Layer 2/Layer 1/Layer 3 for each of memory blocks 0 through 7, and these blocks may be termed TYPE A blocks for this layer mapping. (Recall that these blocks may also be alternating odd and even memory blocks based upon the sharing of word lines between adjacent blocks.) The layer selector circuits are arranged in an order of Layer 2/Layer 0/Layer 3/Layer 1 for each of memory blocks 7 through 15, and these blocks may be termed TYPE B blocks for this layer mapping. In a 4-layer embodiment, only one block is enabled, while in a 2-layer embodiment (as depicted in the figure), two blocks are simultaneously enabled to couple a respective bit line to each SELB line during a memory operation.

Both spare blocks are shown as TYPE A memory blocks (although, as described above, one may be odd and the other even). This implies that a TYPE A block may be replaced so long as both neighboring blocks are also TYPE A blocks. In other words, Blocks 0-6 may be replaced, but not blocks 7-15. If both spare blocks were TYPE B blocks, then only blocks 9-15 could be replaced. This restriction applies only to a 2-layer embodiment. In a 4-layer embodiment, any memory block may be replaced, although the layer mapping may be different in a spare block compared to the defective main array block (e.g., spare TYPE A block replacing a main array TYPE B block).

Figure 20A:
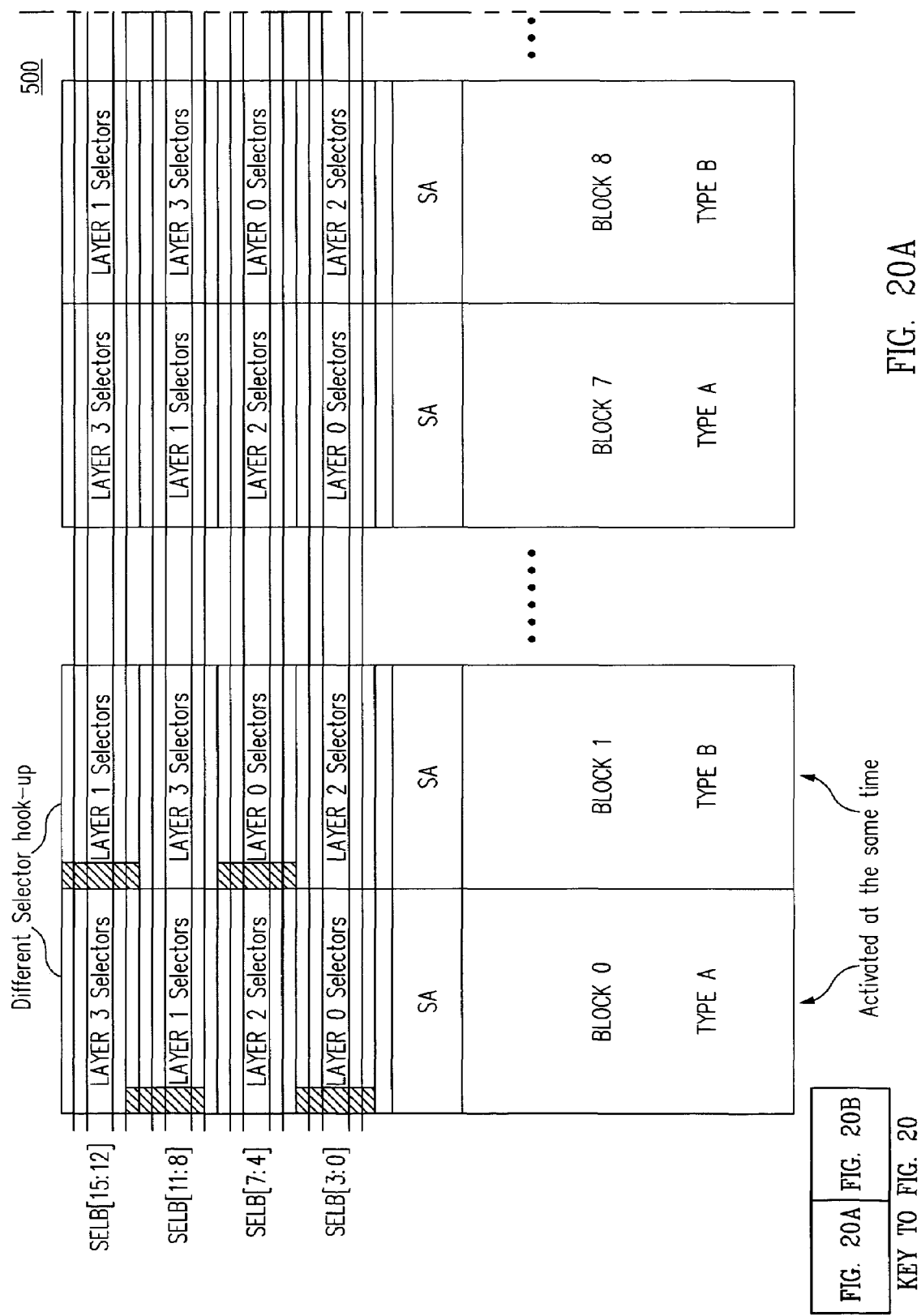
FIG. 20A and FIG. 20B, is a block diagram of an exemplary array showing a particular layer selection configuration for a partial-layer aompatible device.
Figure 20B:
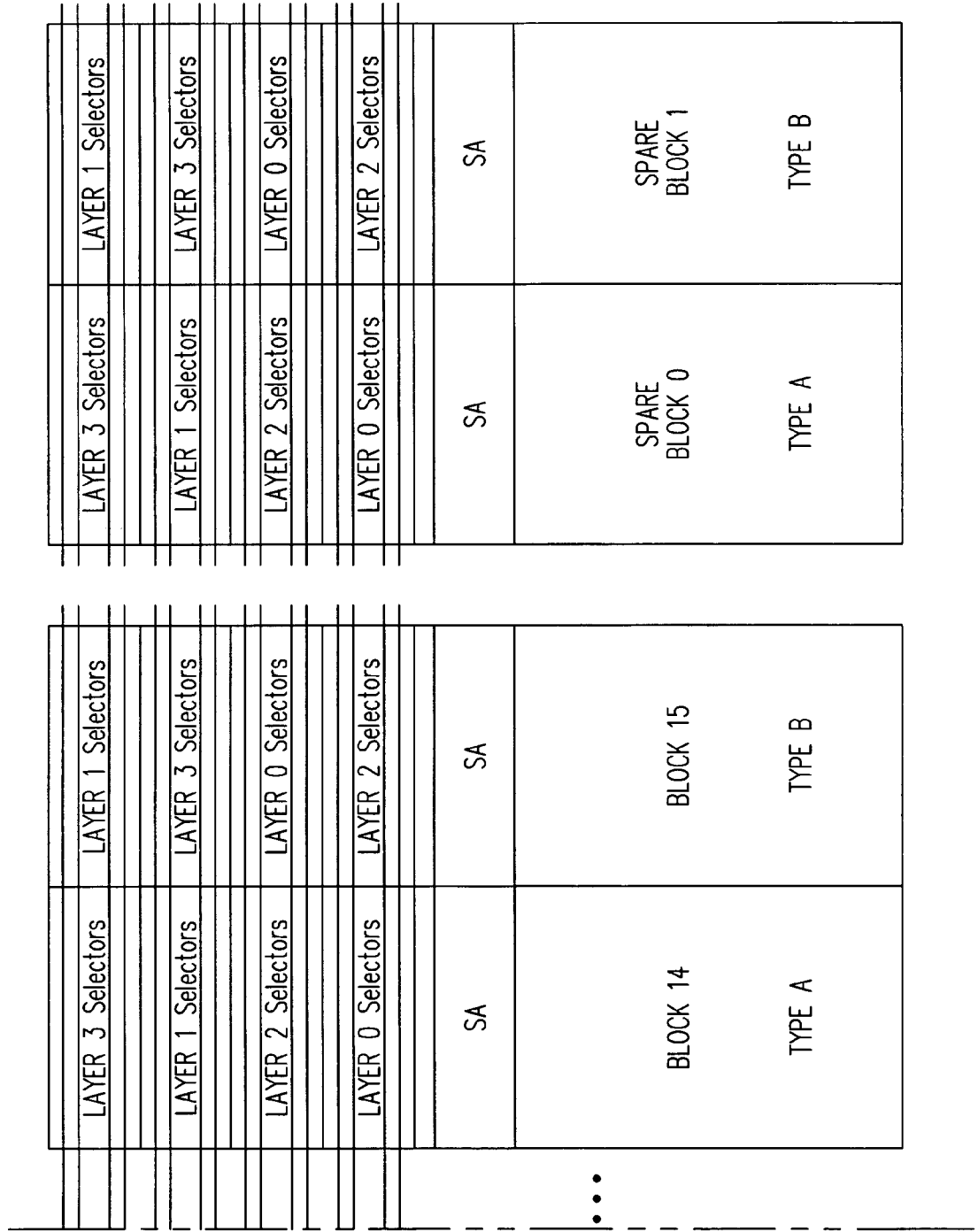

Another configuration is shown in FIG. 20 in which a memory array 500 includes alternating TYPE A and TYPE B memory blocks and further includes a spare TYPE A memory block and spare TYPE B memory block. In a 4-layer embodiment, only one memory block is enabled, and in a 2-layer embodiment a pair of blocks are simultaneously enabled, as before. But here, the pair of simultaneously enabled memory blocks are adjacent blocks, as shown. Moreover, any block may now be replaced, so long as any odd/even personalization of memory blocks is consistent with the TYPE A and TYPE B configuration. For example, if Block 0 is an even memory block and also a TYPE A memory block, then spare block 0 should also be both an even memory block and a TYPE A memory block. Similarly, if Block 1 is an odd memory block and also a TYPE B memory block, then spare block 1 should also be both an odd memory block and a TYPE B memory block. As a result, any TYPE A (even) memory block has TYPE B (odd) neighbors, and can be replaced by the TYPE A (even) spare block 0, with half of each neighboring TYPE B (odd) memory block mapped into the TYPE B (odd) spare block 1. Likewise, any TYPE B (odd) memory block has TYPE A (even) neighbors, and can be replaced by the TYPE B (odd) spare block 1, with half of each neighboring TYPE A (even) memory block mapped into the TYPE A (even) spare block 0.

In a 4-layer device (i.e., all layer selector circuits actually coupled to implemented memory layers), the mapping described above is equally valid for this A/B layer selector arrangement. The mapping is also identical for a 2-layer device, however, the spare block enabling (and resultant disabling of the otherwise addressed main array block) is somewhat more complicated as two different blocks are simultaneously enabled. For a given memory operation: (1) two main array blocks may be enabled; (2) one main array block and one spare block may be enabled (with the second main array block disabled); or (3) both spare blocks may be enabled (and both main array blocks disabled).

The next 6 figures provide examples of which blocks are enabled for each of several different situations in which a pair of blocks in the main array would otherwise be enabled but for the presence of a BL-WL short or other defect which causes one of the blocks (or a nearby block) to be marked as defective. These figures describe only to a 2-layer embodiment. In a 4-layer embodiment, only a single memory block is enabled at a time.

Figure 21:
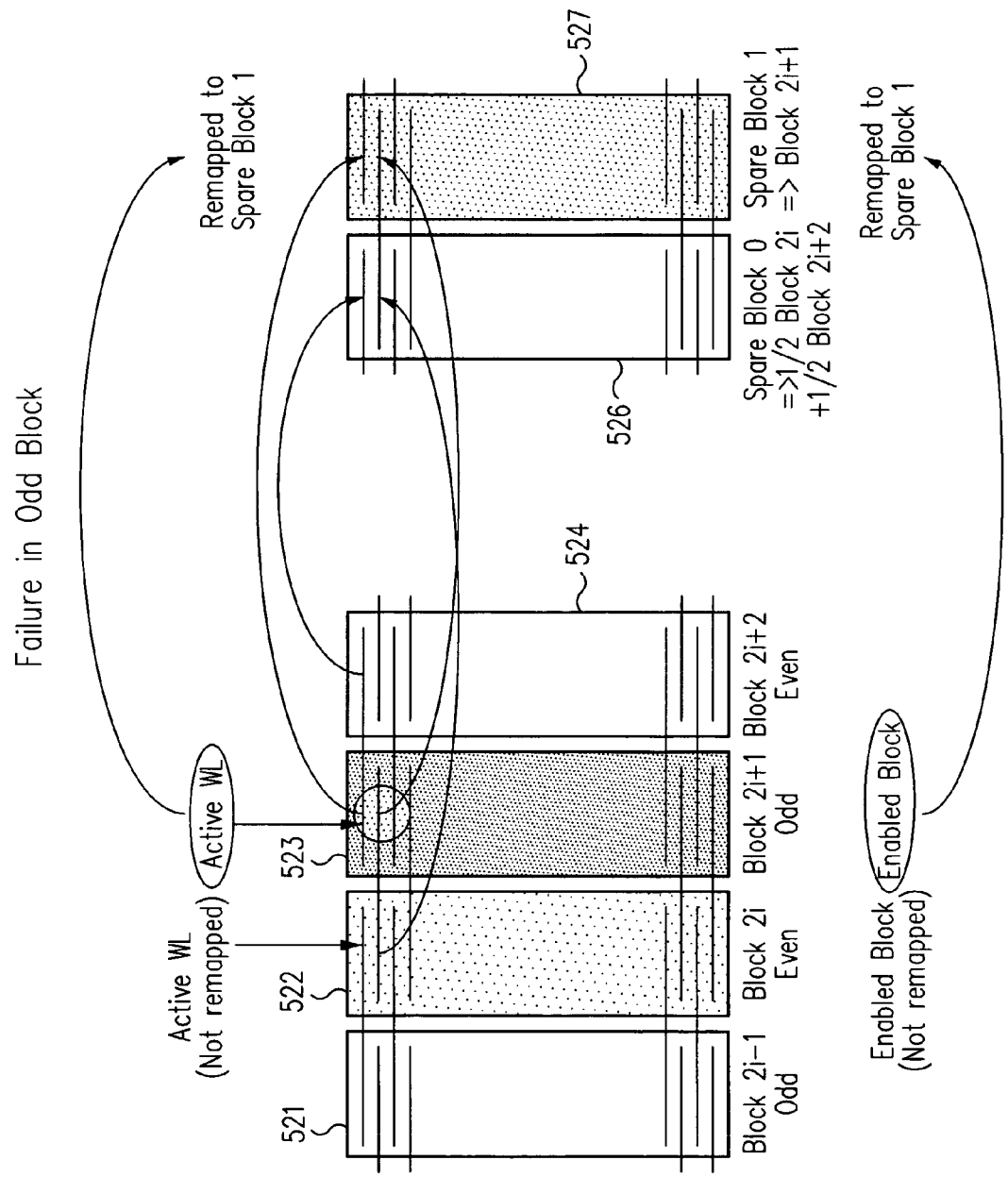
FIG. 21 is a block diagram of a partial-layer memory array showing an exemplary mapping and enabling of memory blocks when a particular memory block is defective.

Referring now to FIG. 21, a portion of an array is represented having odd blocks 521 and 523 and even blocks 522 and 524, and further having even spare block 526 and odd spare block 527. Assume even blocks are TYPE A blocks and odd blocks are TYPE B blocks, although this is arbitrary. A short is depicted in odd block 523 which renders this block defective. As described above, the defective odd block 523 is mapped to odd spare block 527, while word lines in the adjacent even block 522 which are shared with the defective block, and word lines within the adjacent even block 524 which are shared with the defective block, are both mapped to even spare block 526, as depicted in the figure.

Blocks 522 and 523 would otherwise be enabled in the main array but for the block replacement (i.e., the selected or active word line falls within these blocks). The active (i.e., selected) word line for both block 522 and 523 is shown. The defective block 523 is always disabled and remapped to the spare block 527, but the block 522 is enabled if the active word line is not shared with the defective block 523. Such is the case here, and consequently, block 522 is enabled and not remapped to a spare block. As used herein with respect to FIGS. 21-26, an "active" word line is one that corresponds to an address presented to the device, and would be "selected" if the block is enabled, but which word line may be mapped to a spare block. It should also be clear that in certain embodiments (e.g., certain 2-layer implementations), there are two active word lines, a respective one in each of two memory blocks.

Figure 22:
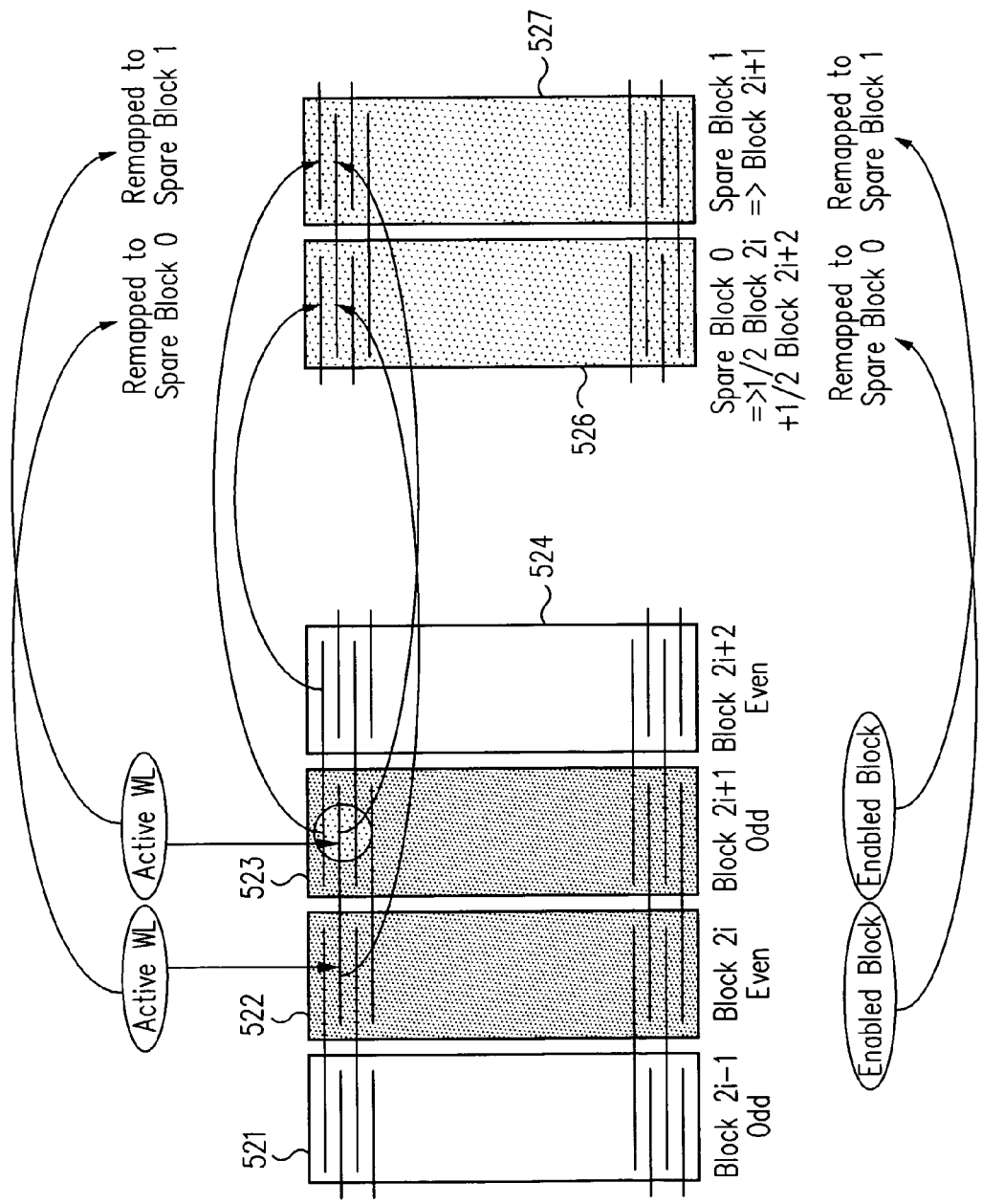
FIG. 22 is a block diagram of a partial-layer memory array showing an exemplary mapping and enabling of memory blocks when a particular memory block is defective.

Referring now to FIG. 22, the same situation is depicted but with different active word lines. The mapping is the same as above, but in this situation, since the active word line in block 522 is shared with the defective block 523, block 522 is also disabled and mapped instead to spare even block 526. In other words, both spare blocks are enabled.

Figure 23:
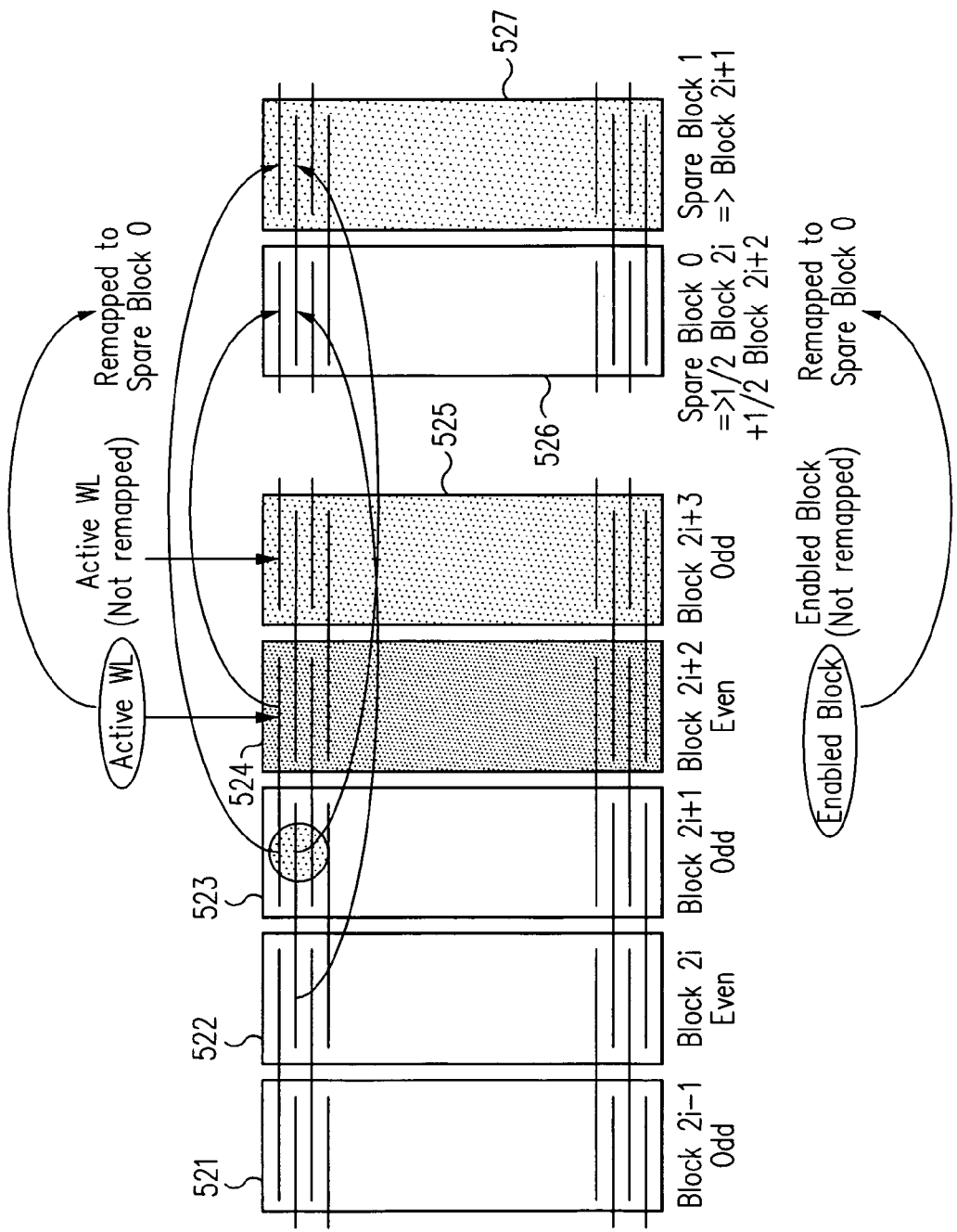
FIG. 23 is a block diagram of a partial-layer memory array showing an exemplary mapping and enabling of memory blocks when a particular memory block is defective.

Referring now to FIG. 23, yet another situation is depicted. Here, the active word lines fall within blocks 524 and 525. The defective block remains as block 523, so the mapping remains as above. However, in this case, even block 524 is disabled and remapped to spare even block 526 if the active word line in block 524 is shared with the defective block 523, as is the case here. In block 525, the active word line is not shared with the defective block 523, and so block 525 is enabled and not remapped to a spare block.

Figure 24:
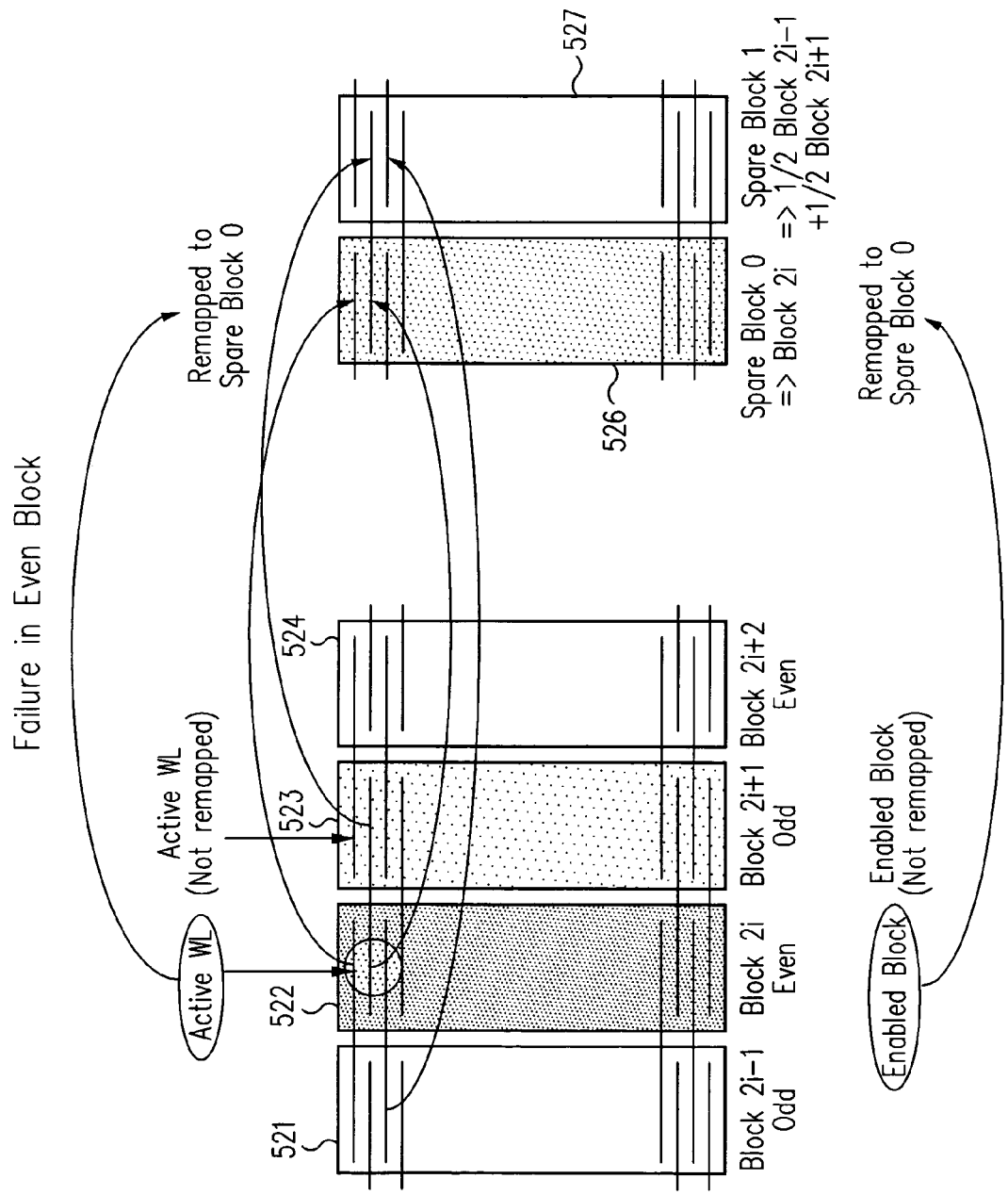
FIG. 24 is a block diagram of a partial-layer memory array showing an exemplary mapping and enabling of memory blocks when a particular memory block is defective.

Referring now to FIG. 24, the same array is represented having odd blocks 521 and 523 and even blocks 522 and 524, and further having even spare block 526 and odd spare block 527. Again assume even blocks are TYPE A blocks and odd blocks are TYPE B blocks. A short is depicted in even block 522 which renders this block defective. In this case the defective even block 522 is mapped to even spare block 526, while word lines in the adjacent odd block 521 which are shared with the defective block, and word lines within the adjacent odd block 523 which are shared with the defective block, are both mapped to odd spare block 527, as depicted in the figure.

The active word lines again fall within block 522 and 523, as shown, and blocks 522 and 523 would otherwise be enabled in the main array but for the block replacement. The defective block 522 is always disabled and remapped to the spare block 526, but the block 523 is still enabled if the active word line is not shared with the defective block 522. Such is the case here, and consequently, block 523 is enabled and not remapped to a spare block.

Figure 25:
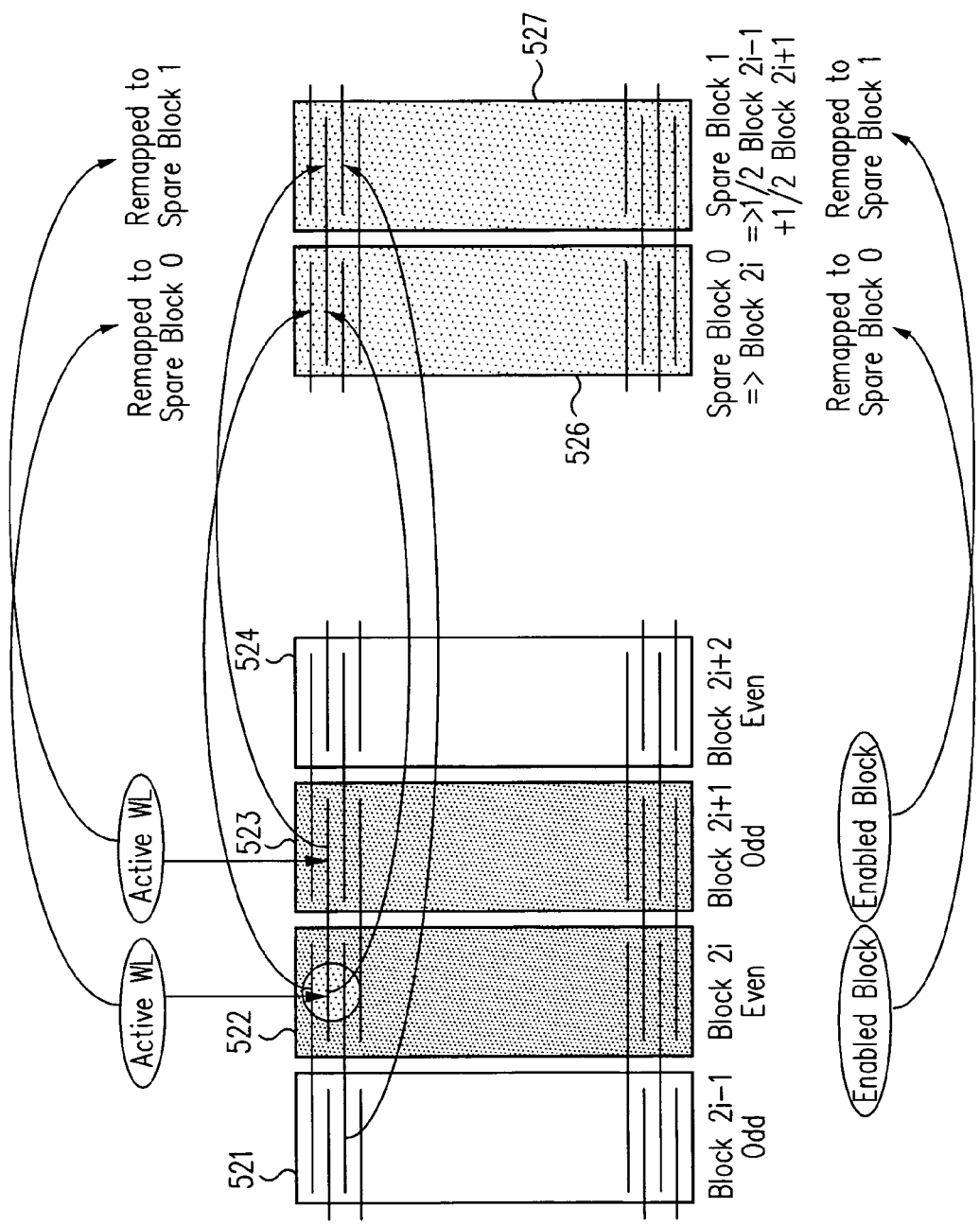
FIG. 25 is a block diagram of a partial-layer memory array showing an exemplary mapping and enabling of memory blocks when a particular memory block is defective.

Referring now to FIG. 25, the same situation is depicted but with different active word lines. The mapping is the same as above, but in this situation, since the active word line in block 523 is shared with the defective block 522, block 523 is also disabled and mapped instead to spare odd block 527.

Figure 26:
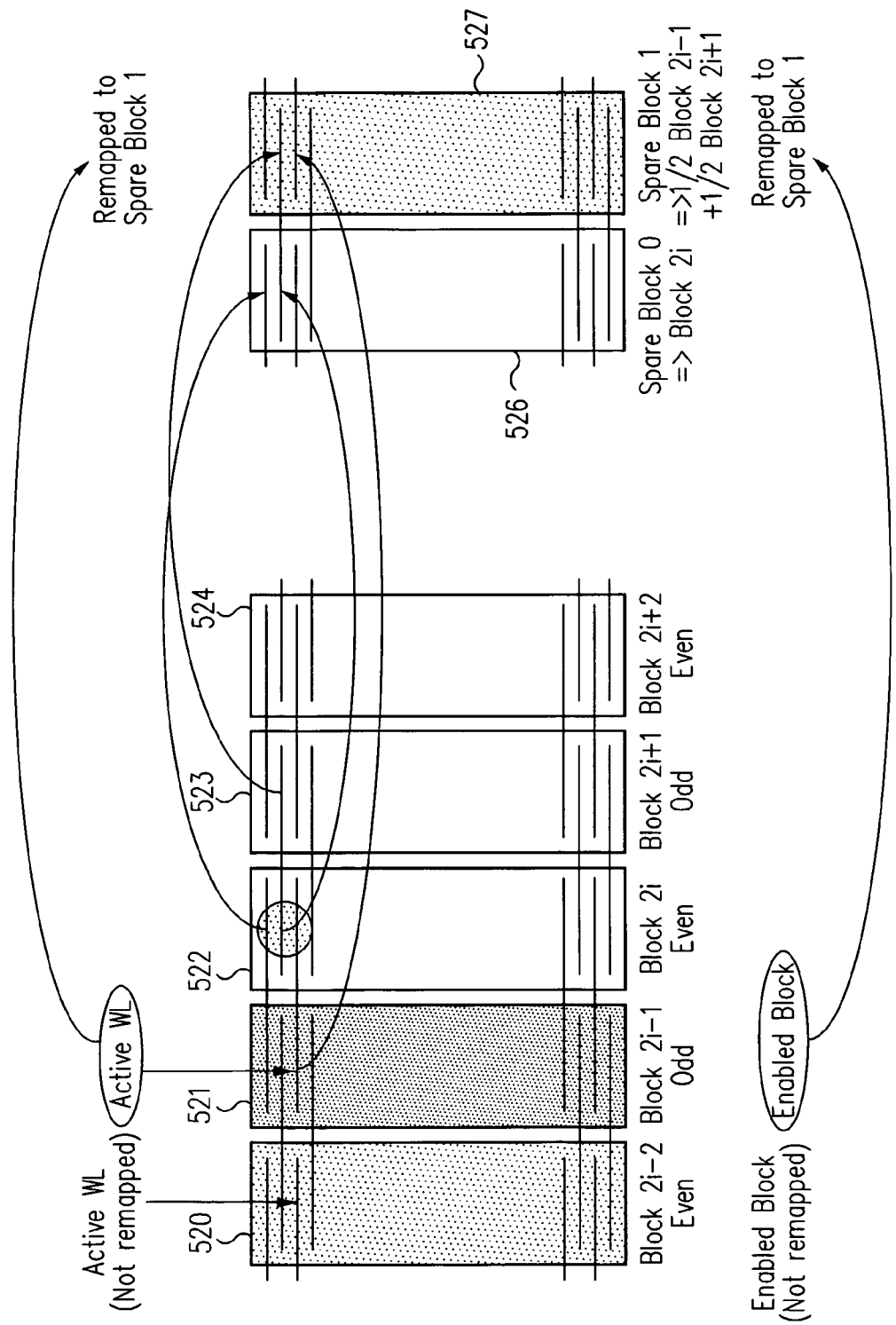
FIG. 26 is a block diagram of a partial-layer memory array showing an exemplary mapping and enabling of memory blocks when a particular memory block is defective.

Referring now to FIG. 26, yet another situation is depicted. Here, the active word lines fall within blocks 520 and 521. The defective block remains as block 522, so the mapping remains as above. However, in this case, odd block 521 is disabled and remapped to spare odd block 527 if the active word line in block 521 is shared with the defective block 522, as is the case here. In block 520, the active word line is not shared with the defective block 520, and so block 520 is enabled and not remapped to a spare block.

Figure 27A:
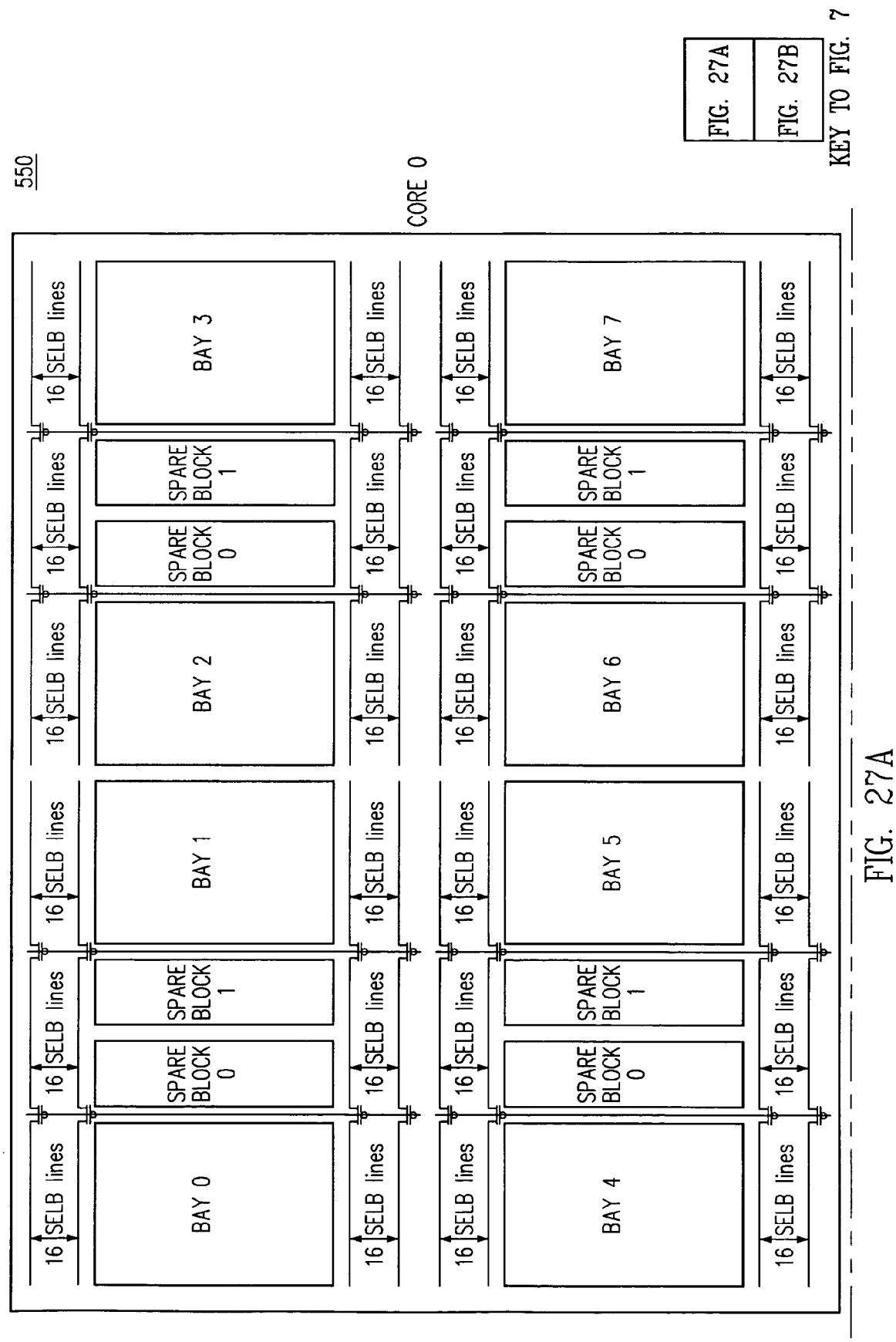
FIG. 27A and FIG. 27B, is a block diagram of a memory array having eight pairs of spare memory blocks, each shared by and disposed between a respective pair of memory bays.
Figure 27B:
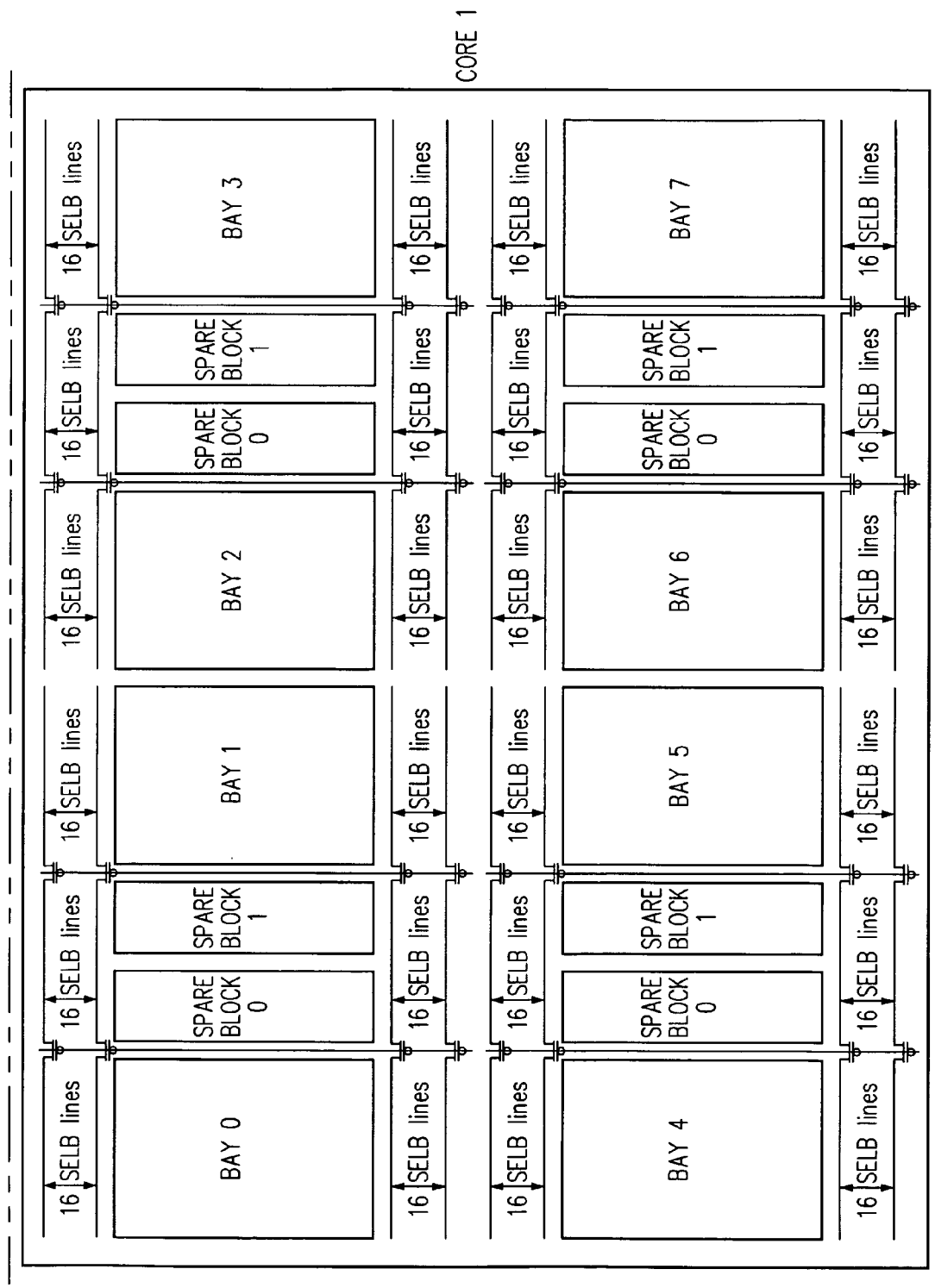

For some embodiments, the decision as to whether to enable a block in a 2-layer device may be summarized as follows:

1. If a selected (i.e., active) word line falls within a defective block, disable the defective block and instead remap to the appropriate spare block (i.e., enable the appropriate spare block);
2. If a selected word line falls within a block adjacent to a defective block, but is shared with the defective block, then disable the adjacent block and instead remap to the appropriate spare block (i.e., enable the appropriate spare block);
3. If a selected word line falls within a block adjacent to a defective block, but is not shared with the defective block, then enable the adjacent block and do not remap to a spare block;
4. If a selected word line falls within any other block, then enable the block;

Referring now to FIG. 27, a memory array 550 is shown in which 16 different memory bays are implemented, each including 16 memory blocks. Two different 64 MByte cores are shown, CORE 0 and CORE 1, each enabled by a COREE[i] signal. Each core includes respective Bays 0 through 7 and four pairs of spare blocks, each pair placed between and configured to replace a single block in one of a respective pair of bays. A total of 256 (i.e., 16×16) logically addressable memory blocks are shown, as well as 16 spare memory blocks, for a total of 272 physical memory blocks. Up to 8 blocks may be replaced in this array, although no more than one block for every pair of bays (i.e., if the failures are relatively evenly distributed in the bays).

Figure 28:
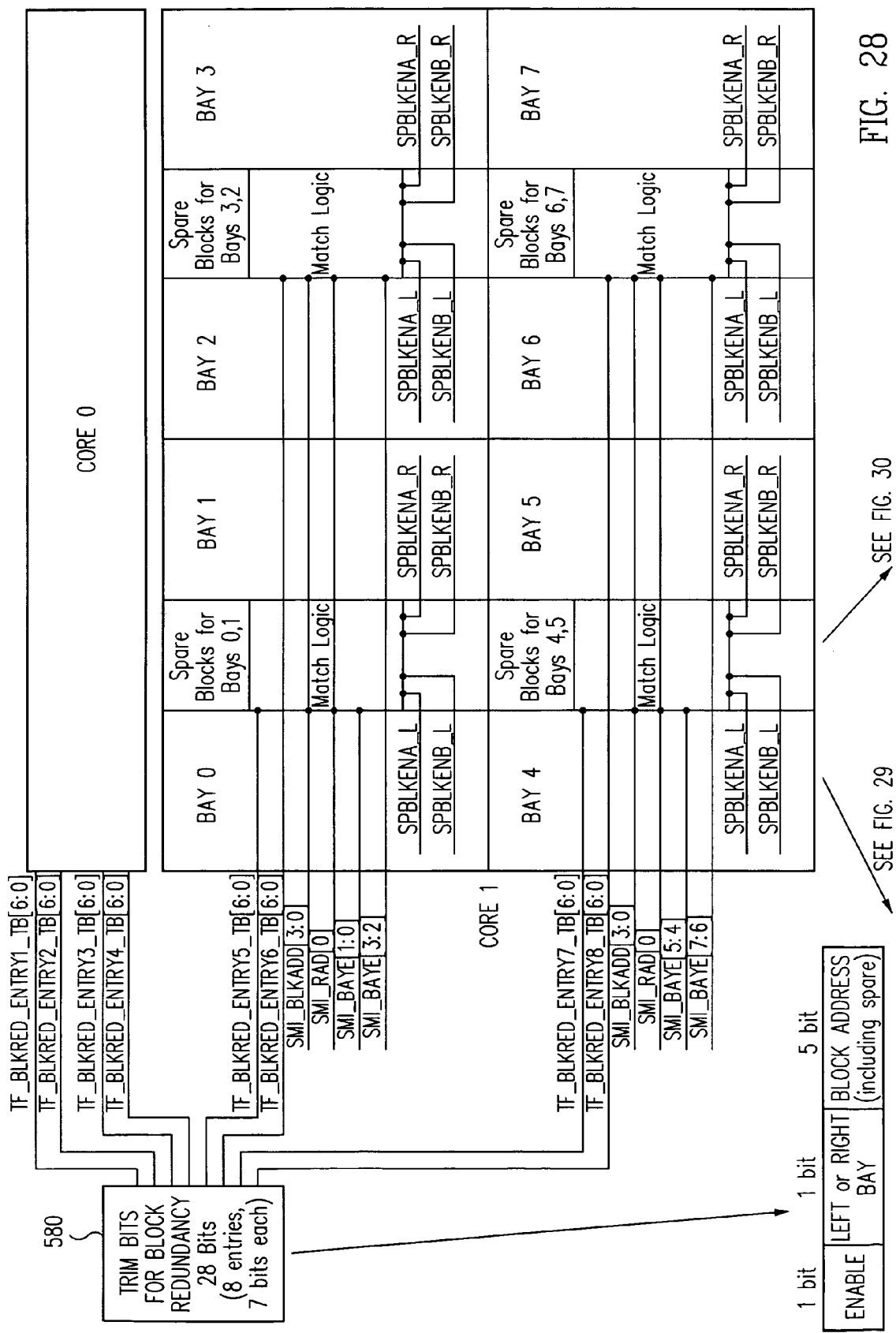
FIG. 28 is a block diagram of exemplary control circuitry for implementing block redundancy, overlaid on a memory array block diagram.

An exemplary arrangement of block replacement logic is next described in the context of this memory array 550, which accomplishes 2-layer compatibility for an otherwise 4-layer device. Referring now to FIG. 28, a block diagram of such an exemplary arrangement is shown. Compared to the arrangement shown in FIGS. 10-12, provision is now made to enable two blocks in a 2-layer device. Since one enabled block may be in the main array and one enabled block may be in the spare block area, two different spare enable signals are provided, one for even blocks (SPBLKENA) and one for odd blocks (SPBLKENB). For example, if SPBLKENA is activated but SPBLKENB is not, the even main array block is disabled (since the even spare block is enabled), but the odd block in the main array is not disabled.

A TRIM BITS block 580 is provided, much as before, to include the addresses of the failing blocks. Since there are 8 possible replacements, there are 8 entries of 7 bits each. Table 1 above describes the purposes of each bit in the entry. Each bad block is indicated the same way irrespective of whether the device is implemented as a 4-layer device or a 2-layer device.

The MATCH LOGIC is similar to that described before, although there are now 8 instances of such logic, one for each pair of spare blocks, and each now generates 4 output signals: 2 which are driven to the memory blocks within the bay to the left of the spare blocks, and 2 which are driven to the memory blocks within the bay to the right of the spare blocks. The match logic is preferably located beneath the spare blocks themselves (e.g., in the area that would otherwise be used to implement a sense amplifier), so that it would be easy to remove the block redundancy if not needed in other designs. The various interface signals received by the match logic is summarized in FIG. 31.

The 4 spare block enable output signals (SPBLKENA_L, SPBLKENB_L, SPBLKENA_R, SPBLKENB_R) indicate in which of the 2 bays (left or right) we need to replace the normal blocks with one or both spare blocks. The SPBLKENA_L/R signals go to the even blocks, while the SPBLKENB_L/R signals go to odd blocks. If all four SPBLKEN signals are zero, no replacement is needed in either of the two bays. As before, the least significant row address bit RAD[0] signal is used to be able to activate the correct SPBLKENA/B_L/R signal when replacing half blocks adjacent to the defective block (i.e., the block affected by the short).

Indicating with ENABLE, RXL_BAY and FAIL_BLKADD[7:0] the seven trim bits of one entry, the logic to generate SPBLKENA/B_L/R can be described as:

```
REPLA=0
REPLB=0
FBP1=FAIL_BLKADD[4:0]+1
FBM1=FAIL_BLKADD[4:0]-1
If SMI_TWOLAYER=0 then
    If FAIL_BLKADD=BLKADD then
        If FAIL_BLKADD[0]=0 then REPLA=1
        If FAIL_BLKADD[0]=1 then REPLB=1
    End if
    If FBP1=BLKAD and RAD[0]=not(FAIL_BLKADD[0]) then
        If not(FAIL_BLKADD[0])=0 then REPLA=1
        If not(FAIL_BLKADD[0])=1 then REPLB=1
    End if
    If FBM1=BLKADD and RAD[0]=FAIL_BLKADD[0] then
        If not(FAIL_BLKADD[0])=0 then REPLA=1
        If not(FAIL_BLKADD[0])=1 then REPLB=1
    End if
End if
If SMI_TWOLAYER=1 then
    If FAIL_BLKADD[4:1]=BLKADD[3:1] then
        If FAIL_BLKADD[0]=0 then REPLA=1
        If FAIL_BLKADD[0]=1 then REPLB=1
    End if
    If FBP1[4:1]=BLKADD[3:1] and
    RAD[0]=not(FAIL_BLKADD[0]) then
        If not(FAIL_BLKADD[0])=0 then REPLA=1
        If not(FAIL_BLKADD[0])=1 then REPLB=1
    End if
    If FBM1[4:1]=BLKADD[3:1] and
    RAD[0]=FAIL_BLKADD[0] then
        If not(FAIL_BLKADD[0])=0 then REPLA=1
        If not(FAIL_BLKADD[0])=1 then REPLB=1
    End if
End if
SPBLKENA_L=ENABLE and not(RXL_BAY) and REPLA
SPBLKENA_R=ENABLE and RXL_BAY and REPLA
SPBLKENB_L=ENABLE and not(RXL_BAY) and REPLB
SPBLKENB_R=ENABLE and RXL_BAY and REPLB
```

In the main array, the SPENBLKA_L/R signal, when high, should disable all the even blocks in the (left or right) bay. The SPENBLKB_L/R signal, when high, should disable all the odd blocks in the (left or right) bay. This logic may be implemented in the row predecoder logic within every block. An exemplary configuration is shown in FIG. 29.

FIG. 30 depicts an exemplary spare block control logic for this configuration. It is adapted to receive the four spare block enable signals rather than just two such signals (as shown in FIG. 12).

In some embodiments, a useful test mode may be implemented to activate both spare blocks in all 8 spare block groups without disabling the main array blocks. The mode is activated when SMI_ALLSPBLKON_TMCR=1 and can be used alone or in conjunction with a main array multiple block selection mode to speed-up tests (e.g., stress tests) by applying the same operation in parallel on all spare blocks.

To enable the block redundancy in any of the above configurations, the trim bits are programmed with the address of the failing block. The match logic circuitry and spare and main array block control circuitry will take care of automatically remapping the failing block and the two halves of the neighboring blocks, and enabling either one block (4-layer implementation) or two blocks (2-layer implementation), with the exception of the case in which the failing block is at the boundary of 2 bays without spare blocks in between (i.e. bay 1/block 15, bay 2/block 0, bay 5/block 15 or bay 6/block 0). In this case, both resources of the stripe may be used to repair the block, as described above, and consequently the block redundancy will be able to replace only a single bad block within a stripe.

Referring now to FIG. 32, the depicted table summarizes the appropriate trim bit settings and the resultant remappings for various failing block locations. This table is appropriate for a 4-layer implementation and a 2-layer implementation.

Figures 33, 34:
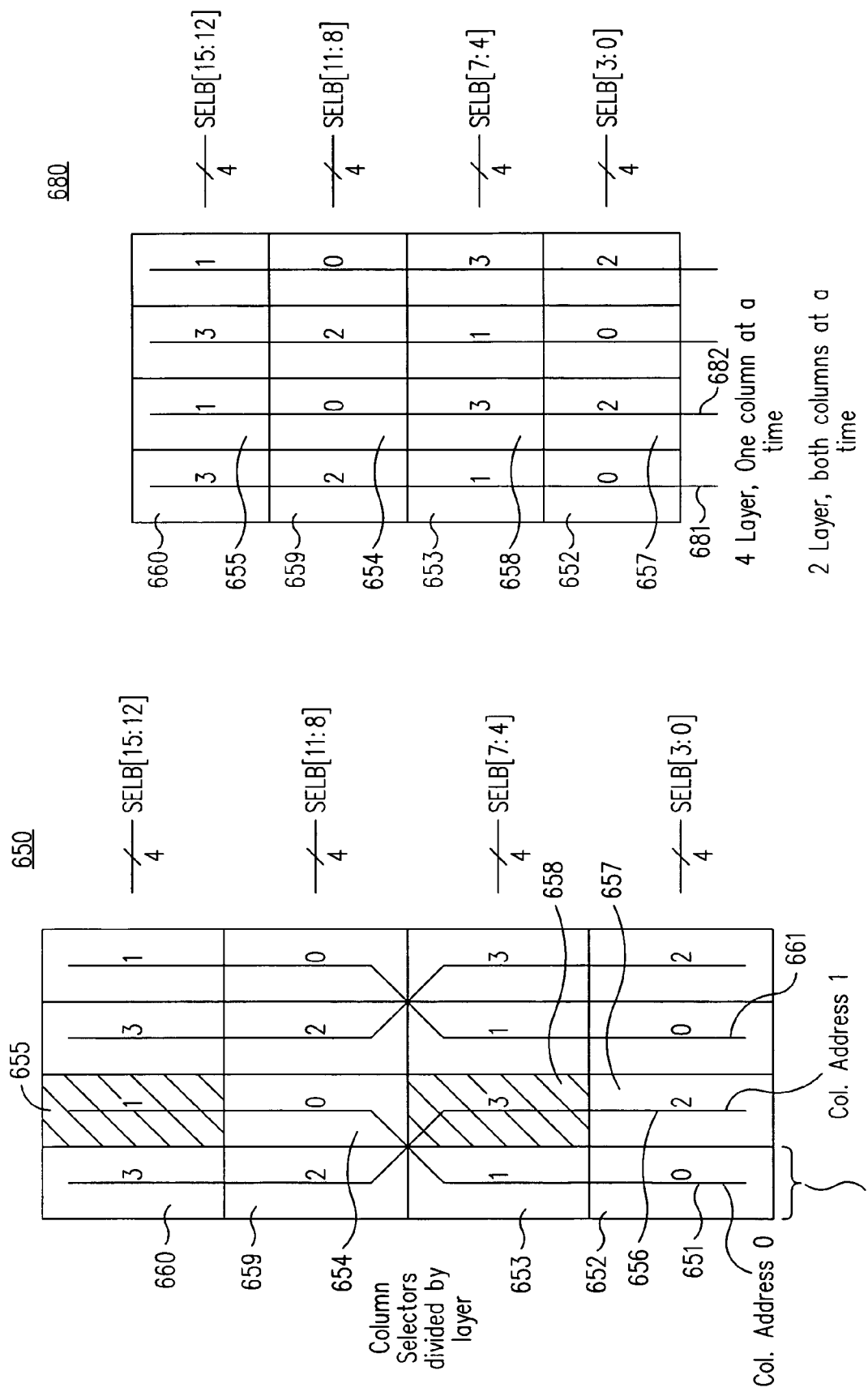
FIG. 33 is a layer selection block diagram useful for implementing partial-layer compatibility.
FIG. 34 is a layer selection block diagram useful for implementing partial-layer compatibility.

Another technique for accomplishing 2-layer compatibility in an otherwise 4-layer device makes use of interchanging adjacent column decoder outputs for half of the layer selector circuits. Referring now to FIG. 33, a group of layer selector circuits is shown, with four such layer selector circuits connected to each column decoder output. For example, column decoder output 651 is coupled to layer selector 652 (which couples bit lines BL[3:0] from Layer 0 to SELB[3:0] lines), coupled to layer selector 653 (which couples bit lines BL[3:0] from Layer 1 to SELB[7:4] lines), coupled to layer selector 654 (which couples bit lines BL[7:4] from Layer 0 to SELB[11:8] lines), and coupled to layer selector 655 (which couples bit lines BL[7:4] from Layer 1 to SELB[15:12] lines). The column decoder output 656 is coupled to layer selector 657 (which couples bit lines BL[7:4] from Layer 2 to SELB[3:0] lines), coupled to layer selector 658 (which couples bit lines BL[7:4] from Layer 3 to SELB[7:4] lines), coupled to layer selector 659 (which couples bit lines BL[3:0] from Layer 2 to SELB[11:8] lines), and coupled to layer selector 660 (which couples bit lines BL[3:0] from Layer 3 to SELB[15:12] lines).

In a 4-layer implementation, all column decoders are enabled, and one column decoder output is selected at a single time. In a 2-layer implementation, half of the column decoders are disabled, and one of the remaining half is selected at a single time. For example, in a 2-layer implementation, column decoder output 651 couples the first eight bit lines on both layer 0 and layer 1 (exiting to this side of the block) to a corresponding SELB line. Column decoder output 656 is disabled, as layer 2 and layer 3 are not even implemented. The next column address would select column decoder 661, which couples the next eight bit lines on both layer 0 and layer 1 (of those exiting the block in this direction) to a corresponding SELB line. In this configuration, each memory block is essentially a mixed A/B block, and both spare blocks likewise would be the same mixed A/B configuration, although if word lines are shared as depicted in FIG. 1, then such memory blocks would still be odd or even. Moreover, in this configuration, only one block is enabled, even for a 2-layer device, and the match logic and spare block control logic may be implemented as described in relation to FIGS. 10-12.

Referring now to FIG. 34, another technique for accomplishing 2-layer compatibility in an otherwise 4-layer device makes use of a different variation of a mixed A/B block. Here, the same group of layer selector circuits is shown, with four such layer selector circuits connected to each column decoder output, but without a cross-over. For example, column decoder output 681 is coupled to layer selector 652 (which couples bit lines BL[3:0] from Layer 0 to SELB[3:0] lines), coupled to layer selector 653 (which couples bit lines BL[3:0] from Layer 1 to SELB[7:4] lines), coupled to layer selector 659 (which couples bit lines BL[3:0] from Layer 2 to SELB[11:8] lines), and coupled to layer selector 660 (which couples bit lines BL[3:0] from Layer 3 to SELB[15:12] lines). The column decoder output 682 is coupled to layer selector 657 (which couples bit lines BL[7:4] from Layer 2 to SELB[3:0] lines), coupled to layer selector 658 (which couples bit lines BL[7:4] from Layer 3 to SELB[7:4] lines), coupled to layer selector 654 (which couples bit lines BL[7:4] from Layer 0 to SELB[1:8] lines), and coupled to layer selector 655 (which couples bit lines BL[7:4] from Layer 1 to SELB[15:12] lines).

In a 4-layer implementation, all column decoders are enabled, and one column decoder output is selected at a single time. In a 2-layer implementation, however, all the column decoders are still enabled, but now two column decoders are selected at a single time. For example, column decoder output 681 and 682 would be selected at the same time to couple the first eight bit lines (of those exiting the block to the top or bottom, if interleaved bit lines) on both layer 0 and layer 1 (i.e., a total of sixteen bit lines) to a corresponding SELB line. In this configuration, each memory block is essentially a mixed A/B block, and both spare blocks likewise would be the same mixed A/B configuration, although if word lines are shared as depicted in FIG. 1, then such memory blocks would still be odd or even. Moreover, in this configuration, only one block is enabled, even for a 2-layer device, and the match logic and spare block control logic may be implemented as described in relation to FIGS. 10-12. Moreover, since only one block is enabled for either a 2-layer or 4-layer implementation, the impedances driving various nodes in the array, such as those driving the selected word line, will be similar in either version. Simultaneously selecting two adjacent column decoders may be accomplished by disabling a low order column address within the blocks.

Figure 35:
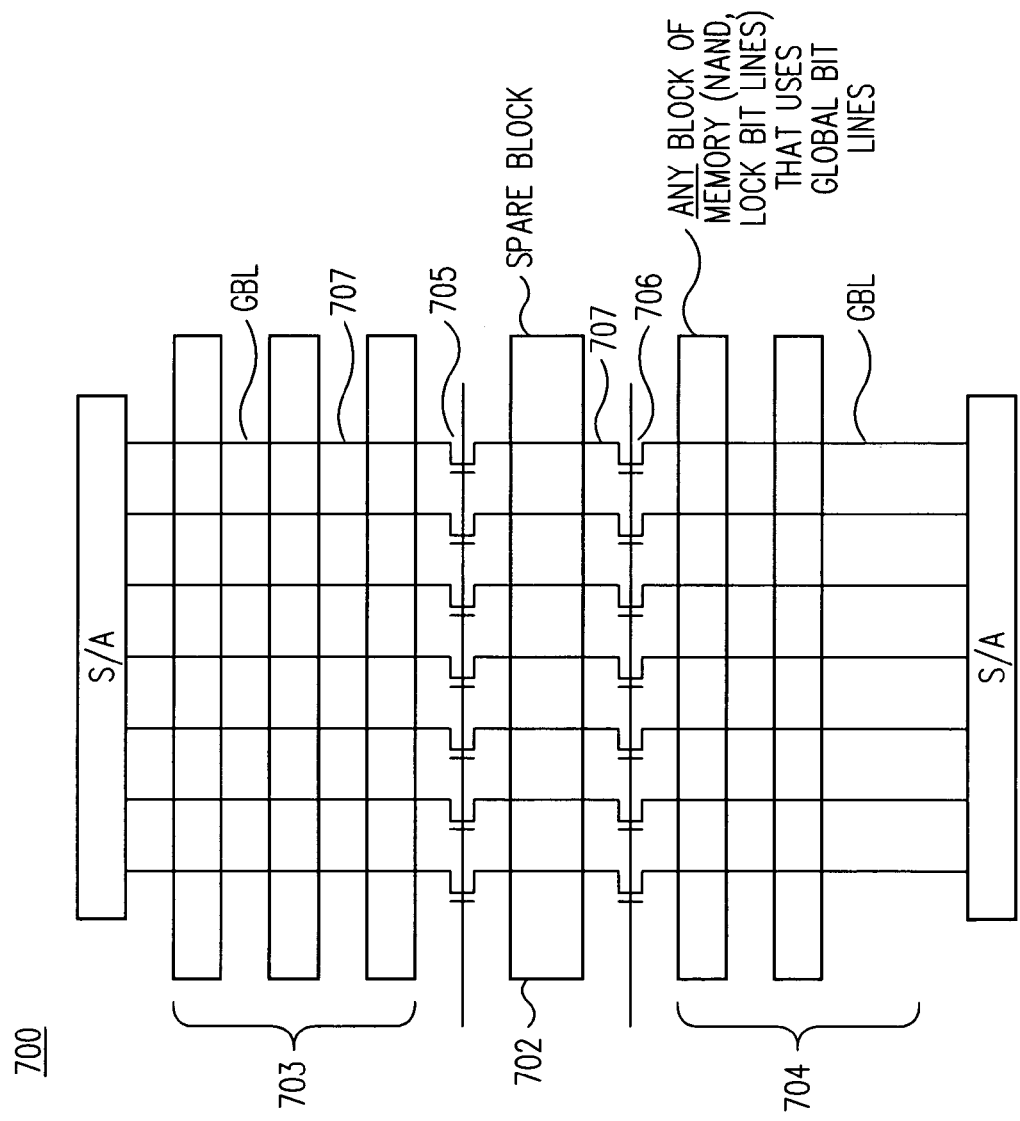
FIG. 35 is a block diagram of an exemplary embodiment of shared spare memory blocks.

The concept of sharing one or more spare blocks between a pair of adjacent memory bays need not be limited to the embodiments described above. Referring now to FIG. 35, a memory array 700 incorporating hierarchical bit lines is depicted. A spare block area 702 includes one or more spare blocks, which may be shared by a first group of main array blocks 703 above the spare block area 702 and by a second group of main array blocks 704 below the spare block area 702. A spare block within the spare block area 702 is coupled to one of the two main array block areas by a group of switches 705, 706 which couple the global bit lines (e.g., GBL 707) in the spare block area 702 to the global bit lines (e.g., GBL 706) in one of the main array block areas. Any memory structure and architecture that uses global bit lines may be implemented using spare blocks in accordance with aspects of the invention described herein. This includes, for example, certain NAND memory structures, including those described in "NAND Memory Array Incorporating Capacitance Boosting of Channel Regions in Unselected Memory Cells and Method for Operation of Same" by En-Hsing Chen, et al., U.S. Patent Application Publication No. US 2004/0145024, which application is hereby incorporated by reference in its entirety. Other memory structures which use local and global bit lines are also contemplated for use with spare block redundancy.

As the above example suggests, but to clearly make the point, the aspect of the block redundancy techniques described herein in which one or more spare blocks are shared between a pair of main array blocks does not necessarily require odd/even structure of the memory blocks. Such sharing can advantageously be employed even if all main array memory blocks are identical, and in such a case, a single spare memory block may be utilized.

In some embodiments, more than one set of spare blocks may be provided within each spare block area. For example, two pairs of spare blocks may be included between pairs of bays, even though only a single pair of spare blocks is needed to replace a bad block. This would allow two defective blocks in the same bay to be replaced, or would allow a single defective block to be replaced in both the bay to the left, and the bay to the right, so long as the defective block addresses are different (since the SELB lines in the spare block area are shared).

While the embodiments described above, in which a pair of spare blocks is shared by (and disposed between) two adjacent bays, are particularly efficient regarding the routing of the SELB lines and other control lines, it is also contemplated to share a group of spare blocks with more than two bays.

The techniques described herein to achieve 2-layer compatibility for a design nominally intended as 4-layer implementation need not be restricted to such numbers of memory layers or planes. For example, an 8-layer design may be 4-layer compatible using the same or similar techniques taught here. Likewise, a 2-layer memory device may be implemented with only one memory layer. Moreover, such techniques may also be extended to even achieve 2-layer compatibility in such an 8-layer design, or 1-layer or 2-layer compatibility in a 4-layer design. In addition, while such 2-layer compatibility in a 4-layer design implies a three-dimensional memory array, the block redundancy techniques described herein may equally well be employed in a memory array having just a single memory plane (i.e., a 2-D memory array).

The inventive aspects disclosed herein may be used alone or in combination. For example, the various block redundancy techniques, the partial-layer compatibility techniques, and others, may be used alone or in combination together or with other techniques.

In the embodiments described, layer selector circuits is formed for all potential memory layers. Each layer selector circuit is responsive to an associated enable signal for coupling respective array lines on an associated memory layer to respective ones of an associated group of I/O bus lines. When a partial number of layers is implemented, some of the layer selector circuits are not connected to an implemented memory layer array line (e.g., a bit line), but the device can be fabricated without changes to any of the other masks in the semiconductor processing sequence. Nonetheless, a respective array line on an implemented memory layer is coupled to each respective I/O bus line irrespective of whether the second memory layer is implemented. This results from the physical arrangement of the layer selector circuits, and the configurability of the device to control the layer selector circuits in accordance with the actual number of implemented memory layers. Such configuration may be, for some embodiments, by way of programming a configuration memory, as described above. For some embodiments, such configuration may be accomplished by the presence or absence of a feature on a layer associated with one or more of the optional memory layers.

In some embodiments, the memory array includes word lines and a word line decoder having a configuration that is independent of whether the optional one or more memory layers are implemented. For example, embodiments having word lines which each include a word line segment on each of a plurality of word line layers (each word line layer associated with one or two bit line layers) may be implemented with such a word line decoder configuration.

Most memory arrays are designed having a relatively high degree of uniformity. For example, usually every bit line includes the same number of memory cells. As another example, the number of bit lines, word lines, array blocks, and even memory planes is frequently an integral power of two in number (i.e., $2^N$), for ease and efficiency of decode circuitry. But such regularity or consistency is certainly not required for any of the embodiments of the present invention. For example, word line segments on different layers may include different numbers of memory cells, the memory array may include three memory planes, word line segments within the first and last array block may be different in number of memory cells or bit line configuration, and any of many other irregular variations to the usual consistency of memory array design. Unless otherwise explicitly recited in the claims, such usual regularity, even as shown in the embodiments described herein, should not be imported into the meaning of any claim.

It should be appreciated that the designations top, left, bottom, and right are merely convenient descriptive terms for the four sides of a memory array. The word line segments for a block may be implemented as two inter-digitated groups of word line segments oriented horizontally, and the bit lines for a block may be implemented as two inter-digitated groups of bit lines oriented vertically. Each respective group of word lines or bit lines may be served by a respective decoder/driver circuit and a respective sense circuit on one of the four sides of the array. Useful column circuits are set forth in "Tree Decoder Structure Particularly Well Suited to Interfacing Array Lines Having Extremely Small Layout Pitch," U.S. Pat. No. 6,859,410, the disclosure of which is hereby incorporated by reference in its entirety, and further in "Apparatus and Method for Hierarchical Decoding of Dense Memory Arrays Using Multiple Levels of Multiple-Headed Decoders" by Luca G. Fasoli, et al., U.S. application Ser. No. 11/026,470, filed Dec. 30, 2004, the disclosure of which is hereby incorporated by reference.

Word lines may also be referred to as row lines or X-lines, and bit lines may also be referred to as column lines or Y-lines. Both word lines and bit line may be referred to as array lines. If word lines are referred to as array lines of a first type, then bit lines may be referred to as array lines of a second type (or vice versa). Global array lines, such as global bit lines, may also be referred to as array lines of a first type. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are usually contemplated as being connected to the gate terminal of memory cell transistors, or the switch terminal of the memory cell switch device, if present. The Y-lines (or bit lines) are usually contemplated as being connected to a switched terminal of the memory cell (e.g., source/drain terminal). Secondly, the memory organization (e.g., data bus width, number of bits simultaneously read during an operation, etc.) may have some association with viewing one set of the two array lines more aligned with data "bits" rather than data "words." Consequently, the designations herein of X-lines, word lines, and row lines, and of Y-lines, bit lines, and column lines are illustrative of the various embodiments but should not be viewed in a restrictive sense, but rather a more general sense.

As used herein, word lines (e.g., including word line segments) and bit lines usually represent orthogonal array lines, and generally follow a common assumption in the art that word lines are driven and bit lines are sensed, at least during a read operation. Thus, the bit lines of an array may also be referred to as sense lines of the array. No particular implication should be drawn as to word organization by use of such terms. Moreover, as used herein, a "global array line" (e.g., a global word line, a global bit line) is an array line that connects to array line segments in more than one memory block, but no particular inference should be drawn suggesting such a global array line must traverse across an entire memory array or substantially across an entire integrated circuit.

As used herein, "memory blocks of a first type" does not necessarily imply any particular layer selection configuration is common for all such memory blocks of the first type, although such may also be true. Similarly, "memory blocks of a second type" does not necessarily imply any particular layer selection configuration is common for all such memory blocks of the second type, nor that any layer configuration in a block of the second type is necessarily different than a layer configuration for a block of the first type, although such may be true. Memory blocks of the first and second type may refer to whether the first array line at the top (or bottom) of the block is shared with an adjacent block to the left or to the right of the block.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an anti-fuse technology. A passive element memory array is not necessarily a one-time programmable (i.e., write once) memory array.

Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

In various embodiments of the invention described herein, many different memory cell technologies are contemplated for use. Suitable three-dimensional anti-fuse memory cell structures, configurations, and processes include, without limitation, those described in: U.S. Pat. No. 6,034,882 to Johnson, et al, entitled "Vertically Stacked Field Programmable Nonvolatile Memory and Method of Fabrication"; U.S. Pat. No. 6,420,215 to Knall, et al, entitled "Three-Dimensional Memory Array and Method of Fabrication"; U.S. Pat. No. 6,525,953 to Johnson, entitled "Vertically-Stacked, Field Programmable Nonvolatile Memory and Method of Fabrication"; U.S. Patent Application Publication No. 2004-0002184 A1, by Cleeves, entitled "Three Dimensional Memory"; and U.S. patent application Ser. No. 10/326,470 by Hemer, et al, filed Dec. 19, 2002, entitled "An Improved Method for Making a High Density Nonvolatile Memory". Each of these enumerated disclosures is incorporated herein by reference in its entirety.

The present invention is contemplated for advantageous use with any of a wide variety of memory cell technologies and memory array configurations, including both traditional single-level memory arrays and multi-level (i.e., three-dimensional) memory arrays, and particularly those having extremely dense X-line or Y-line pitch requirements. In certain embodiments, the memory cells may be comprised of semiconductor materials, as described in U.S. Pat. No. 6,034,882 to Johnson et al., and in U.S. Pat. No. 5,835,396 to Zhang. In certain embodiments, an antifuse memory cell is contemplated. Other types of memory arrays, such as MRAM and organic passive element arrays, can also be used. MRAM (magnetoresistive random access memory) is based on magnetic memory elements, such as a magnetic tunnel junction (MTJ). MRAM technology is described in "A 256kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement. Certain passive element memory cells may be used which incorporate layers of organic materials including at least one layer that has a diode-like characteristic conduction and at least one organic material that changes conductivity with the application of an electric field. U.S. Pat. 6,055,180 to Gudensen et al. describes such organic passive element arrays. Memory cells comprising materials such as phase-change materials and amorphous solids can also be used. See U.S. Pat. 5,751,012 to Wolstenholme et al., and U.S. Pat. 4,646,266 to Ovshinsky et al., both of which are hereby incorporated by reference. In other embodiments, three-terminal memory cells may also be employed, rather than two-terminal passive element memory cells, and multiple X-lines (or row lines) selected to sum currents from more than one memory cell on a selected Y-line (or bit line). Such memory cells include flash EPROM and EEPROM cells, which are well known in the art. Moreover, other memory array configurations having extremely dense X-line and/or Y-line pitch requirements are also contemplated such as, for example, those incorporating thin-film transistor (TFT) EEPROM memory cells, as described in "Dense Arrays and Charge Storage Devices, and Methods for Making Same," by Thomas H. Lee, et al., U.S. Patent Application Publication No. US 2002-0028541 A1, and for those incorporating TFT NAND memory arrays, as described in "Programmable Memory Array Structure Incorporating Series-Connected Transistor Strings and Methods for Fabrication and Operation of Same" by Scheuerlein, et al., U.S. Patent Application Publication No. US 2004-0125629 A1, which applications are hereby incorporated by reference.

The directionality of various array lines in the various figures is merely convenient for ease of description of the two groups of crossing lines in the array. While word lines are usually orthogonal to bit lines, such is not necessarily required. As used herein, an integrated circuit memory array is a monolithic integrated circuit structure, rather than more than one integrated circuit device packaged together or in close proximity.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. As is well known in the art, various row and column decoder circuits are implemented for selecting a memory block, and a word line and bit line within the selected block, based upon address signals and possibly other control signals. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. An integrated circuit comprising:
    a memory array having a respective plurality of array lines of a first type for each of at least one memory layer;
    a plurality of I/O bus lines;
    a plurality of layer selector circuits, each responsive to an associated enable signal, for coupling respective array lines on an associated memory layer to respective ones of an associated group of said I/O bus lines, said plurality of layer selector circuits comprising:
        layer selector circuits of a first type for coupling array lines on a first memory layer to a first group of said I/O bus lines;
        layer selector circuits of a second type for coupling array lines on a second memory layer, if such second memory layer is present, to the first group of said I/O bus lines;
        layer selector circuits of a third type for coupling array lines on the first memory layer to a second group of said I/O bus lines; and
        layer selector circuits of a fourth type for coupling array lines on the second memory layer, if such second memory layer is present, to the second group of said I/O bus lines; and
    control circuitry for selectively enabling certain layer selector circuits, said control circuitry configured, and said layer selector circuits arranged, to simultaneously couple a respective array line to each respective I/O bus line irrespective of whether the second memory layer is present.

2. The integrated circuit as recited in claim 1 wherein:
    a given I/O bus line is coupled at times to an array line on the first memory layer, and coupled at other times to an array line on the second memory layer, if such second memory layer is implemented, or otherwise coupled at such other times to an array line on the first memory layer.

3. The integrated circuit as recited in claim 1 wherein the control circuitry is configured by programming a configuration memory.

4. The integrated circuit as recited in claim 1 wherein the control circuitry is configured by the presence or absence of a feature on a layer associated with the second memory layer.

5. The integrated circuit as recited in claim 1 wherein:
    the array lines of the first type comprise bit lines;
    the memory array further comprises a plurality of word lines, each word line comprising a word line segment on each of one or more word line layers.

6. The integrated circuit as recited in claim 5 further comprising a word line decoder having a configuration that is independent of whether the second memory layer is implemented.

7. The integrated circuit as recited in claim 5 wherein the memory array comprises passive element memory cells.

8. The integrated circuit as recited in claim 7 comprising antifuse memory cells.

9. The integrated circuit as recited in claim 1 wherein:
the memory array is arranged in memory blocks; and
each memory block includes layer selector circuits of the first type and third type responsive to a single column select signal, and further includes layer selector circuits of the second type and fourth type responsive to a single column select signal.

10. The integrated circuit as recited in claim 1 wherein:
each respective layer selector circuit of the first type and each respective layer selector circuit of the third type share a respective one of a first group of enable signals;
each respective layer selector circuit of the second type and each respective layer selector circuit of the fourth type share a respective one of a second group of enable signals that are disabled if the second memory layer is not implemented.

11. The integrated circuit as recited in claim 10 wherein:
if the second memory layer is implemented, the first and second group of enable signals are responsive to an associated address, thereby coupling array lines on the first layer to both the first and second groups of I/O bus lines for half of the possible addresses, and coupling array lines on the second layer to both the first and second groups of I/O bus lines for the other half of the possible addresses; and
if the second memory layer is not implemented, the second group of enable signals are disabled, and the first group of enable signals are responsive to an associated address, thereby coupling array lines on the first layer to both the first and second groups of I/O bus lines for all available remaining addresses.

12. The integrated circuit as recited in claim 1 wherein:
the memory array is arranged in memory blocks; and
each memory block includes layer selector circuits of either the first type or the second type, but not both.

13. The integrated circuit as recited in claim 1 wherein:
each respective layer selector circuit of the first type and each respective layer selector circuit of the fourth type share a respective one of a first group of enable signals;
each respective layer selector circuit of the second type and each respective layer selector circuit of the third type share a respective one of a second group of enable signals.

14. The integrated circuit as recited in claim 13 wherein:
one enable signal is selected if the second memory layer is implemented, thereby coupling array lines on the first memory layer to the first group of I/O bus lines and coupling array lines on the second memory layer to the second group of I/O bus lines; and
one enable signal from each of the first and second groups is simultaneously selected if the second memory layer is not implemented, thereby coupling array lines on the first memory layer to the first group of I/O bus lines and coupling other array lines on the first memory layer to the second group of I/O bus lines.

15. The integrated circuit as recited in claim 13 wherein:
the pair of simultaneously selected enable signals fall within a single memory block.

16. The integrated circuit as recited in claim 13 wherein:
the pair of simultaneously selected enable signals fall respectively within adjacent memory blocks.

17. The integrated circuit as recited in claim 13 wherein:
the pair of simultaneously selected enable signals fall respectively within two non-adjacent memory blocks.

18. The integrated circuit as recited in claim 1 further comprising:
a second plurality of I/O bus lines on a side of the memory array opposite the aforementioned plurality of I/O bus lines;
a second plurality of layer selector circuits for both the first and second memory layers, each for coupling respective array lines on a memory layer to respective ones of the second plurality of I/O bus lines;
a second control circuit for enabling one or more of the second plurality of layer selector circuits, said second control circuit being configurable, and said second plurality of layer selector circuits being arranged, to couple a respective array line on an implemented memory layer to each respective I/O bus line of the second plurality irrespective of whether the second memory layer is implemented.

19. The integrated circuit as recited in claim 1 wherein:
the memory array is arranged in memory blocks;
each memory block that includes a layer selector circuit of the first type also includes a corresponding layer selector circuit of the fourth type, both responsive to the same enable signal; and
each memory block which includes a layer selector circuit of the second type also includes a corresponding layer selector circuit of the third type, both responsive to the same enable signal.

20. The integrated circuit as recited in claim 19 further comprising:
column selection circuits configured, in a memory array in which both first and second memory layers are implemented, for simultaneously selecting only one enable signal associated either with the first and fourth types of layer selector circuits or with the second and third types of layer selector circuits, and configured, in a memory array in which the second memory layer is not implemented, for simultaneously selecting two enable signals, one such enable signal associated with the first and fourth types of layer selector circuits and the other such enable signal associated with the second and third types of layer selector circuits.

21. The integrated circuit as recited in claim 19 wherein:
memory blocks of a first type include layer selector circuits of the first type and the fourth type; and
memory blocks of a second type include layer selector circuits of the second type and the third type.

22. The integrated circuit as recited in claim 21 wherein memory blocks of the first type alternate with memory blocks of the second type.

23. The integrated circuit as recited in claim 1 wherein:
each array selector circuit includes four coupling circuits, each coupling circuit responsive to a single column select signal, each for coupling an array line on a single memory layer to a respective one of a group of the I/O bus lines;
the plurality of I/O lines numbers sixteen; and
the memory array comprises a third memory layer configured analogously to the first memory layer.

24. A computer readable medium encoding an integrated circuit, said integrated circuit as recited in claim 1.

25. A integrated circuit comprising:
a memory array having at least one memory layer, each memory layer including a respective plurality of array lines of a first type;
means for configuring the memory array depending upon whether a second memory layer is present; and means for coupling every respective one of a plurality of I/O bus lines for the memory array to a respective array line irrespective of whether the second memory layer is present, said means for coupling comprising:
- layer selector circuits of a first type for coupling array lines on a first memory layer to a first group of said I/O bus lines;
- layer selector circuits of a second type for coupling array lines on a second memory layer, if such second memory layer is present, to the first group of said I/O bus lines;
- layer selector circuits of a third type for coupling array lines on the first memory layer to a second group of said I/O bus lines; and
- layer selector circuits of a fourth type for coupling array lines on the second memory layer, if such second memory layer is present, to the second group of said I/O bus lines.

26. A method for use in an integrated circuit memory array having at least one memory layer, each memory layer including a respective plurality of array lines of a first type, said method comprising the steps of:
- configuring the memory array depending upon whether a second memory layer is present;
- coupling every respective one of a plurality of I/O bus lines for the memory array to a respective array line irrespective of whether the second memory layer is present;

wherein:
- when a first signal is enabled, respectively coupling array lines from the first memory layer to respective I/O bus lines of a first group, and respectively coupling array lines from a second memory layer, if implemented, to respective I/O bus lines of a second group; and
- when a second signal is enabled, respectively coupling array lines from the second memory layer, if implemented, to respective I/O bus lines of the first group, and respectively coupling array lines from the first memory layer to respective I/O bus lines of the second group.

27. The method as recited in claim 26 wherein the configuring step comprises sensing the presence or absence of a feature on a layer associated with the second memory layer.

28. The method as recited in claim 26 wherein the configuring step comprises programming a configuration memory.

29. The method as recited in claim 26 wherein:
a given I/O bus line is coupled at times to an array line on the first memory layer, and coupled at other times to an array line on the second memory layer, if such second memory layer is implemented, or otherwise coupled at such other times to an array line on the first memory layer.

30. The method as recited in claim 26 wherein:
the first signal comprises a first column select signal, and the second signal comprises a second column select signal.

31. The method as recited in claim 30 further comprising:
- individually enabling the first and second column select signals in a memory array in which both memory layers are implemented; and
- simultaneously enabling the first and second column select signals in a memory array in which only the first memory layer is implemented.

32. The method as recited in claim 31 wherein the simultaneously enabled first and second column select signals are associated with a single memory block.

33. The method as recited in claim 31 wherein the simultaneously enabled first and second column select signals are associated with adjacent memory blocks.

34. The method as recited in claim 31 wherein the simultaneously enabled first and second column select signals are associated with two non-adjacent memory blocks.

35. The method as recited in claim 26 wherein:
- when a first select signal is enabled, respectively coupling array lines from the first memory layer to respective I/O bus lines of a first group and of a second group; and
- when a second select signal is enabled, respectively coupling array lines from the second memory layer, if implemented, to respective I/O bus lines of the first group and of the second group.

* * * * *

UNITED STATES PATENT AND TRADEMARK OFFICE
CERTIFICATE OF CORRECTION

PATENT NO. : 7,359,279 B2 Page 1 of 1
APPLICATION NO. : 11/095415
DATED : April 15, 2008
INVENTOR(S) : Luca G. Fasoli and Roy E. Scheuerlein It is certified that error appears in the above-identified patent and that said Letters Patent is hereby corrected as shown below:

Col. 4, line 34, replace "aompatible" with --compatible--;
Col. 18, line 4, delete "they";
Col. 18, line 14, replace "colunm" with --column--;
Col. 18, line 28, delete "of";
Col. 32, Claim 23, line 3, replace "colunm" with --column--;
Col. 34, Claim 34, line 2, replace "colunn" with --column--.

Signed and Sealed this

Eleventh Day of November, 2008

JON W. DUDAS
*Director of the United States Patent and Trademark Office*